United States Patent
Ren et al.

(10) Patent No.: US 11,785,850 B2
(45) Date of Patent: Oct. 10, 2023

(54) ZRCOBI BASED HALF HEUSLERS WITH HIGH THERMOELECTRIC CONVERSION EFFICIENCY

(71) Applicant: University of Houston System, Houston, TX (US)

(72) Inventors: Zhifeng Ren, Pearland, TX (US); Hangtian Zhu, Houston, TX (US)

(73) Assignee: UNIVERSITY OF HOUSTON SYSTEM, Houston, TX (US)

(*) Notice: Subject to any disclaimer, the term of this patent is extended or adjusted under 35 U.S.C. 154(b) by 0 days.

(21) Appl. No.: 17/836,072

(22) Filed: Jun. 9, 2022

(65) Prior Publication Data

US 2022/0367777 A1 Nov. 17, 2022

Related U.S. Application Data

(63) Continuation of application No. 17/252,659, filed as application No. PCT/US2019/039139 on Jun. 26, 2019, now Pat. No. 11,411,154.

(60) Provisional application No. 62/690,256, filed on Jun. 26, 2018.

(51) Int. Cl.
*H10N 10/853* (2023.01)
*H10N 10/80* (2023.01)

(52) U.S. Cl.
CPC .......... *H10N 10/853* (2023.02); *H10N 10/80* (2023.02)

(58) Field of Classification Search
CPC ....... H10N 10/853; H10N 10/80; H10N 10/10
See application file for complete search history.

(56) References Cited

U.S. PATENT DOCUMENTS

| 2006/0042676 A1 | 3/2006 | Sogou et al. |
| 2008/0173543 A1 | 7/2008 | Ziani |
| 2014/0314610 A1 | 10/2014 | Gerster et al. |
| 2015/0270485 A1 | 9/2015 | Joshi et al. |

FOREIGN PATENT DOCUMENTS

JP 2015-005653 A 1/2015

OTHER PUBLICATIONS

PCT/US2019/039139 International Search Report and Written Opinion dated Sep. 17, 2019 (11 p.).
Zhu, Hangtian et al., "Discovery of ZrCoBi Based Half Heuslers with High Thermoelectric Conversion Efficiency," Nature Communications, vol. 9, Article 2497, Jun. 27, 2018 (31 p.).
Zhu, Hangtian et al., "Understanding the Asymmetrical Thermoelectric Performance for Discovering Promising Thermoelectric Materials," Science Advances, vol. 5, No. 6, Jun. 21, 2019 (9 p.).
Ponnambalam, V. et al., "Thermoelectric Properties of Half-Heusler Bismuthides ZrCo1—xNixBi (x=0.0 to 0.1)," Journal of Electronic Materials, vol. 36, No. 7, 2007, pp. 732-735 (4 p.).
Office Action dated Jan. 26, 2022, for U.S. Appl. No. 17/252,659 (17 p.).

(Continued)

*Primary Examiner* — Lindsey A Buck
(74) *Attorney, Agent, or Firm* — CONLEY ROSE, P.C.

(57) ABSTRACT

A method of thermoelectric power generation by converting heat to electricity via the use of a ZrCoBi-based thermoelectric material, wherein a thermoelectric conversion efficiency of the ZrCoBi-based thermoelectric material is greater than or equal to 7% at a temperature difference of up to 800 K.

17 Claims, 35 Drawing Sheets

(56) References Cited

OTHER PUBLICATIONS

Response to Office Action dated Jan. 26, 2022, for U.S. Appl. No. 17/252,659; Response filed Apr. 18, 2022 (9 p.).
Notice of Allowance dated May 10, 2022, for U.S. Appl. No. 17/252,659 (5 p.).

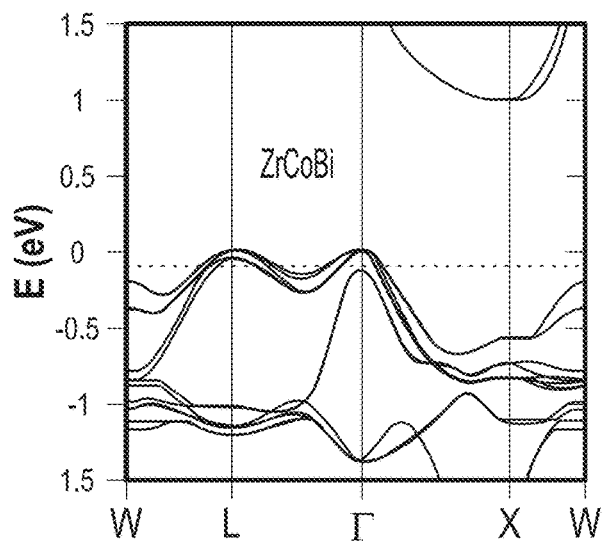 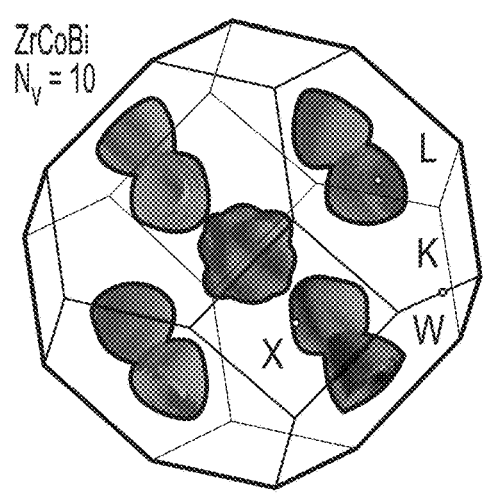
FIG. 2A  FIG. 2B
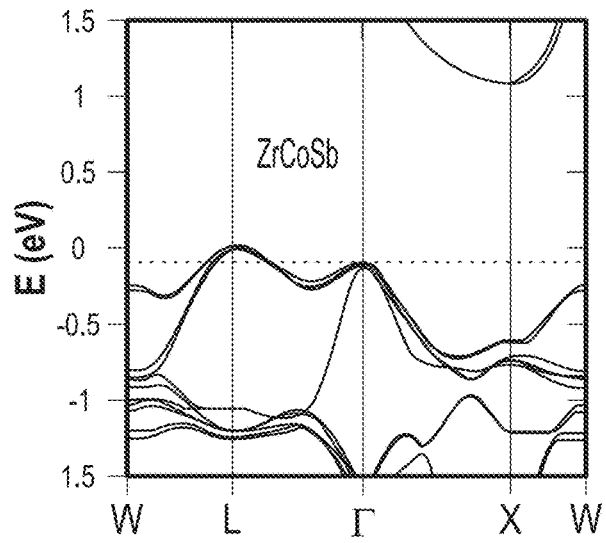 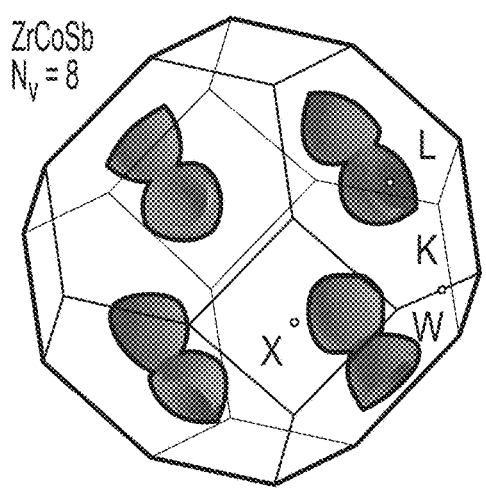
FIG. 2C  FIG. 2D
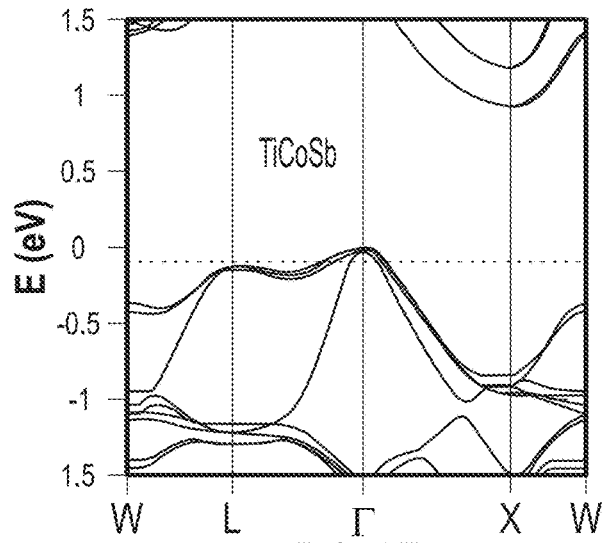 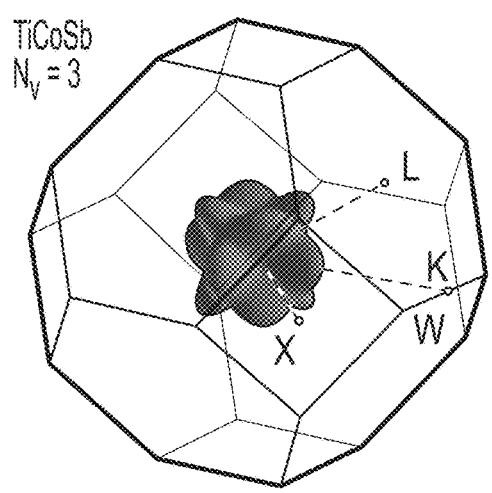
FIG. 2E  FIG. 2F

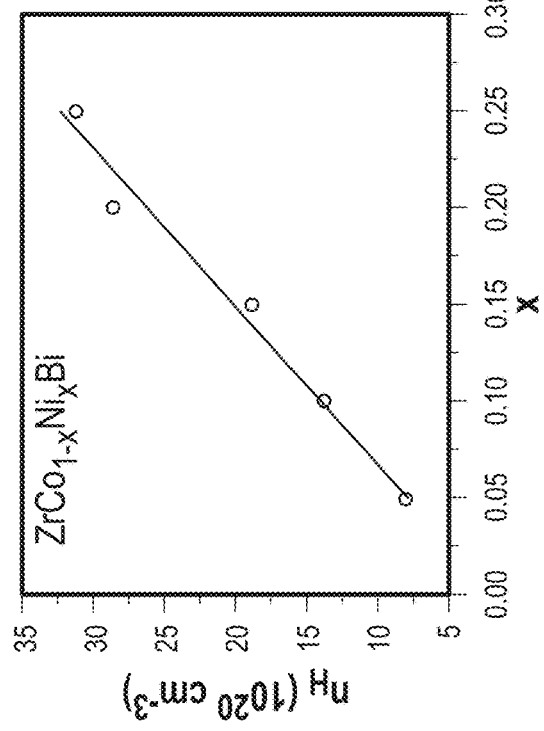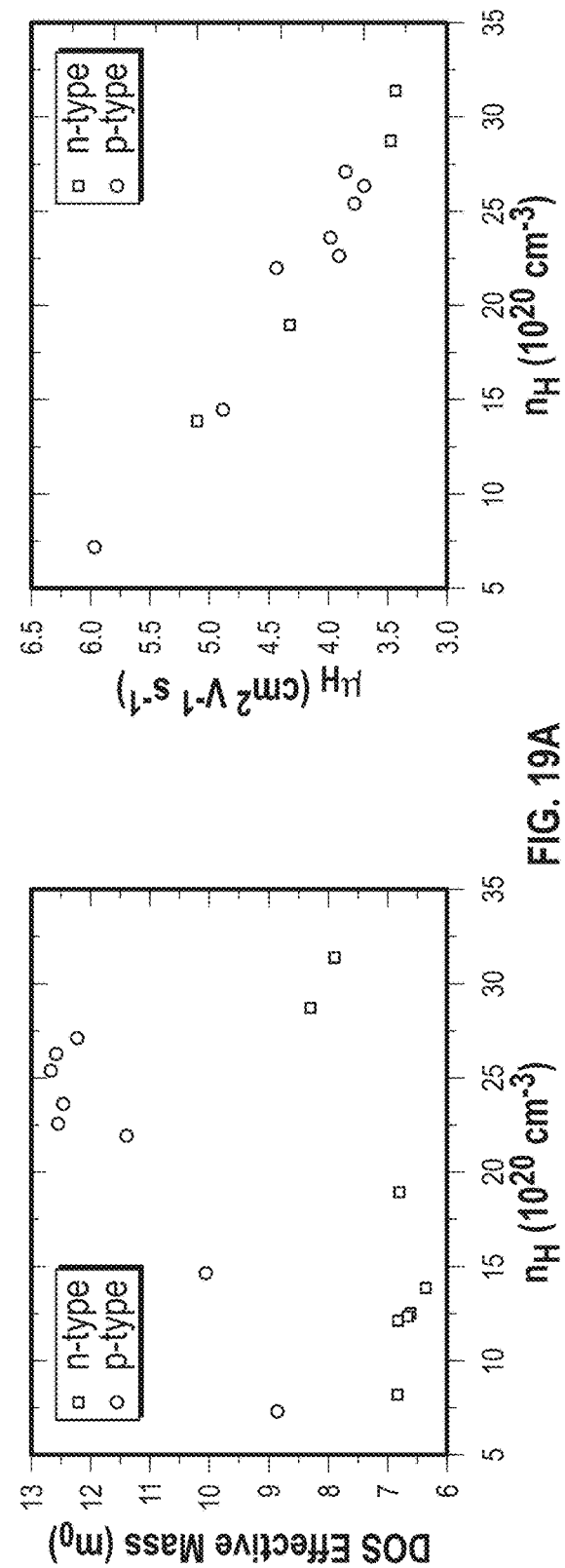
FIG. 18
FIG. 19A
FIG. 19B

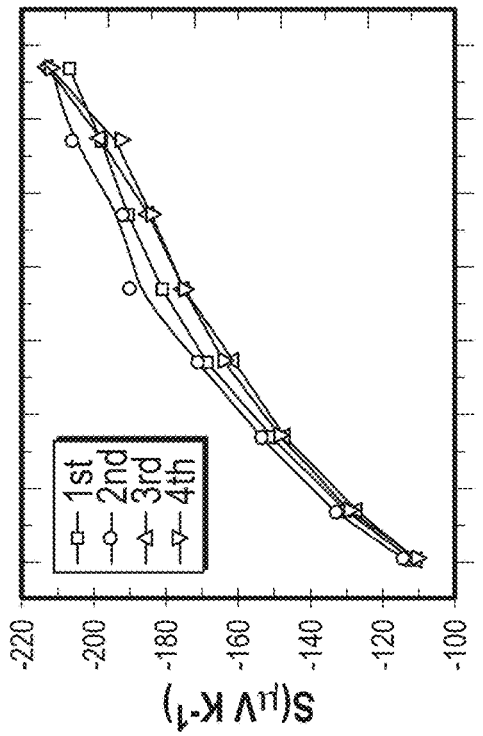
FIG. 23B
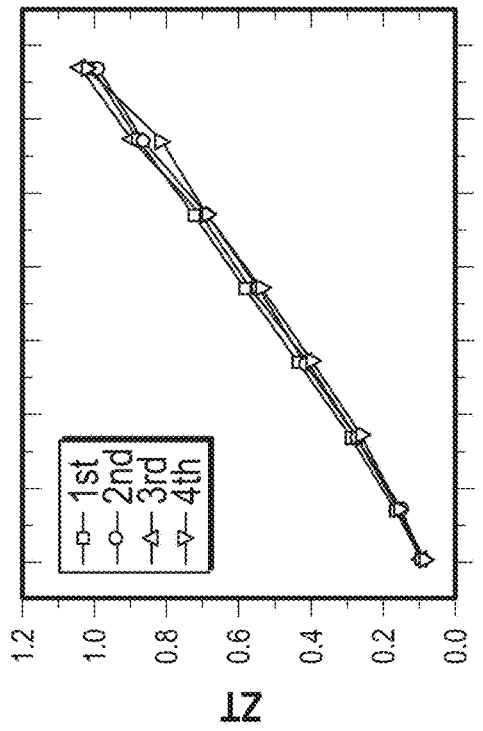
FIG. 23D
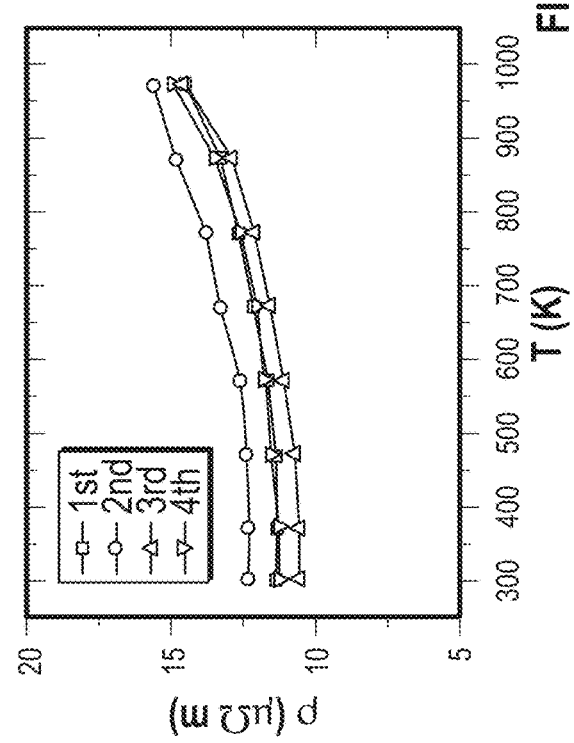
FIG. 23A
FIG. 23C

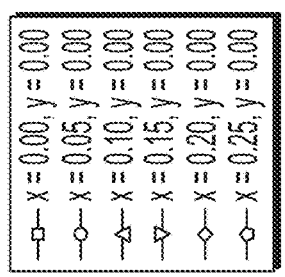
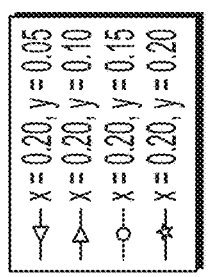
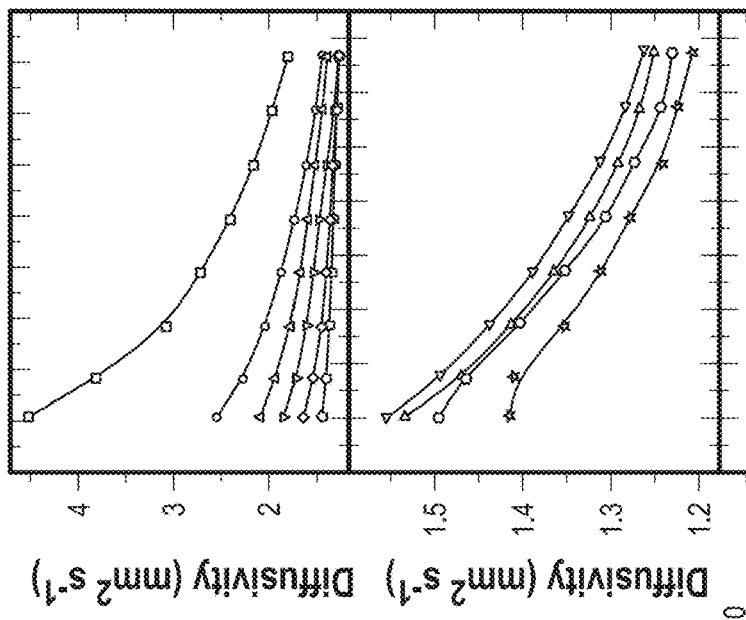
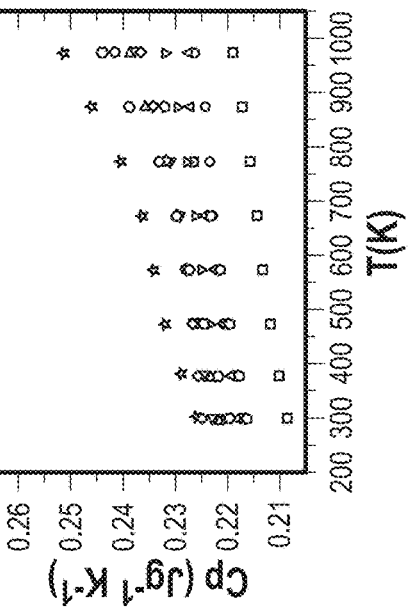
FIG. 28A
FIG. 28B
FIG. 28C
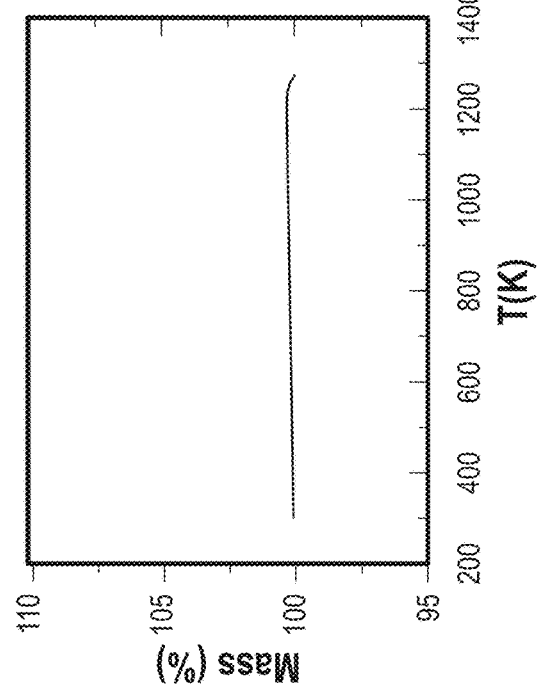
FIG. 27

ZRCOBI BASED HALF HEUSLERS WITH HIGH THERMOELECTRIC CONVERSION EFFICIENCY

CROSS-REFERENCE TO RELATED APPLICATIONS

This application is a continuation of U.S. application Ser. No. 17/252,659 filed Dec. 15, 2020, which is a 35 U.S.C. § 371 national stage application of PCT/US2019/039139 filed Jun. 26, 2019, which claims the benefit of and priority to U.S. Provisional Application No. 62/690,256, filed on Jun. 26, 2018, each of which is hereby incorporated herein by reference in its entirety for all purposes.

STATEMENT REGARDING FEDERALLY SPONSORED RESEARCH OR DEVELOPMENT

This invention was made with government support under Contract No. DE-SC0001299 awarded by the U.S. Department of Energy. The Government has certain rights in the invention.

BACKGROUND

Thermoelectric materials are capable of converting waste heat into electricity. The dimensionless figure-of-merit (ZT), as an important measure for the material's thermoelectric performance, plays a role in the energy conversion efficiency. Half-Heusler materials, as one of the most promising candidates for thermoelectric power generation, have relatively low ZTs compared to other material systems.

SUMMARY

Herein disclosed is a method of thermoelectric power generation, the method comprising: converting heat to electricity via the use of a ZrCoBi-based thermoelectric material, wherein a thermoelectric conversion efficiency of the ZrCoBi-based thermoelectric material is greater than or equal to 7% at a temperature difference of up to 800 K.

Also provided herein is a method of thermoelectric power generation, the method comprising: converting heat to electricity via the use of a first ZrCoBi-based thermoelectric material comprising a p-type half-Heusler thermoelectric material and a second ZrCoBi-based thermoelectric material comprising an n-type half-Heusler thermoelectric material, wherein the heat is converted to electricity at a thermoelectric conversion efficiency of 10% or greater at a temperature difference of 650 K.

Further provided herein is a method of thermoelectric power generation, the method comprising: converting heat to electricity via the use of: a first ZrCoBi-based thermoelectric material comprising a p-type half-Heusler thermoelectric material; a second ZrCoBi-based thermoelectric material comprising an n-type half-Heusler thermoelectric material; or both the first ZrCoBi-based thermoelectric material and the second ZrCoBi-based thermoelectric material, wherein the heat is converted to electricity at a thermoelectric conversion efficiency of at least 7%.

Also provided herein is a ZrCoBi-based p-type half-Heusler material can have a formula: $ZrCoBi_{1-x-y}Sn_xSb_y$, where x can vary between 0.01 and 0.25, and y can vary between 0 and 0.2. An average dimensionless figure-of-merit (ZT) for the material can be greater than or equal to about 0.80 as calculated by an integration method for temperatures between 300 and 973 K.

Further provided herein is a ZrCoBi-based n-type half-Heusler material can have a formula: $ZrCo_{1-x}Ni_xSb_y$, where x can vary between 0.01 and 0.25, and y can vary between 0 and 0.3. The material has an average dimensionless figure-of-merit (ZT) is greater than or equal to about 0.65 as calculated by an integration method for temperatures between 300 and 973 K.

Also disclosed herein is a thermoelectric module comprises at least one first leg and at least one second leg. The first leg can comprise a first material having a formula: $ZrCoBi_{1-x-y}Sn_xSb_y$, where x can vary between 0.01 and 0.25, and y can vary between 0 and 0.2, and the second leg can comprise a second material having a formula: $ZrCo_{1-x}Ni_xBi_{1-y}Sb_y$, where x can vary between 0.01 and 0.25, and y can vary between 0 and 0.3. The at least one first leg and the at least one second leg are connected thermally in parallel and electrically in series.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 1A shows a comparison of temperature dependent ZT values, and FIG. 1B shows average ZTs between p-type $ZrCoBi_{0.65}Sb_{0.15}Sn_{0.2}$ and other reported p-type half-Heuslers.

FIGS. 2A-2F illustrate the first-principle calculation of band structures. The calculated band structures of ZrCoBi are shown in FIG. 2A, ZrCoSb are shown in FIG. 2C, and TiCoSb are shown in FIG. 2E. The cross lines in FIGS. 2A, 2C, AND 2E represent energy level of 0.1 eV below VBM. The corresponding iso-energy surfaces at 0.1 eV below VBM in the Brillouin zone of ZrCoBi are shown in FIG. 2B, ZrCoSb are shown in FIG. 2D, and TiCoSb are shown in FIG. 2F.

FIG. 7A illustrates a Relationship between Young's modulus (E) and mean sound velocity ($V_m$). The temperature dependent thermal conductivity and the lattice thermal conductivity of $ZrCoBi_{1-x}Sn_x$ are shown in FIG. 7B. The accumulated room temperature lattice thermal conductivity of ZrCoBi and $ZrCoBi_{0.8}Sn_{0.2}$ with respect to phonon mean-free-path are shown in FIG. 7C. The notations of acoustic and optical represent acoustic and optical branches of phonons, respectively, are shown in FIG. 7D. The temperature-dependent ZT of $ZrCoBi_{1-x}Sn_x$ and $ZrCoBi_{0.65}Sb_{0.15}Sn_{0.20}$ are shown in FIG. 7E. The reproducibility of the thermoelectric performance of $ZrCoBi_{0.65}Sb_{0.15}Sn_{0.20}$ is shown in FIG. 7F.

FIG. 17A illustrates the electrical conductivity, FIG. 17B illustrates the Seebeck coefficient, FIG. 17C illustrates the power factor, and FIG. 17D illustrates $S^2n$ of $ZrCo_{1-x}Ni_xBi$.

FIG. 18 illustrates the room-temperature Hall carrier concentration of $ZrCo_{1-x}Ni_xBi$.

FIGS. 19A-19B illustrate a comparison of the density of state (DOS) effective mass and carrier mobility between n-type and p-type ZrCoBi-based materials, where the Hall carrier concentration dependent DOS effective mass is shown in FIG. 19A, and the carrier mobility is shown in FIG. 19B.

FIGS. 23A-23D illustrate the reproducibility of the thermoelectric performance of $ZrCo_{0.9}Ni_{0.1}Bi_{0.85}Sb_{0.15}$. Thermoelectric properties of four different batches of $ZrCo_{0.9}Ni_{0.1}Bi_{0.85}Sb_{0.15}$ were measured where the electrical resistivity is shown in FIG. 23A, the Seebeck coefficient is shown in FIG. 23B, the thermal conductivity is shown in FIG. 23C, and the ZT is shown in FIG. 32D.

FIG. 27 illustrates the thermogravimetric analysis of $ZrCoBi_{0.65}Sb_{0.15}Sn_{0.20}$ in Ar atmosphere in which no decomposition of the sample was observed up to 1273 K.

FIGS. 28A-28C illustrate thermal transport properties including the temperature-dependent diffusivity as shown in FIGS. 28A and 28B, and the specific heat of $ZrCoBi_{1-x-y}Sb_ySn_x$ as shown in FIG. 28C.

DETAILED DESCRPTION

Figure 1A:
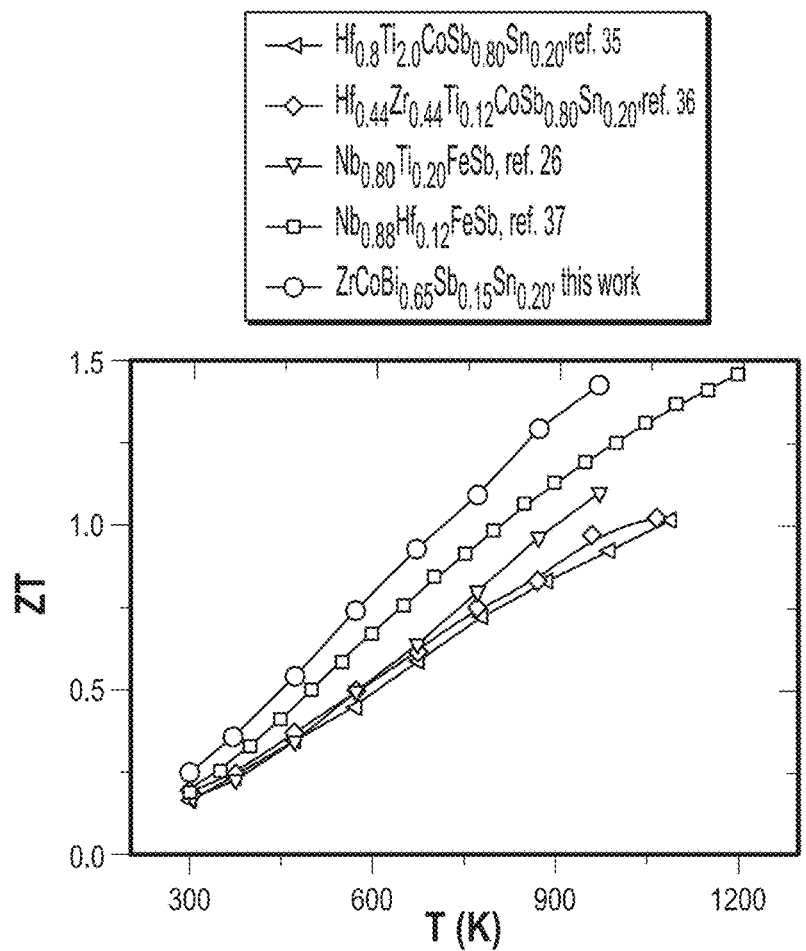
FIGS. 1A-1B illustrate examples of the thermoelectric figure-of-merit ZT of various materials.
Figure 1B:
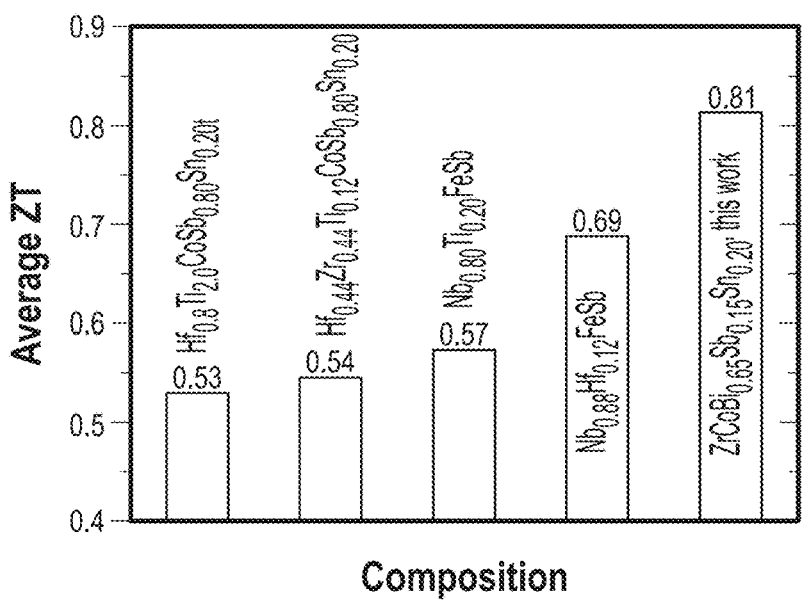

It should be understood at the outset that although an illustrative implementation of one or more exemplary embodiments are provided below, the disclosed compositions, methods, and/or products may be implemented using any number of techniques, whether currently known or in existence. The disclosure should in no way be limited to the illustrative implementations, drawings, and techniques illustrated hereinbelow, including the exemplary designs and implementations illustrated and described herein, but may be modified within the scope of the appended claims along with their full scope of equivalents.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ."

Disclosed herein are p-type and n-type ZrCoBi based half-Heuslers along with structures and methods using the disclosed materials. The disclosed p-type ZrCoBi based half-Heuslers demonstrate a ZT of ~1.4 at 973 K and a thermoelectric conversion efficiency of ~9% at a temperature difference of ~500 K. Such thermoelectric performance originates from its unique band structure offering a high band degeneracy ($N_v$) of 10 in conjunction with a low thermal conductivity benefiting from the low mean sound velocity ($V_m \sim 2800$ ms$^{-1}$). The average ZT of ~0.81 (calculated by integration method between 300 and 973 K) for $ZrCoBi_{0.65}Sb_{0.15}Sn_{0.20}$ is also the highest value among all the p-type half-Heusler compounds. In addition, output power density and conversion efficiency of ~9.3 W cm$^{-2}$ and ~9% were realized with cold-side and hot-side temperature being 323 and 823 K, respectively. In addition, a good thermal stability for the ZrCoBi-based half-Heusler has also been confirmed. The results demonstrated herein indicate that ZrCoBi-based half-Heuslers are promising candidates for high-temperature thermoelectric power generation.

Thermoelectric generators enable a direct energy conversion from heat to electricity. This solid-state energy conversion technique has advantages of reliability, simplicity, compactness, and environmentally friendliness. However, the application of thermoelectric modules is currently limited to niche market due to the relatively low efficiency comparing to the traditional heat engines. The conversion efficiency of the thermoelectric modules is jointly determined by the Carnot efficiency, as well as the material's figure-of-merit (ZT):

$$\eta = \left(\frac{T_{hot} - T_{cold}}{T_{hot}}\right)\left[\frac{\sqrt{1 + ZT_m} - 1}{\sqrt{1 + ZT_m} + \left(\frac{T_{cold}}{T_{hot}}\right)}\right] \quad (1)$$

where $T^{hot}$ is the hot-side temperature, $T^{cold}$ is the cold-side temperature, and $T_m$ is the average temperature. ZT is the thermoelectric figure-of-merit, which is the critical measure for the materials' performance that defined as:

$$ZT = \frac{S^2 \sigma}{\kappa_L + \kappa_e} T \quad (2)$$

where S, $\sigma$, $\kappa_L$, $\kappa_e$, and T are the Seebeck coefficient, electrical conductivity, lattice thermal conductivity, electronic thermal conductivity, and absolute temperature, respectively. At a given temperature difference ($T_{hot} - T_{cold}$), the improvements in thermoelectric conversion efficiency entirely rely upon the ZT enhancement. Therefore, improving the performance of existing materials and identifying new compounds with intrinsically high ZT are two basic concepts in the research of thermoelectric materials.

However, simultaneous optimization of the thermoelectric transport parameters remains a challenge owing to their intricate interdependences. The S, $\sigma$, and $\kappa_e$ are closely correlated with each other via the carrier concentration, while $\kappa_L$ is relatively independent. Therefore, improving the power factor ($S^2\sigma$) and reducing the lattice thermal conductivity are two main strategies for enhancing the thermoelectric performance. On the one hand, the power factors can be improved by tuning the carrier concentration, and further enhancement can be achieved by band engineering, modulation doping, introducing the resonant level, and tuning the carrier scattering mechanism. Among these approaches, band engineering via increasing the degenerate band valleys ($N_v$), either by alloying or exploiting the temperature dependence of the electronic bands, has been demonstrated to be particularly effective in enhancing the power factor. In this case, a high electrical conductivity can be obtained with the presence of multiple conducting channels enabled by the high number of band valleys. In the meanwhile, the Seebeck coefficient can still be maintained since the high electrical conductivity does not involve any increase in the carrier concentration. On the other hand, reduction of the lattice thermal conductivity has been proven quite effective in enhancing the ZT. According to the kinetic theory, $\kappa_L=\frac{1}{3}C_v V_{ph} l$, where $C_v$ is the heat capacity, $V_{ph}$ is the phonon velocity, and $l$ is the phonon mean free path. Extensive results have demonstrated that shortening the phonon mean-free-path via phonon scattering by microstructural defects and nanostructures can noticeably reduce the lattice thermal conductivity. In addition, phonon velocity as another important parameter for lattice thermal conductivity can also be tailored for phonon engineering. Usually, the phonon velocity is simply approximated by the low frequency sound velocity (v is proportional to $\sqrt{B/\delta}$), where B is the elastic modulus and $\delta$ is the density of the compound. Therefore, sound velocity, which is closely associated with the crystal structure, chemical composition, and bonding, can play a decisive role in the lattice thermal conductivity. More specifically, the materials with a low sound velocity usually tend to have a low lattice thermal conductivity. Therefore, a compound that simultaneously possesses a high band degeneracy (i.e., high power factor) in combination with an intrinsically low sound velocity (i.e., low thermal conductivity) is likely to demonstrate a promising thermoelectric performance.

Among the various thermoelectric materials, half-Heusler compounds, with large power factors, robust mechanical properties, and good thermal stabilities, are promising candidates for high temperature thermoelectric power generation. However, due to the relative high lattice thermal conductivity (usually on the magnitude of ~10 W m$^{-1}$ K$^{-1}$ for the pristine compounds), the ZTs (especially the average ZTs) of the state-of-the art half-Heuslers remains relatively low comparing to other well established material systems. Consequently, future development of the half-Hesulers thermoelectric module depends on identifying a new compound with high thermoelectric performance.

In some embodiments, a ZrCoBi-based p-type half-Heusler material having a formula:

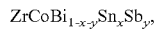

$ZrCoBi_{1-x-y}Sn_xSb_y$, where x can vary between 0.01 and 0.25, and y can vary between 0 and 0.2. In some embodiments, x can be about 0.2 and y can be about 0.15. An average dimensionless figure-of-merit (ZT) can be greater than or equal to about 0.80 as calculated by an integration method for temperatures between 300 and 973 K. In some embodiments, a peak dimensionless figure-of-merit (ZT) of greater than or equal to about 1.4 at 973 K, and/or a thermoelectric conversion efficiency can be greater than or equal to about 9% at a temperature difference of about 500 K. The material can have a band structure with a high band degeneracy ($N_v$) of at least about 10. The material can have a room temperature power factor is at least about 20 μW cm$^{-1}$ K$^{-2}$, and/or a peak power factor of at least about 40 μW cm$^{-1}$ K$^{-2}$. In some embodiments, x can vary between 0.15 and 0.2 and y is 0 such that no antimony is present in the material while the material can still demonstrate good properties. In some embodiments, the material can have a room temperature lattice thermal conductivity of less than 3 W m$^{-1}$ K$^{-1}$, and/or a mean sound velocity ($V_m$) of less than about 2800 m s$^{-1}$. In some embodiments, some portion of the Zr can be replaced by Ti, Hf, V, Nb, Ta, or any combination thereof. For example, the Zr can be replaced up to about 5%, 10%, 15%, or 20%, all on a molar basis.

The p-type ZrCoBi-based half-Heuslers can possess a high band degeneracy ($N_v$=10) in conjunction with a low mean sound velocity ($V_m$ ~2800 ms$^{-1}$) relative to the state-of-the-art half-Heuslers. Benefiting from the combination of the appealing electronic and thermal properties, a peak ZT of up to about 1.4 at 973 K can be achieved. Such a high thermoelectric performance is further validated by the efficiency measurement and a high thermoelectric conversion efficiency of up to about 9% achieved at a temperature difference of about 500 K. As disclosed herein, the Bi-based half-Heuslers, which have long been ignored for thermoelectric application, open up a new avenue for designing advanced half-Heusler thermoelectric materials.

Various comparisons demonstrate the relatively high thermoelectric performance of the ZrCoBi-based half-Heuslers, compared to other half-Heuslers. For example, the temperature-dependent ZT between $ZrCoBi_{0.65}Sb_{0.15}Sn_{0.20}$ and other p-types of half-Heuslers (e.g., HfCoSb-based, ZrCoSb-based, and NbFeSb based half-Heuslers) is shown in FIG. 1A. As shown, $ZrCoBi_{0.65}Sb_{0.15}Sn_{0.20}$ outperforms all the other p-type half-Heuslers in the whole temperature range with a peak ZT of approximately 1.4 at 973 K. The average ZT is further calculated by the integration method in the temperature of 300 to 973 K, where $ZrCoBi_{0.65}Sb_{0.15}Sn_{0.20}$ demonstrates the highest average ZT of approximately 0.81, whereas the ZT is only ~0.69 for $Nb_{0.88}Hf_{0.12}FeSb$, ~0.57 for $Nb_{0.8}Ti_{0.2}FeSb$, ~0.54 for $Hf_{0.44}Zr_{0.44}Ti_{0.12}Sb_{0.8}Sn_{0.2}$, and ~0.53 for $Hf_{0.8}Ti_{0.2}CoSb_{0.8}Sn_{0.2}$.

Figure 3A:
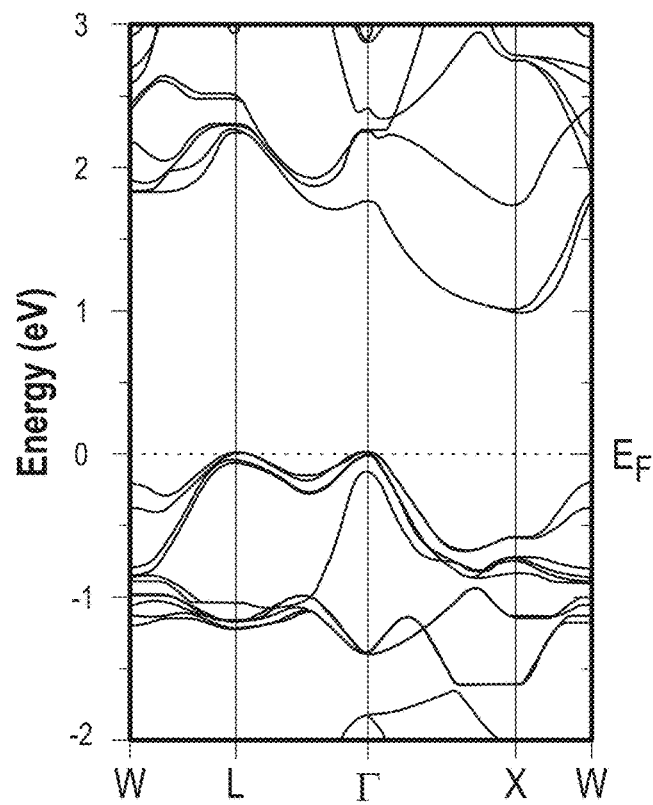
FIGS. 3A-3B illustrate the calculated band structure of ZrCoBi with spin-orbit coupling effect in FIG. 3A and without spin-orbit coupling effect in FIG. 3B.
Figure 3B:
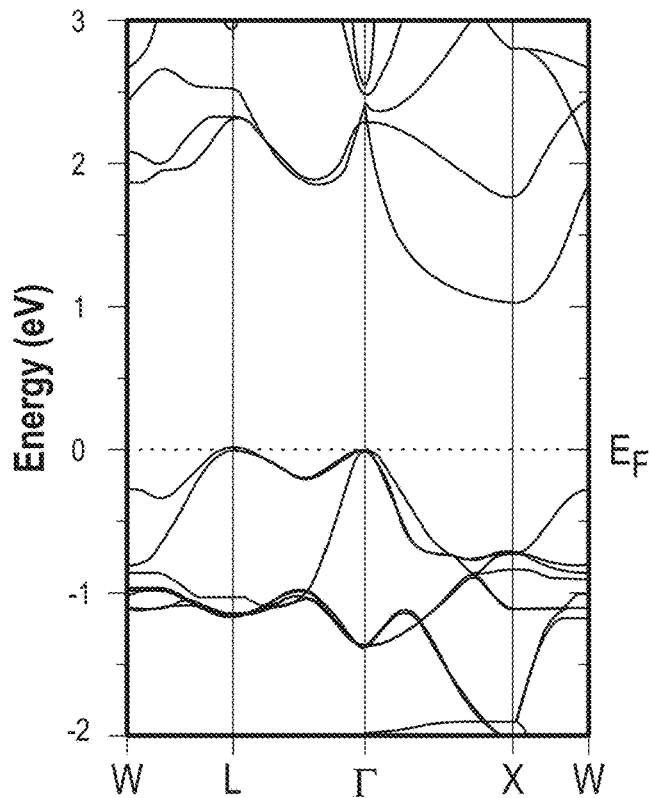

With the half-Heusler materials, high band degeneracy can lead to high power factor. To understand the origin for such a high thermoelectric performance of ZrCoBi-based half-Heuslers, the first-principles calculation on the band structure of ZrCoBi (e.g., as shown in FIG. 2A) was employed to evaluate its electronic thermoelectric performance. The valence band maxima (VBM) locates at Γ point, while the valence bands at L point show a negligible energy difference (ΔE) of ~0.001 eV lower than that of Γ point. The valence bands converge at Γ point and split slightly at L point due to spin-orbit coupling effect as shown in FIG. 3. Due to the negligible energy difference, all the valence bands that converge at L and Γ points will contribute jointly to the hole-transport. Since the two bands converging at L point give a band degeneracy of 8 and those at Γ point provide an additional band degeneracy of 2, therefore in total yielding a high band degeneracy of 10 for p-type ZrCoBi (e.g., as shown in FIG. 2B). To highlight such a high band degeneracy in ZrCoBi, band structures for the isostructural half-Heuslers ZrCoSb (e.g., as shown in FIG. 2C) and TiCoSb (e.g., as shown in FIG. 2E) were also calculated for comparison. In contrast, there is an appreciable energy difference of L and Γ points for ZrCoSb (ΔE ~0.13 eV) and TiCoSb (ΔE~0.11 eV), which means only the valence bands at one of the points will contribute to the hole transport. To better illustrate the differences in band degeneracy among the three compounds, iso-energy surface at 0.1 eV below VBM is plotted (e.g., as shown in FIGS. 2B, 2D, 2F). The band degeneracy equals 8 for ZrCoSb and only 3 for TiCoSb, both of which are noticeably lower than that of ZrCoBi. According to the above-mentioned relationship between the band degeneracy and power factor, it strongly suggests that p-type ZrCoBi-based compounds could demonstrate an increased electronic thermoelectric performance.

Figure 4A:
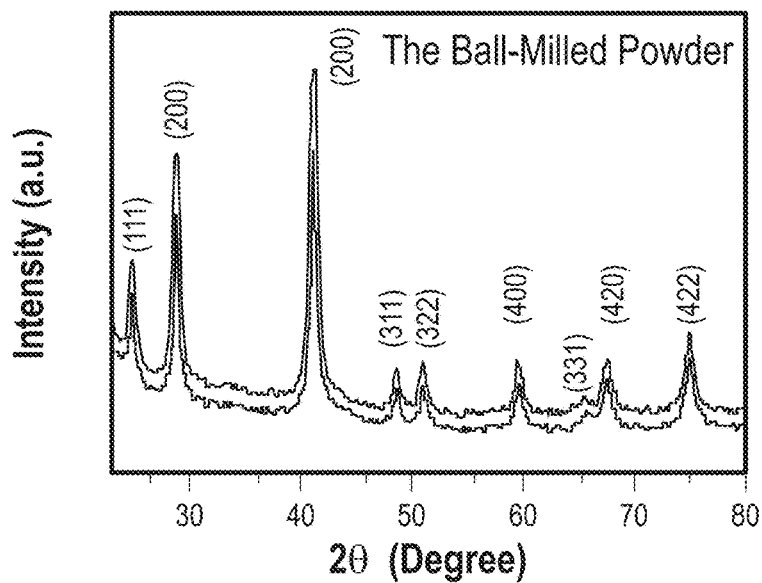
FIGS. 4A-4C illustrate the X-ray diffraction patterns of ball-milled ZrCoBi powders in FIG. 4A, and hot pressed $ZrCoBi_{1-x-y}Sb_ySn_x$ pellets in FIGS. 4B and 4C.
Figure 4B:
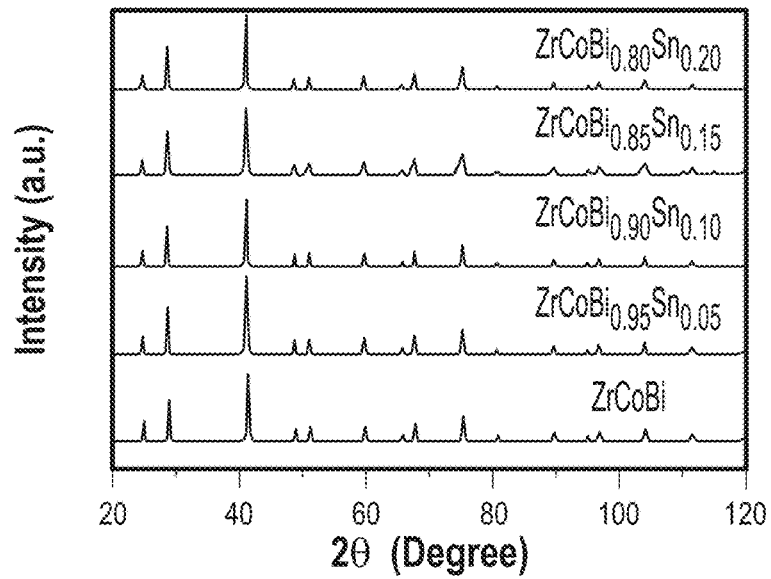
Figure 4C:
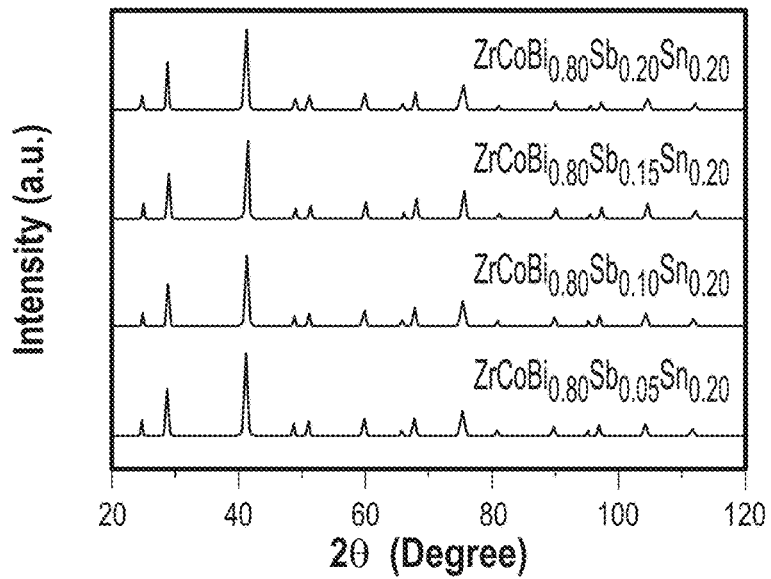

The p-type ZrCoBi-based half-Heusler materials disclosed herein can comprise a ZrCoBi-based material that can be doped with Sn and/or alloyed with Sb. The p-type ZrCoBi-based materials can be synthesized by the ball-milling and hot-pressing technique as described in more detail herein. The disclosed materials can demonstrate a single half-Heusler phase having an exemplary X-ray diffraction pattern as shown in FIG. 4. FIG. 5 shows the electrical conductivity of $ZrCoBi_{1-x}Sn_x$, where x equals 0, 0.05, 0.10, 0.15, and 0.20), where a monotonic increase of electrical conductivity with the Sn concentration can be observed. The room temperature electrical conductivity is ~$1.14 \times 10^3$ $Ohm^{-1}$ $m^{-1}$ for ZrCoBi and it is ~$1.66 \times 10^5$ $Ohm^{-1}$ $m^{-1}$ for $ZrCoBi_{0.8}Sn_{0.2}$. The enhancement in electrical conductivity may be mainly attributed to the effectively increased Hall carrier concentration ($n_H$), as shown in the FIG. 6.

Figure 5A:
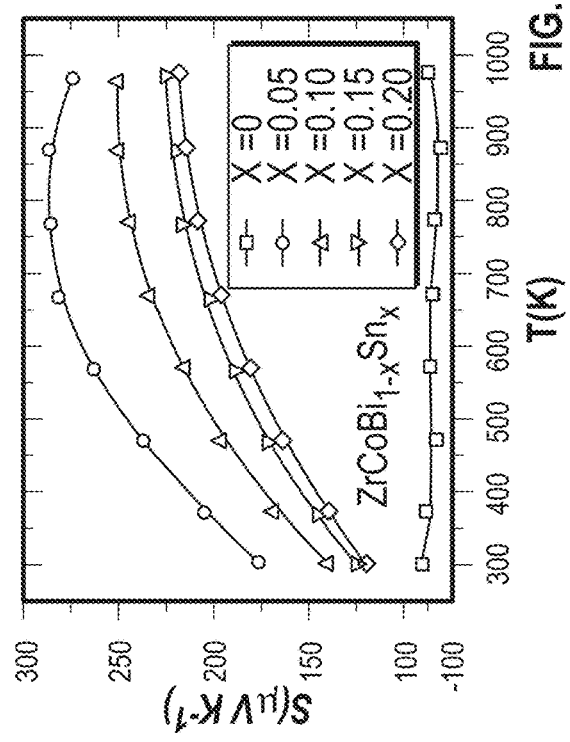
FIGS. 5A-5D illustrate the electrical properties of $ZrCoBi_{1-x}Sn_x$. The temperature-dependent electrical conductivity is shown in FIG. 5A, the Seebeck coefficient is shown in FIG. 5B, the power factor of $ZrCoBi_{1-x}Sn_x$ (x=0, 0.05, 0.10, 0.15, and 0.20) is shown in FIG. 5C, and the band-degeneracy-dependent power factors for 15% Sn doped TiCoSb, ZrCoSb, and ZrCoBi at different temperatures with carrier concentration of $1.62\times10^{21}$, $1.47\times10^{21}$, and $2.20\times10^{21}$ cm$^{-3}$, respectively, are shown in FIG. 5D.
Figure 5B:
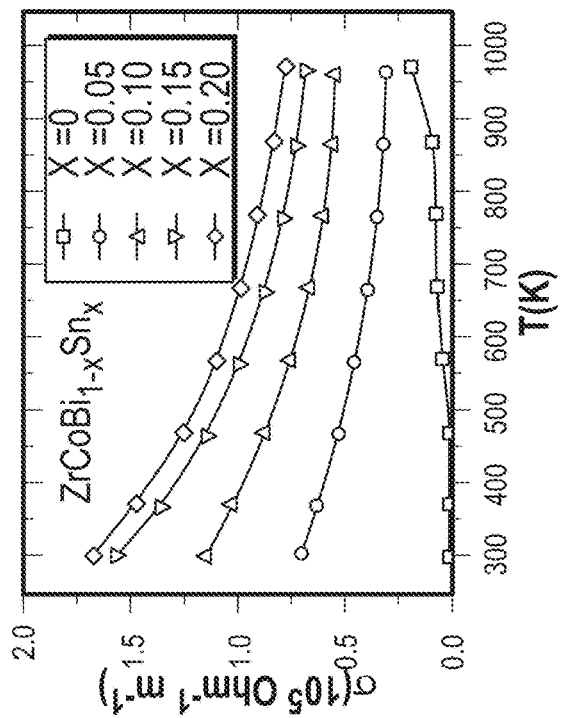
Figure 6:
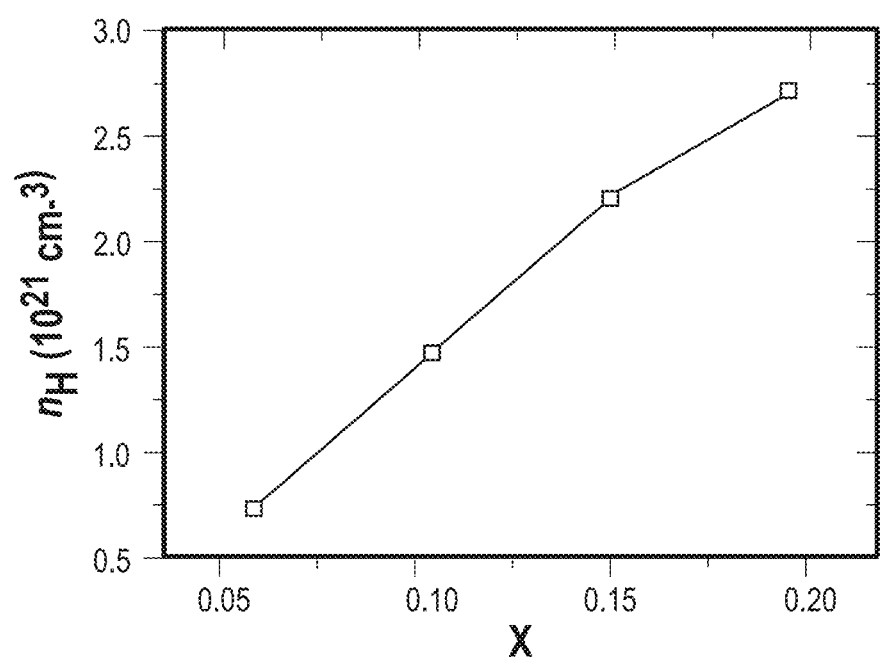
FIG. 6 illustrates the composition dependent Hall carrier concentration of $ZrCoBi_{1-x}Sn_x$.

The almost linear increase of Hall carrier concentration with respect to the Sn concentration (e.g., ~$0.75 \times 10^{21}$ $cm^{-3}$ for $ZrCoBi_{0.95}Sn_{0.05}$ and ~$2.75 \times 10^{21}$ $cm^{-3}$ for $ZrCoBi_{0.8}Sn_{0.2}$) demonstrates the high doping efficiency of Sn in p-type ZrCoBi. FIG. 5B shows the temperature-dependent Seebeck coefficient of $ZrCoBi_{1-x}Sn_x$. It is noteworthy that the pristine ZrCoBi shows an intrinsic n-type transport characteristic and Sn-doping (Sn concentration as low as ~5%) successfully converts it into fully p-type. At relatively low Sn concentration (x=0.05), the bipolar conduction can be observed at high temperature and it disappears when the Sn concentration is increased.

Figure 5C:
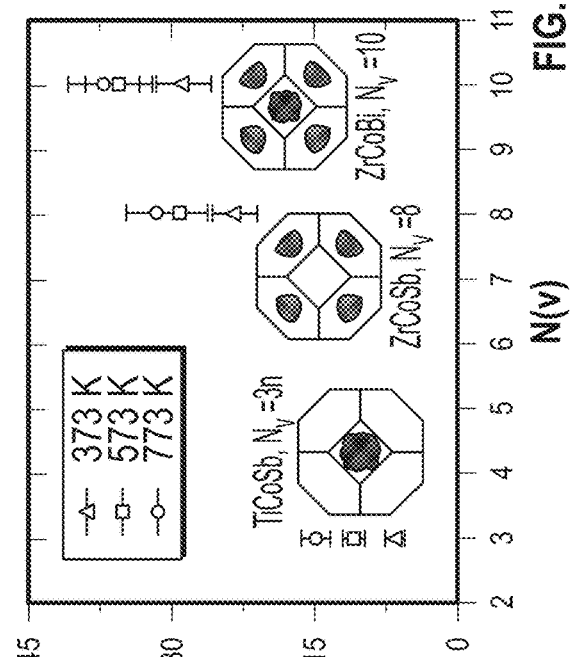
Figure 5D:
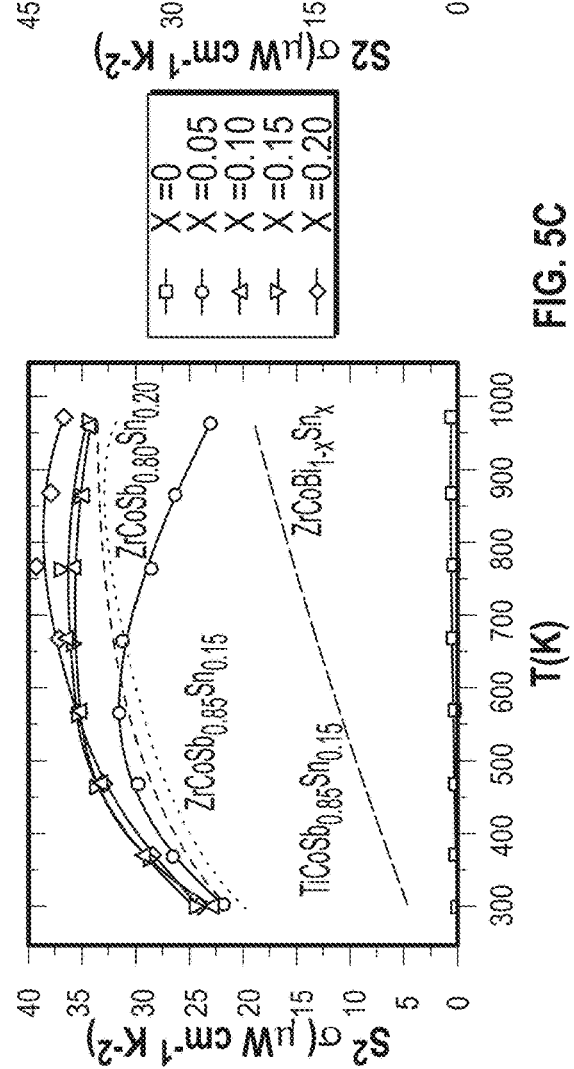

By changing the Sn concentration, high power factors can be obtained for $ZrCoBi_{1-x}Sn_x$ (e.g., as shown in FIG. 5C). The room temperature power factor is ~25 $\mu W$ $cm^{-1}$ $K^{-2}$ and the peak power factor reaches ~40 $\mu W$ $cm^{-1}$ $K^{-2}$ for $ZrCoBi_{0.80}Sn_{0.20}$. In addition, Sn-doped TiCoSb and ZrCoSb (both prepared in the same way) with similar Hall carrier concentration are also plotted for comparison. As shown in FIG. 5C, $ZrCoBi_{0.75}Sn_{0.15}$ and $ZrCoBi_{0.80}Sn_{0.20}$ show noticeably higher power factors than that of Sn-doped ZrCoSb and TiCoSb. Band-degeneracy-dependent power factor at different temperatures is further plotted for the three compounds, as shown in FIG. 5D. The power factor increases monotonically with the band degeneracy across the temperature profiles. This demonstrates that band degeneracy can play a pivotal role in the power factor. In other words, the high power factor achieved in ZrCoBi-based compounds should be mainly attributable to the high band degeneracy for this compound as indicated by the theoretical calculations (e.g., as shown in FIG. 2B).

Figure 7A:
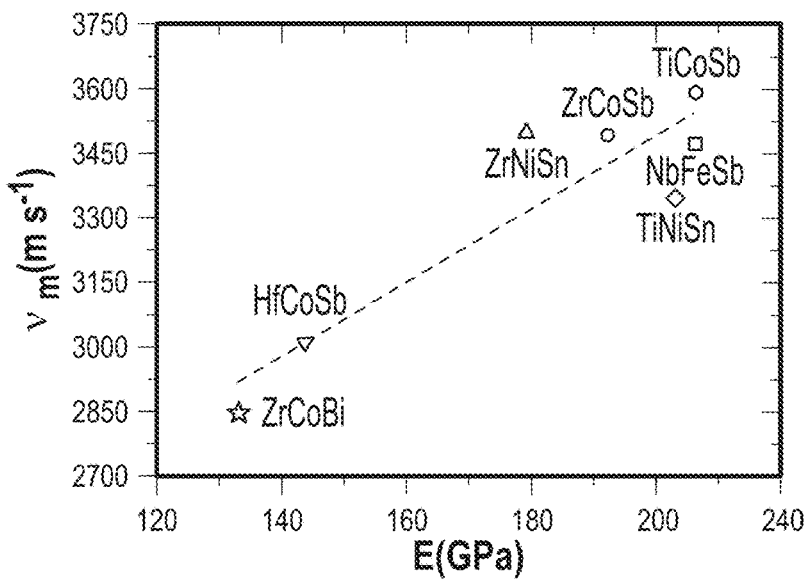
FIGS. 7A-7F illustrate the thermal conductivities and ZTs of $ZrCoBi_{1-x}Sn_x$.

With the half-Heusler materials, a low sound velocity can lead to a low lattice thermal conductivity. Sound velocity can play a role in the lattice thermal conductivity. The relationship between the Young's modulus (E) and the mean sound velocity ($V_m$) for other half-Heuslers is shown in FIG. 7A. Compared to the Sn-based and Sb-based half-Heuslers (NbFeSb, MNiSn, and MCoSb, where M=Hf, Zr, Ti), the ZrCoBi-based compounds possess the lowest mean sound velocity ~2850 $ms^{-1}$ and Young's modulus, as shown in Table 1.

| | $v_L$ (m $s^{-1}$) | $v_t$ (m $s^{-1}$) | $v_m$ (m $s^{-1}$) | $\theta_D$ (K) | $v_p$ | $\gamma$ |
|---|---|---|---|---|---|---|
| ZrCoBi | 4613 | 2558 | 2849 | 314 | 0.278 | 1.64 |
| $ZrCoBi_{0.65}Sb_{0.15}Sn_{0.20}$ | 4410 | 2468 | 2747 | 303 | 0.272 | 1.61 |

Figure 7B:
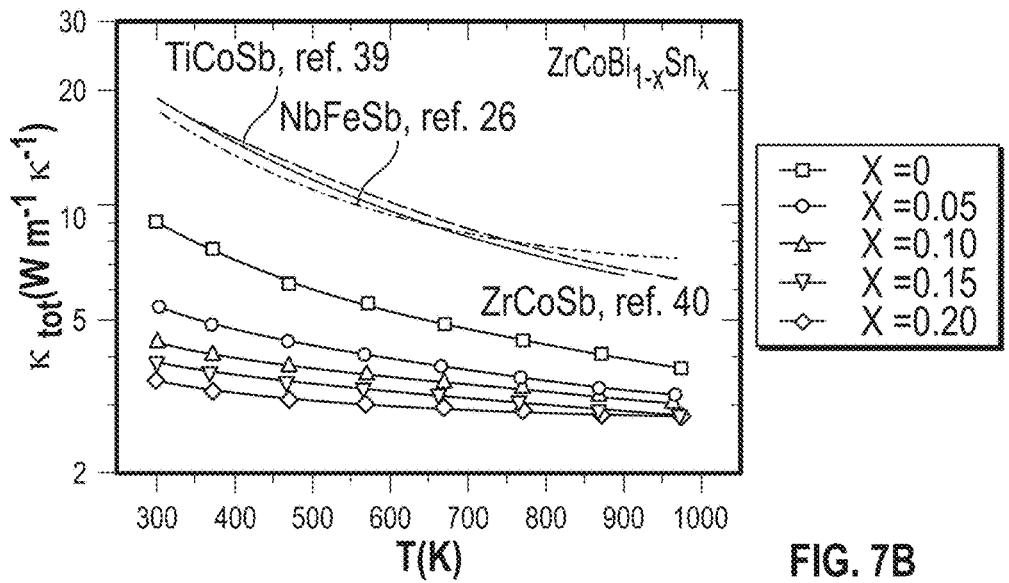
Figure 7C:
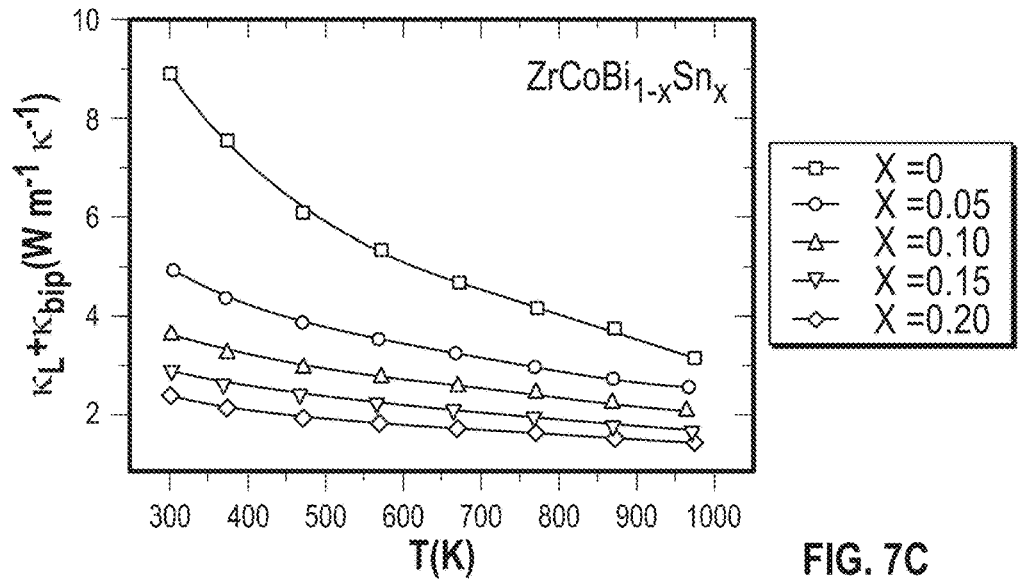

Such a low mean sound velocity and Young's modulus can originate from the weaker chemical bonding and heavy atomic mass of Bi. For the ZrCoBi-based compounds, the strong relativistic effect of Bi contracts the 6 s shell and increases its inertness for bonding. Therefore, the low mean sound velocity and Young's modulus can jointly contribute to an intrinsically low lattice thermal conductivity for ZrCoBi. The temperature-dependent thermal conductivities of $ZrCoBi_{1-x}Sn_x$ are shown in FIG. 7B. In addition, the thermal conductivities of the undoped TiCoSb, ZrCoSb, and NbFeSb are also plotted, where the pristine ZrCoBi shows a lower thermal conductivity compared to the other half-Heuslers. The room temperature thermal conductivity is ~19 W $m^{-1}$ $K^{-1}$ for TiCoSb, ~19 W $m^{-1}$ $K^{-1}$ for ZrCoSb, and ~17 W $m^{-1}$ $K^{-1}$ for NbFeSb, but ~9 W $m^{-1}$ $K^{-1}$ for ZrCoBi, which is only half of the other p-type half-Heuslers. Importantly, the thermal conductivity of $ZrCoBi_{1-x}Sn_x$ decreases noticeably with Sn concentration, which should be mainly ascribed to the reduction in the lattice thermal conductivity. As shown in FIG. 7C, the lattice thermal conductivity of $ZrCoBi_{1-x}Sn_x$ is greatly suppressed with the increase of Sn concentration. The room temperature lattice thermal conductivity of ZrCoBi is ~9 W $m^{-1}$ $K^{-1}$ but only ~2.6 W $m^{-1}$ $K^{-1}$ for $ZrCoBi_{0.80}Sn_{0.20}$, where a reduction of ~71% is achieved after Sn doping. It is noteworthy that the minimum lattice thermal conductivity of $ZrCoBi_{0.80}Sn_{0.20}$ can reach as low as ~1.6 W $m^{-1}$ $K^{-1}$ at 973 K. Such a significant phonon scattering by Sn-doping should be mainly attributed to the substantial atomic mass difference between Sn (atomic weight: ~118.71) and Bi atoms (atomic weight: ~208.98) that leads to an intense point defect scattering. The accumulated lattice thermal conductivities with respect to the phonon mean-free-path for ZrCoBi and $ZrCoBi_{0.80}Sn_{0.20}$ are calculated and shown in FIG. 7D. The calculated lattice thermal conductivity of $ZrCoBi_{0.80}Sn_{0.20}$ is lower compared to that of ZrCoBi. The reduced acoustic phonon contribution leads to the much lower thermal conductivity of $ZrCoBi_{0.80}Sn_{0.20}$. Such a scattering of acoustic phonon should be mainly attributed to the point defect scattering induced by Sn-doping.

Figure 7D:
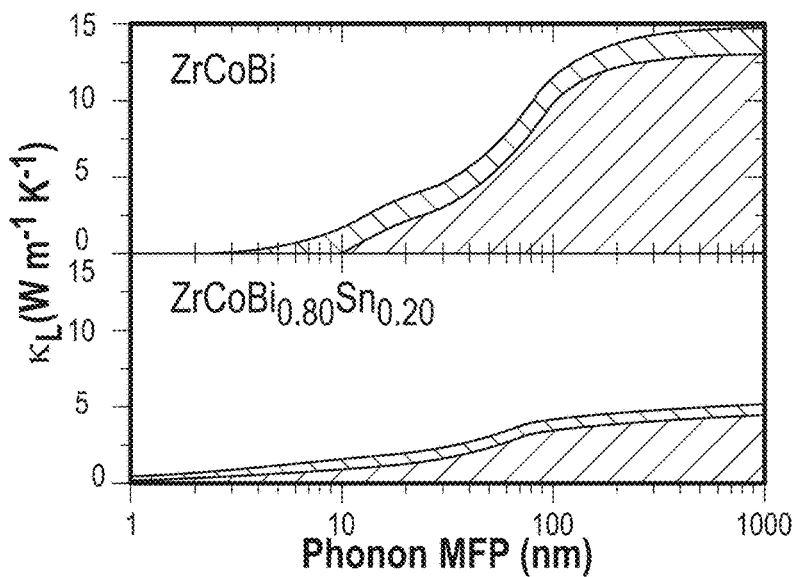

A reduced grain size after Sn doping has also been observed and the average grain size is ~250 nm for $ZrCoBi_{0.80}Sn_{0.20}$ (e.g., as shown in FIGS. 8A-8F). The reduction in grain size should be attributed to the suppressed grain growth during the hot-pressing process. Such a reduced average grain size is beneficial for inducing additional grain boundary scattering to decrease the lattice thermal conductivity. However, as shown in FIG. 7D, the phonon with mean-free-path lower than 100 nm dominates the lattice thermal conductivity. Therefore, compared to the alloying scattering, the grain boundary scattering plays a secondary role in reducing the thermal conductivity of ZrCoBi based materials.

Figure 7E:
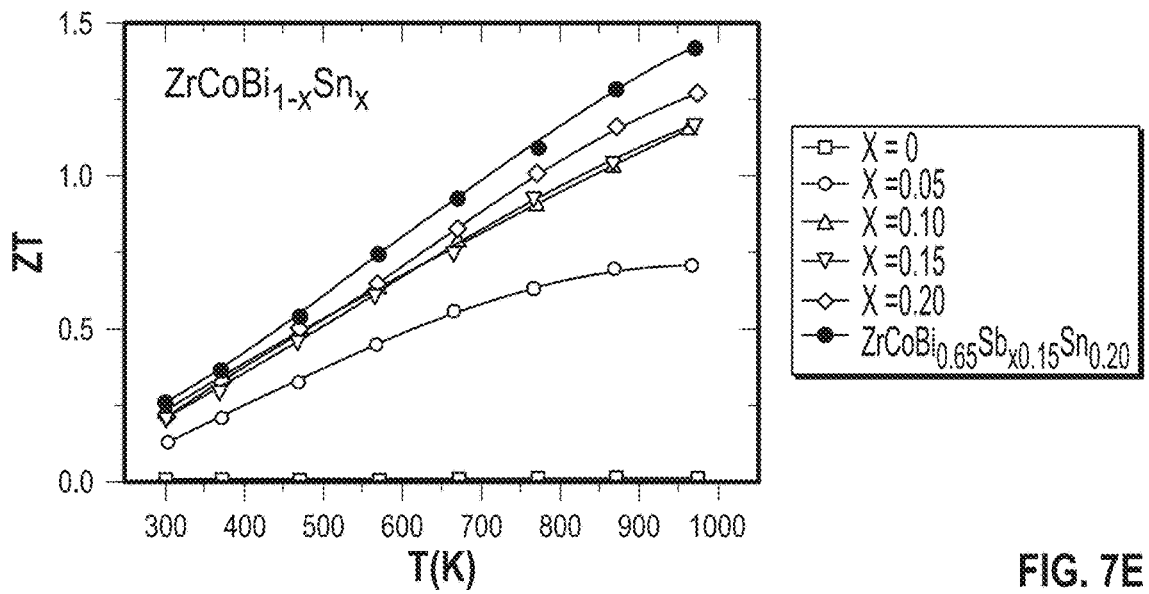
Figure 7F:
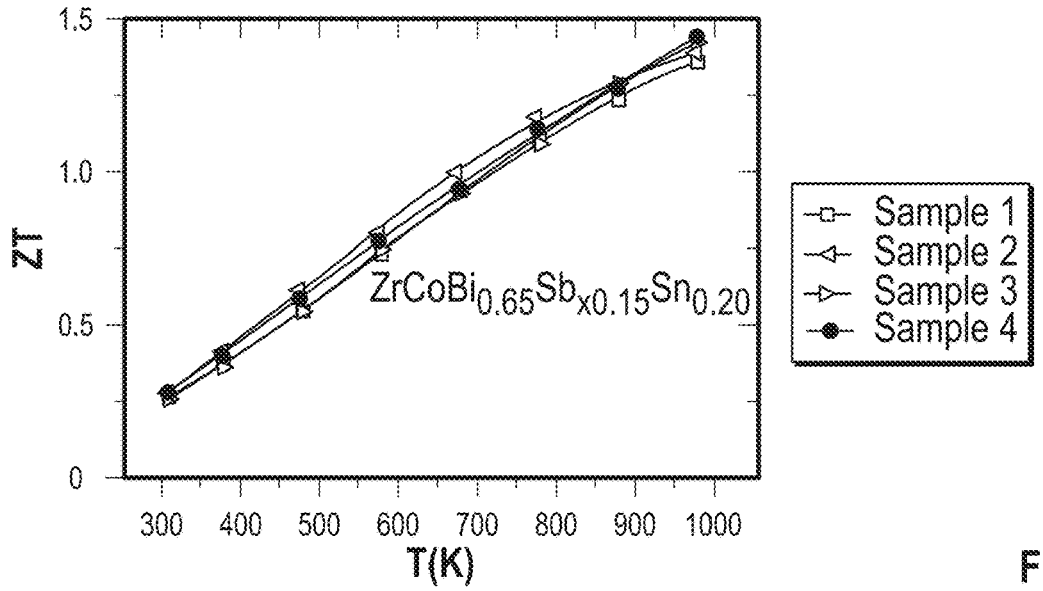
Figure 8A:
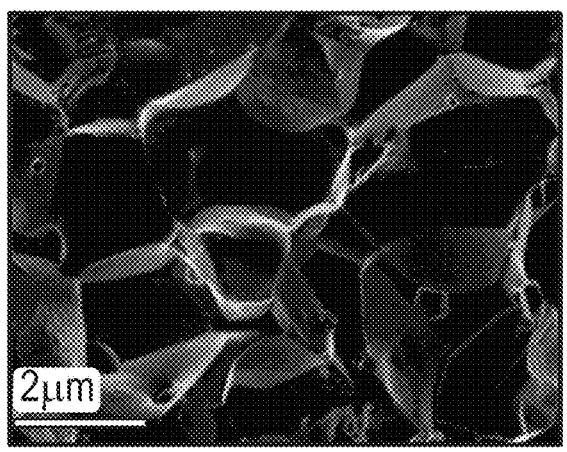
FIGS. 8A-8F illustrate SEM images of the hot-pressed $ZrCoBi_{1-x-y}Sb_ySn_x$ with different doping and alloying concentration. Undoped ZrCoBi is shown in FIG. 8A, $ZrCoBi_{0.95}Sn_{0.05}$ is shown in FIG. 8B, $ZrCoBi_{0.90}Sn_{0.10}$ is shown in FIG. 8C, $ZrCoBi_{0.85}Sn_{0.15}$ is shown in FIG. 8D, $ZrCoBi_{0.80}Sn_{0.20}$ is shown in FIG. 8E, and $ZrCoBi_{0.65}Sb_{0.15}Sn_{0.20}$ is shown in FIG. 8F. The SEM image of $ZrCoBi_{0.65}Sb_{0.15}Sn_{0.20}$ in FIG. 8F is taken from the sample after repeatedly measurement and ten times of thermal shock cycles form room temperature to 973 K.
Figure 8B:
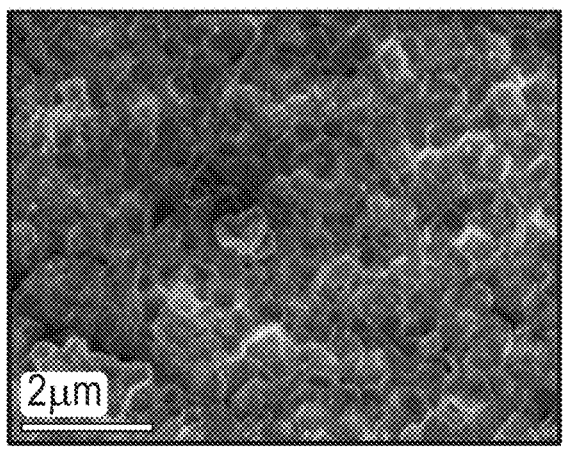
Figure 8C:
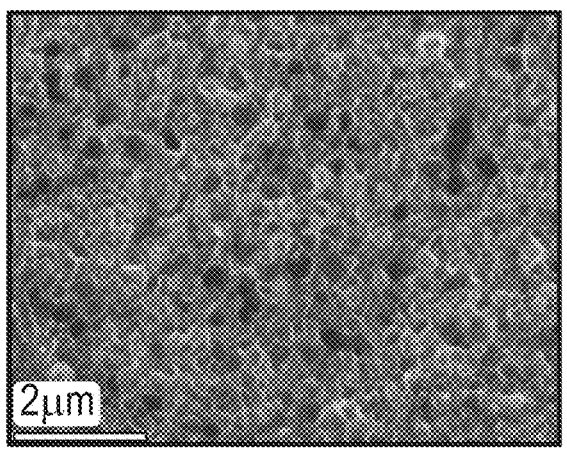
Figure 8D:
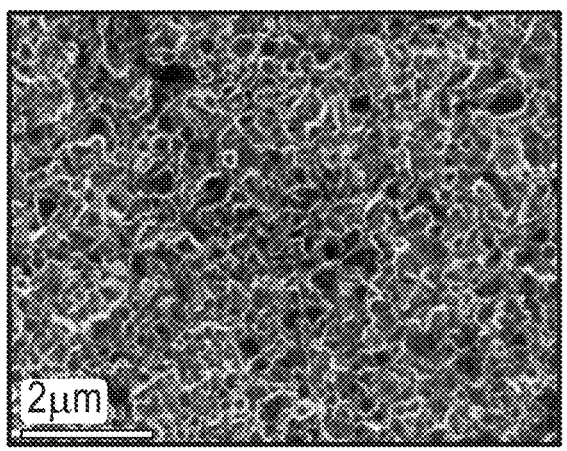
Figure 8E:
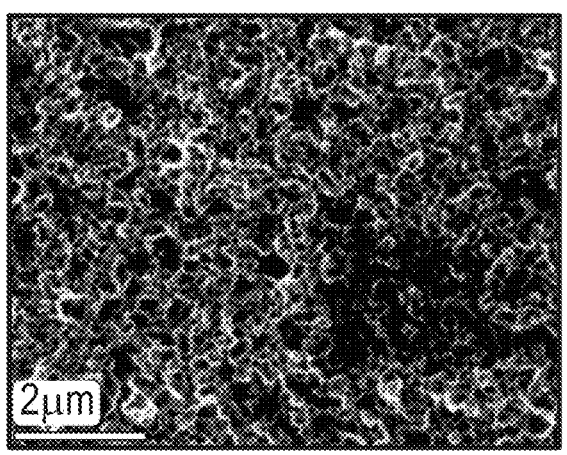
Figure 8F:
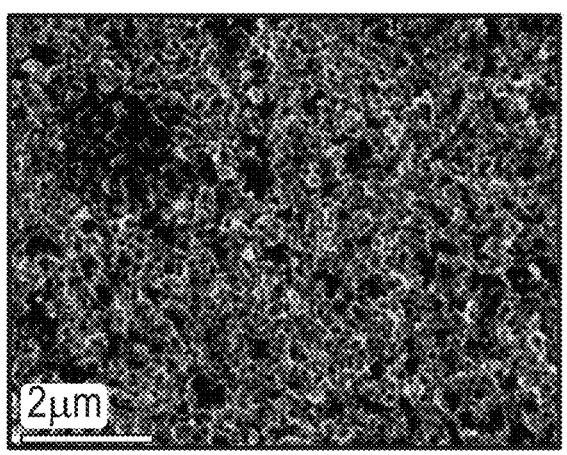
Figure 9:
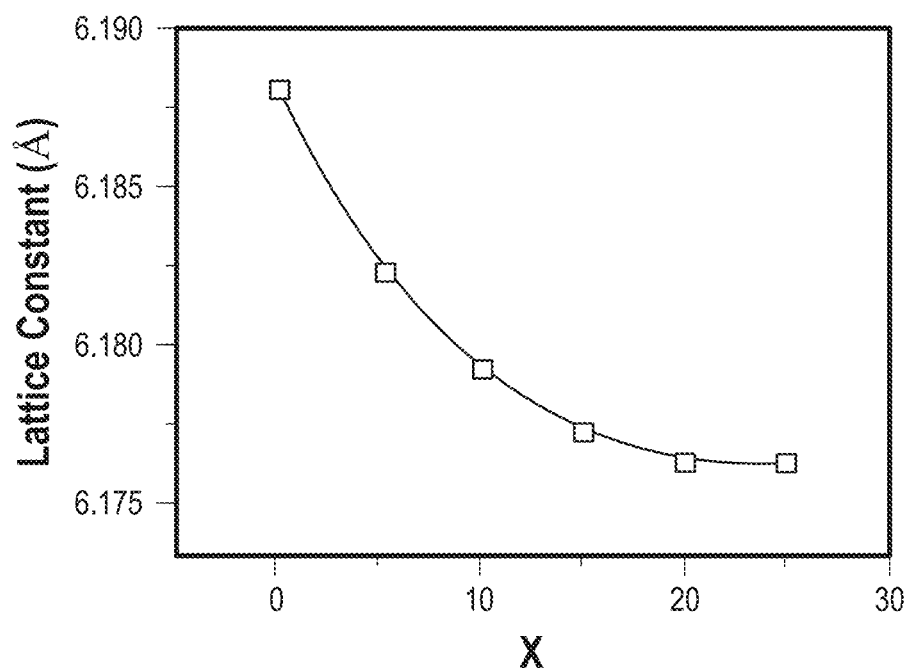
FIG. 9 illustrates the lattice constants of $ZrCoBi_{1-x}Sn_x$.
Figure 10A:
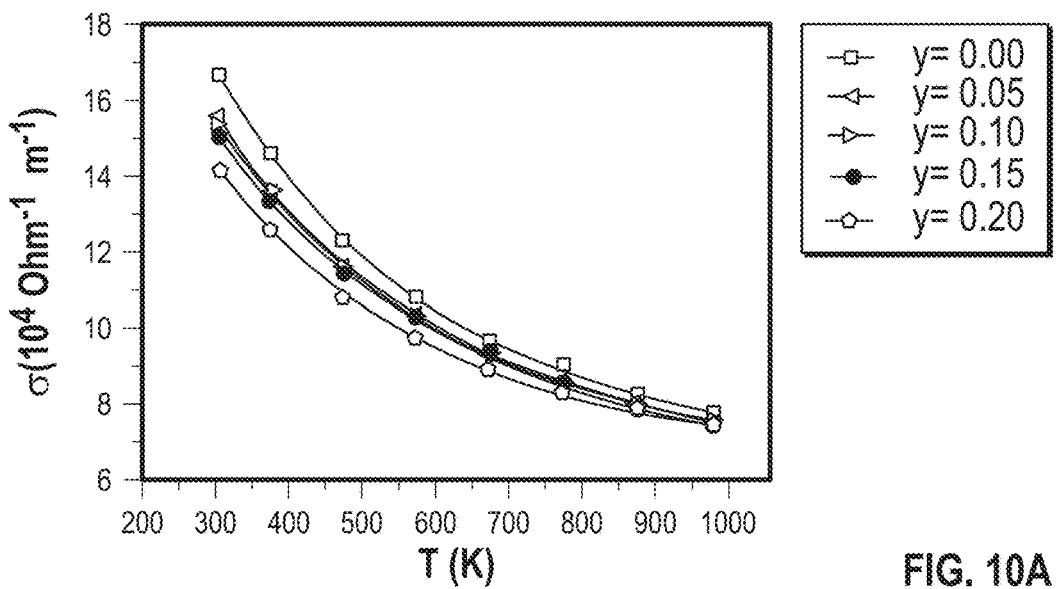
FIGS. 10A-10F illustrate the thermoelectric performance of $ZrCoBi_{0.80-y}Sb_ySn_{0.20}$ (where y=0, 0.05, 0.10, 0.15, 0.20). The electrical conductivity is shown in FIG. 10A, the Seebeck coefficient is shown in FIG. 10B, the power factor is shown in FIG. 10C, the total thermal conductivity is shown in FIG. 10D, the summation of lattice and bipolar thermal conductivity is shown in FIG. 10E, and ZT is shown in FIG. 10F.
Figure 10B:
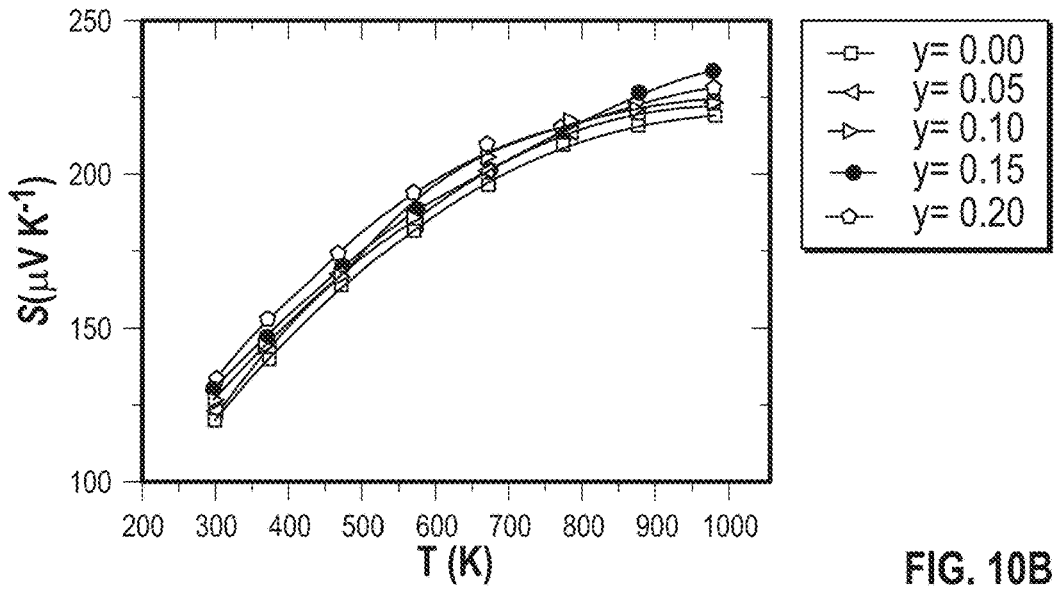
Figure 10C:
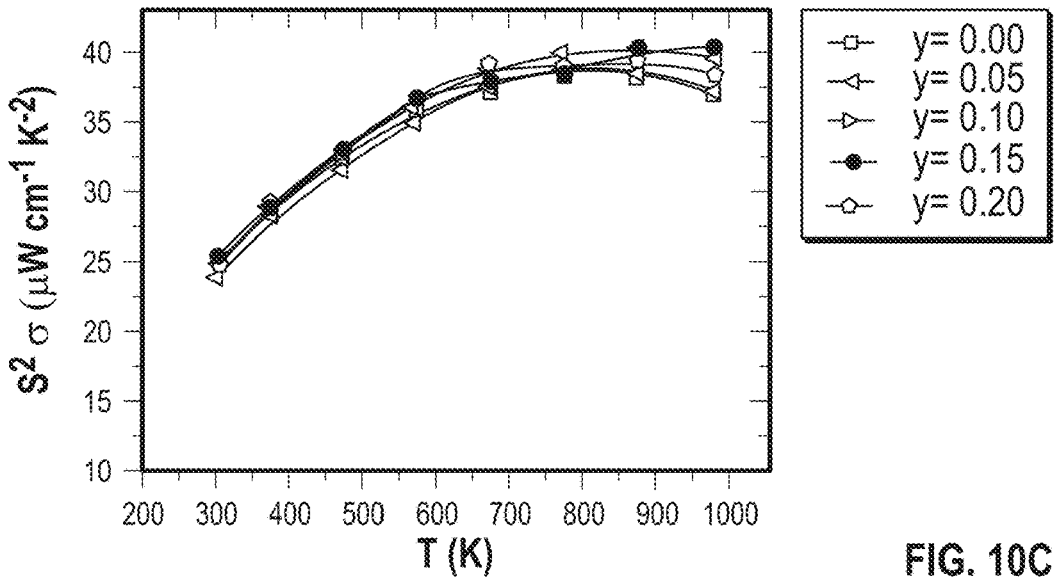
Figure 10D:
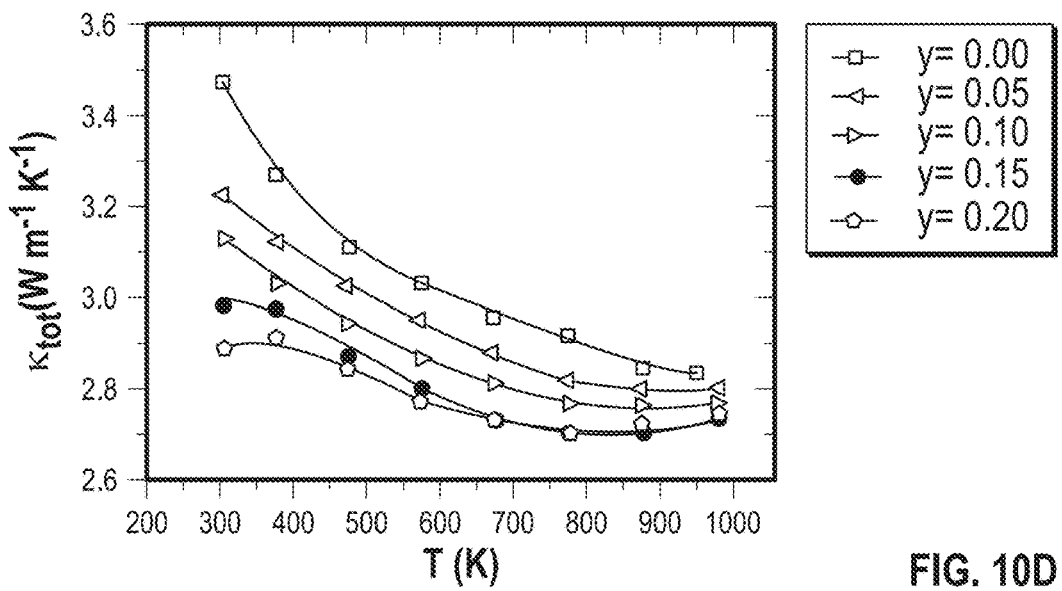
Figure 10E:
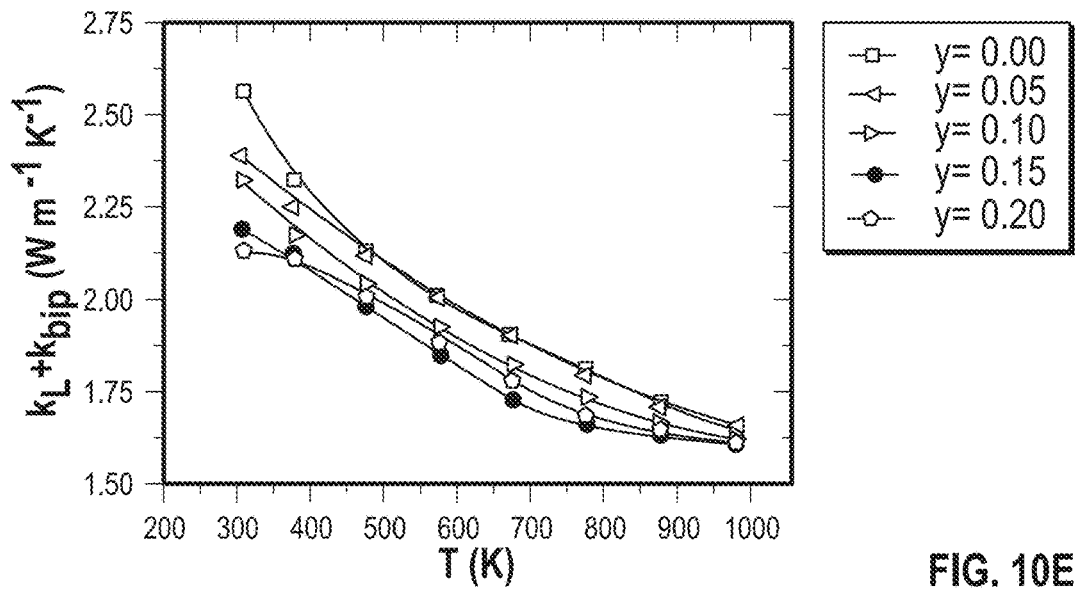
Figure 10F:
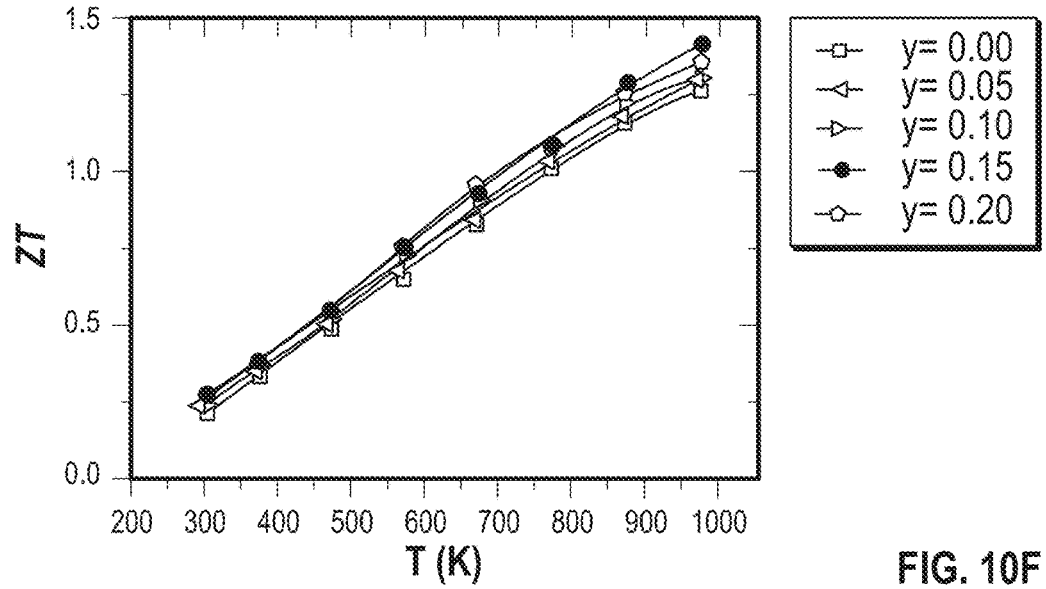
Figure 11A:
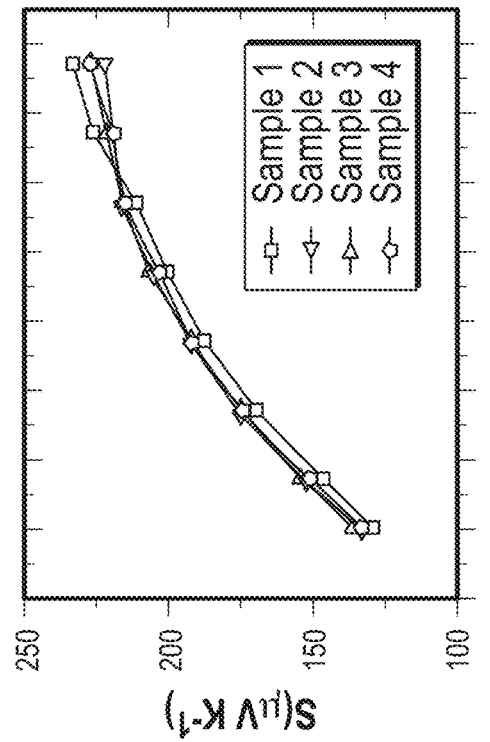
FIGS. 11A-11D illustrate the reproducibility of the thermoelectric performance of $ZrCoBi_{0.65}Sb_{0.15}Sn_{0.20}$. Electrical conductivity is shown in FIG. 11A, the Seebeck coefficient is shown in FIG. 11B, the total thermal conductivity is shown in FIG. 11C, and ZT is shown in FIG. 11D for the four samples.
Figure 11B:
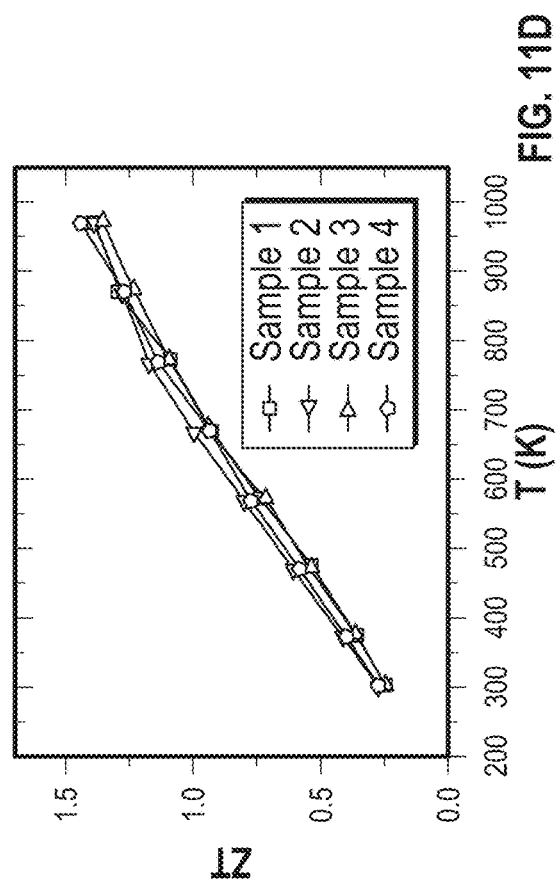
Figure 11C:
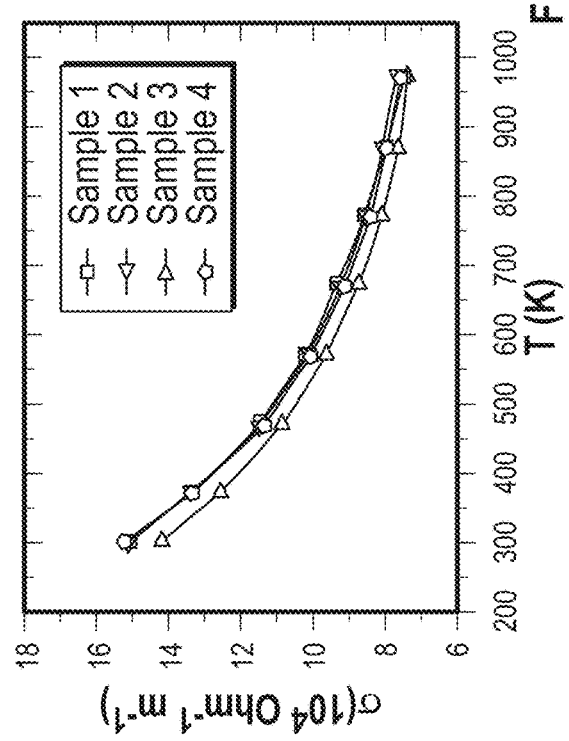
Figure 11D:
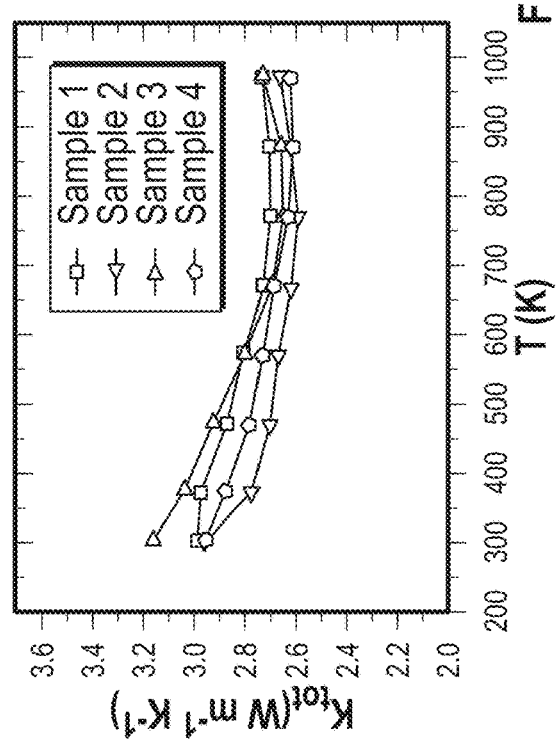

Owing to the simultaneously enhanced power factor and reduced thermal conductivity via Sn doping, ZT can be noticeably improved in $ZrCoBi_{1-x}Sn_x$ (e.g., as shown in FIG. 7E). A high peak ZT of ~1.3 at 973 K can be achieved by $ZrCoBi_{0.80}Sn_{0.20}$. However, according to the composition-dependent lattice constant of $ZrCoBi_{1-x}Sn_x$ (e.g., as shown in FIG. 9), the maximum solubility of Sn at Bi site of ZrCoBi is ~20%. Therefore, in order to further minimize the lattice thermal conductivity, Sb alloying at the Bi site can be conducted. In some embodiments, the Sb alloying can be based upon a composition of $ZrCoBi_{0.80}Sn_{0.20}$, though alloying Sb with the $ZrCoBi_{1-x}Sn_x$ can be conducted at other Sn concentrations as well. As shown in the FIGS. 10D and 10E, a noticeable reduction in thermal conductivity can be successfully achieved by Sb alloying. The room temperature lattice thermal conductivity is ~2.6 W $m^{-1}$ $K^{-1}$ for $ZrCoBi_{0.80}Sn_{0.20}$ and it is ~2.2 W $m^{-1}$ $K^{-1}$ for $ZrCoBi_{0.65}Sb_{0.15}Sn_{0.20}$, which represents an additional reduction of approximately 15%. The power factors of $ZrCoBi_{0.80-y}Sb_ySn_{0.20}$ remain quite similar (as shown in FIG. 10C). Collectively, an even higher peak ZT of ~1.4 at 973 K is achieved in $ZrCoBi_{0.65}Sb_{0.15}Sn_{0.20}$. To demonstrate the reproducibility of the high performance of $ZrCoBi_{0.65}Sb_{0.15}Sn_{0.20}$, four samples were prepared from different batches and quite comparable results were obtained, as shown in FIG. 7F. Detailed thermoelectric properties of the four samples are shown in FIG. 11.

In addition to the p-type materials, n-type materials and thermoelectric modules employing the p-type and n-type materials are also disclosed herein. In some embodiments, a ZrCoBi-based n-type half-Heusler material can have a formula:

$ZrCoNi_xBi_{1-x-y}Sb_y$, where x can vary between 0.01 and 0.25, and y can vary between 0 and 0.3. In some embodiments, x is 0.1 and y is 0.15. The material can have an average dimensionless figure-of-merit (ZT) greater than or equal to about 0.65 as calculated by an integration method for temperatures between 300 and 973 K, and/or a peak dimensionless figure-of-merit (ZT) of greater than or equal to about 1.0 at 973 K. A thermoelectric conversion efficiency of the material can be greater than or equal to about 7% at a temperature difference of about 650 K.

In some embodiments, a ZrCoBi-based n-type half-Heusler material can have a formula:

$Zr_{1-z}CoNi_xBi_{1-x-y}Sb_yA_z$, where x can vary between 0.01 and 0.25, y can vary between 0 and 0.3, z can vary between 1 and about 0.2, and wherein A can represent one or more of Ti, Hf, V, Nb, Ta, or any combination thereof. In some embodiments, x is 0.1 and y is 0.15 (e.g., where z is 0).

Solid-state energy conversion from heat to electricity and vice versa can be realized by a thermoelectric module employing a thermoelectric material. The conversion efficiency of the module can be governed by the Carnot efficiency and by the material's figure-of-merit (ZT). Generally, the thermoelectric module can be formed from multiple pairs of n-type and p-type legs that are connected thermally in parallel and electrically in series. To achieve a high energy conversion efficiency, high thermoelectric performance for both types of legs is highly desired. In addition, in order to minimize the thermal stress that originates from the mismatch of thermal expansion coefficients between n-type and p-type legs, it can be useful to adopt the same base compound for both types of legs.

Figure 12:
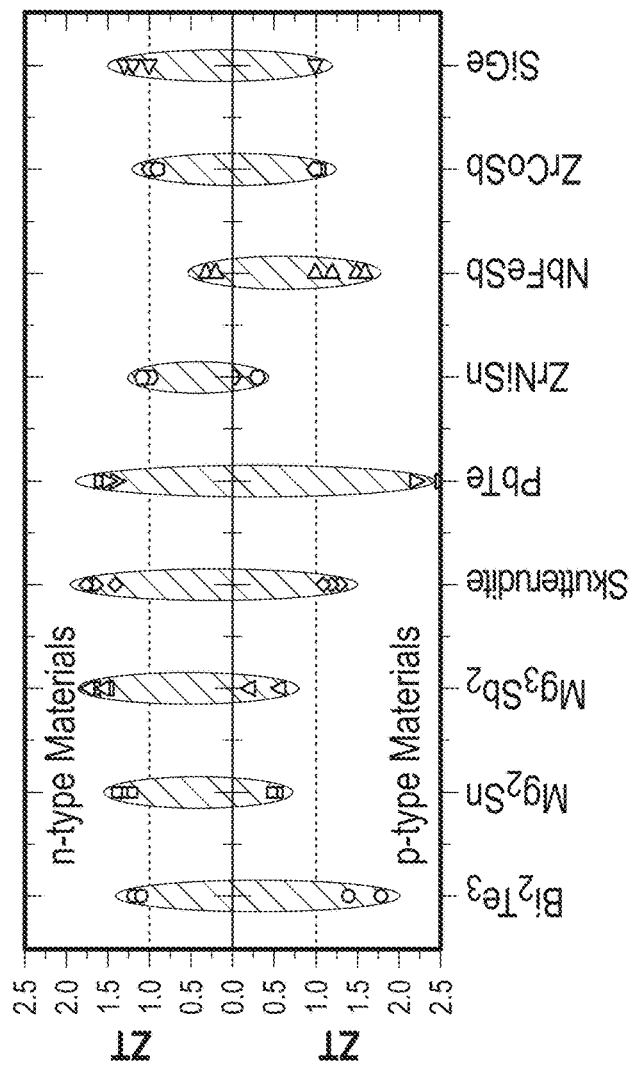
FIG. 12 illustrates the dimensionless figure of merit for a series of thermoelectric materials (also including their solid solutions) with n-type and p-type conduction.

However, there are quite a few materials that can only be synthesized as one of the types, e.g., MgAgSb, SnTe, GeTe, $Zn_4Sb_3$, etc. This can be attributed to the presence of native defects that pin the Fermi level to either the conduction or the valence band, and therefore the materials show persistent n-type or p-type conduction. Among the materials for which the ambipolar doping can be realized, most show high thermoelectric performance (e.g., having a ZT>1) in only one of the types: e.g., $Mg_2Sn$, $Mg_3Sb_2$, ZrNiSn, and NbFeSb-based compounds. Even for other thermoelectric materials, e.g., $Bi_2Te_3$-based materials, lead chalcogenides, skutterudites, and SiGe, in which high thermoelectric performance can be achieved in both types, the thermoelectric performance is often asymmetrical as shown in FIG. 12. The specific reason for such an asymmetry varies among the different compounds. It could be attributed to the difference in the electronic structures between the conduction and valence bands, e.g., density of state effective mass ($m^*_d$), inertial effective mass ($m_I$), and band degeneracy (N). It can also be ascribed to the difference in carrier mobility due to the different degree of carrier scattering. In addition, disparity in the dopability, e.g., difficulty in identifying an efficient dopant for one of the types, can lead to asymmetrical thermoelectric performance as well.

Asymmetrical thermoelectric performance of previously reported materials has been merely viewed as an observation, while a more general relationship between the asymmetry and intrinsic material parameters is seldom discussed. Generally, the lattice thermal conductivity of p-type and n-type compositions of a given material system are similar, while the electronic transport properties of the materials can be different. The electronic contributions to thermoelectric performance can be given by a power factor, which can be modified and improved by chemical doping. The thermoelectric performance of a given compound can be estimated by the dimensionless material quality factor B:

$$B = 5.745 \times 10^{-6} \frac{\mu(m_d^*)^{3/2}}{\kappa_L} T^{5/2} \qquad (3)$$

where μ is the carrier mobility. This formula captures the essential aspect that heavy effective mass (for the thermopower), high carrier mobility (which typically accompanies light mass, and is needed for conductivity), and low lattice thermal conductivity are all useful for thermoelectric performance. When asymmetrical thermoelectric performance is observed for a certain compound, this asymmetry (n-type versus p-type) can then be estimated as:

$$\frac{B_n}{B_p} = \frac{5.745 \times 10^{-6} \frac{\mu_n(m_{d,n}^*)^{3/2}}{\kappa_{L,n}} T_n^{5/2}}{5.745 \times 10^{-6} \frac{\mu_p(m_{d,p}^*)^{3/2}}{\kappa_{L,p}} T_p^{5/2}} \approx \frac{\mu_n(m_{d,n}^*)^{3/2}}{\mu_p(m_{d,p}^*)^{3/2}} = A \qquad (4)$$

where n denotes the n-type and p denotes the p-type. In general, $\kappa_L$ and the temperature for peak ZT are considered similar for both n-type and p-types of the compound. A is the dimensionless n-type to p-type weighted mobility ratio. The density of state effective mass is related to the band effective mass ($m_b$) via the relation of $m^*_d = N^{2/3} m_b$. In addition, in the case when carriers are mainly scattered by acoustic phonons, the carrier mobility depends on the band effective mass as well as the inertial effective mass according to the relation of $\mu \propto m_I^{-1} m_b^{-3/2}$. For an isotropic single parabolic band system these masses are identical, and in the general case, they are decoupled, and are also dependent on doping and temperature. Eq. (4) can thus be rewritten as $$A \approx \frac{N_n m_{I,p}}{N_p m_{I,n}} \qquad (5)$$

Figure 13B:
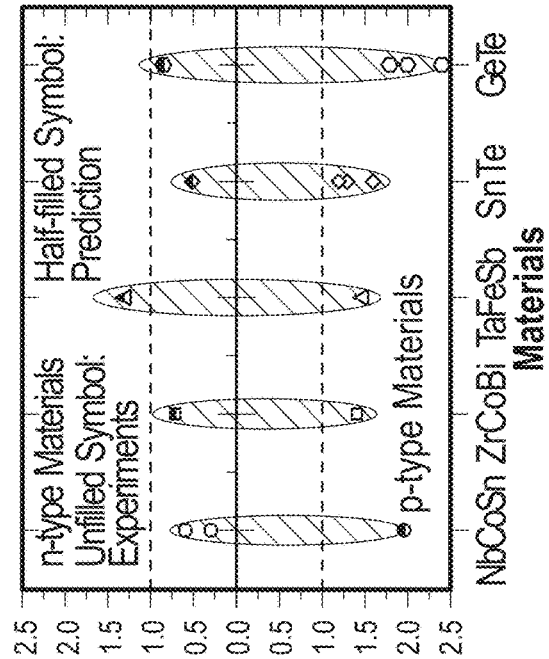
FIGS. 13A-13B illustrate the relationship between the asymmetrical thermoelectric performance and weighted mobility ratio, where the relationship between the ZT ratio (n-type versus p-type) and weighted mobility ratio is shown in FIG. 13A, and the predicted thermoelectric performance for a number of materials is shown in FIG. 13B.
Figure 13A:
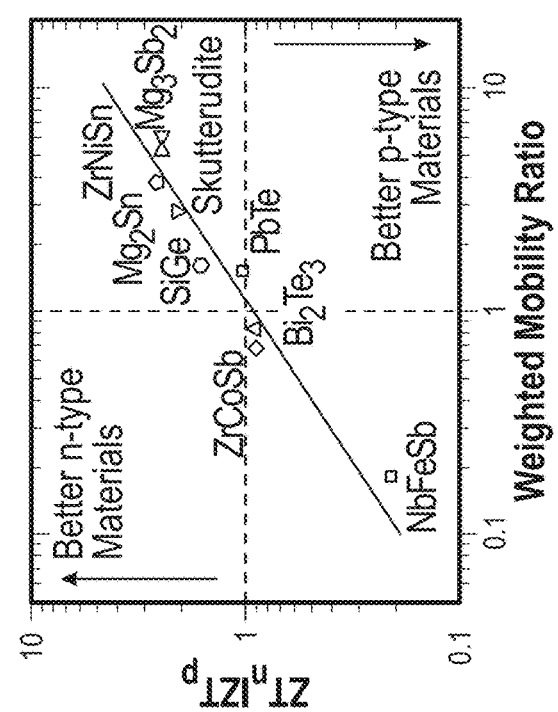

It can be understood from Eq. (5) that a large band degeneracy and a low inertial effective mass can be beneficial for high thermoelectric performance. As a result, the difference in the band degeneracy and inertial effective mass between the conduction and valence bands will lead to a noticeable asymmetrical thermoelectric performance. According to Eq. (4), the asymmetrical thermoelectric performance can be estimated by the weighted mobility ratio. The weighted mobility ratio for different materials could in principle be calculated by Eq. (4). For estimation of A, this can be done at similar electron and hole carrier concentration. The relationship between the n-type to p-type ZT ratio ($ZT_n/ZT_p$) and the n-type to p-type weighted mobility ratio is shown in FIG. 13A. As illustrated, there is a general trend that $ZT_n/ZT_p$ increases with the weighted mobility ratio, i.e., $\log(ZT_n/ZT_p)=C_1 \log(A)+C_2$, where $C_1$ and $C_2$ are fitted as 0.69 and −0.039, respectively. It should be noted that the experimentally obtained relation between $\log(ZT_n/ZT_p)$ and $\log(A)$ is in a reasonably good agreement with the theoretical calculations as described in the Examples herein. Specifically, when the weighted mobility ratio is larger than unity, the n-type material will outperform the p-type counterpart ($ZT_n/ZT_p>1$). Conversely, when the weighted mobility ratio is smaller than unity, the p-type compound will demonstrate better thermoelectric performance ($ZT_n/ZT_p<1$). When the thermoelectric performance for one type of a material has been experimentally studied, while the other type has not yet been investigated, it may be possible to predict the ZT by using the identified relationship between the asymmetry and weighted mobility ratio. In this case, since the carrier mobility for the unreported type cannot be obtained, Eq. (5) can be adopted to estimate the weighted mobility ratio since it only involves the material's basic parameters that can be determined by calculation. However, it should be noted that Eq. (5) is simplified by assuming that the carrier scattering is similar for electrons (n-type specimen) and holes (p-type specimen). Therefore, the estimated weighted mobility ratio by Eq. (5) could be different from the value experimentally determined by Eq. (4). As an example, the thermoelectric performance for several materials are predicted as shown in FIG. 13B. The predictions indicate that reasonably high ZT can possibly be achieved in n-type SnTe, n-type GeTe, and n-type ZrCoBi. Additionally, n-type TaFeSb and p-type NbCoSn are possible candidates for thermoelectric performance. However, SnTe and GeTe have been proven as very persistent p-type materials. Based on this data, this disclosure focusses on the thermoelectric properties of n-type ZrCoBi-based materials.

Figure 14B:
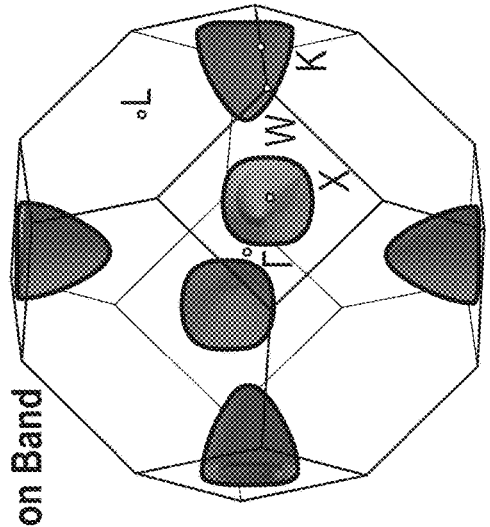
FIGS. 14A-14D illustrate the calculated electronic structure of ZrCoBi, where the band structure is shown in FIG. 14A, the calculated inertial effective mass for n- and p-type ZrCoBi at 1000 K is shown in FIG. 14B, the valence band carrier pockets are shown in FIG. 14C, and the conduction band carrier pockets are shown in FIG. 14D.

In order to investigate the electronic structure of ZrCoBi materials, theoretical calculations of the electronic structure of ZrCoBi provide preliminary insight into its thermoelectric performance. The calculated band structure of ZrCoBi is shown in FIG. 14A. The valence bands show practically degenerate maxima at Γ and ⌊, which is a band convergence. It can be noted that there are strong splittings in the bands as one moves away from Γ. These include the splitting into a heavy hole and light hole band along Γ-X, and an additional splitting of the upper heavy hole band along Γ-⌊. The latter splitting is forbidden without the combination of spin-orbit and non-centrosymmetry, which arises due to the difference between Co, Zr, and the heavy p-electron element, Bi, breaking parity symmetry. Although Γ has the full cubic symmetry, and the inverse effective mass tensor of a cubic material is isotropic, the bands at Γ are evidently highly anisotropic. This anisotropy with different curvatures in different bands and directions at Γ provides a mechanism for decoupling the electrical conductivity and the Seebeck coefficient, in particular with the high curvature areas leading to high electrical conductivity. Even more strikingly, at the other pocket ⌊ there is a pair of 2-fold degenerate bands separated by 0.06 eV. Both are relevant for the thermoelectric transport due to this small splitting. The upper band is seen to be very strongly spin-split from ⌊ to W and somewhat more weakly so along ⌊-Γ. This splitting would be forbidden by the combination of parity and time reversal in a centrosymmetric case. This is important because, in addition to the anisotropy allowed in a parabolic system around the ⌊ point (i.e., a transverse and a longitudinal mass, which can be different, as in GeTe), there is an additional separation into a light and heavy band due to spin-orbit. This is highly favorable as it again decouples Seebeck coefficient and electrical conductivity. In contrast, the conduction band structure is apparently simpler, although it also shows strong influence of spin-orbit. This band shows a significant spin-splitting along X-W, but not X-Γ. This Dresselhaus spin-splitting shifts the conduction band minimum away from X perpendicular to the X-Γ line, and importantly can also decouple the Seebeck coefficient and electrical conductivity, although the decoupling is less pronounced than in the valence bands.

Figure 14D:
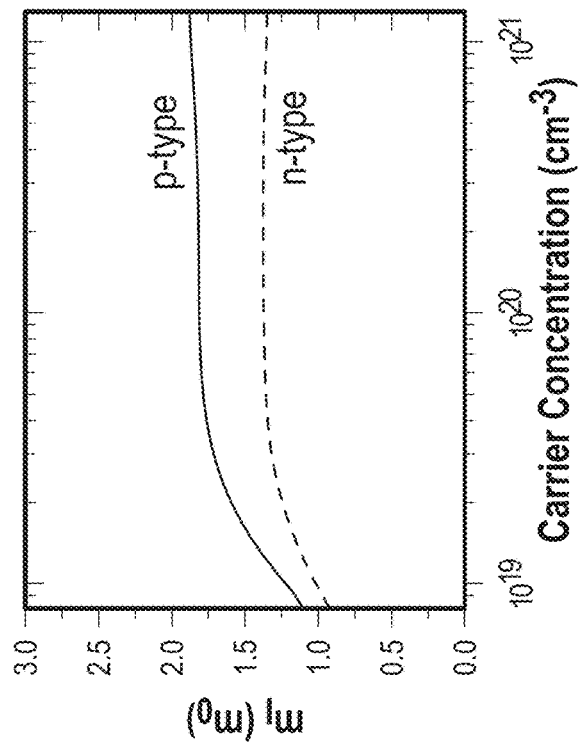
Figure 14A:
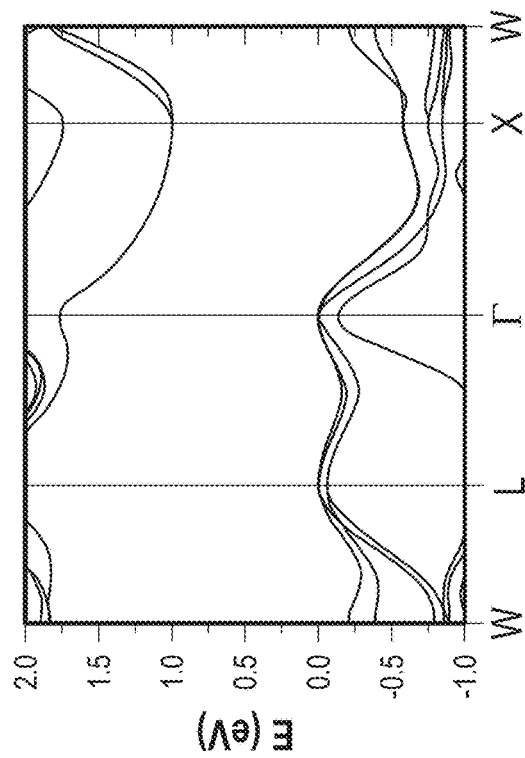
Figure 14C:
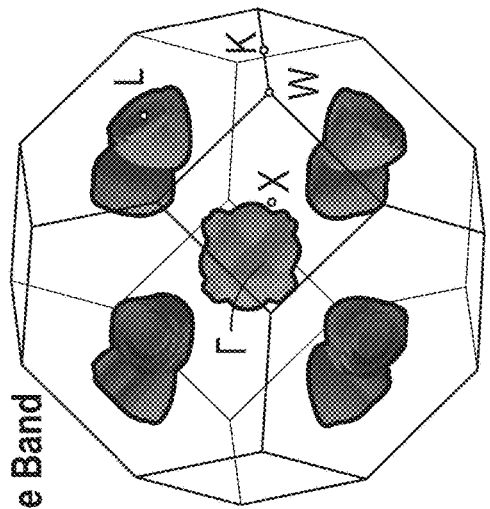

Visualization of the carrier pockets 0.1 eV from the band edges for the p-type and n-type ZrCoBi are shown in FIG. 14C and FIG. 14D, respectively. The band degeneracy (N) is 10 for the p-type ZrCoBi but only 3 for its n-type counterpart. In addition, the calculated inertial effective mass is shown as a function of carrier concentration for n-type and p-type ZrCoBi in FIG. 14B. It should be noted that the inertial effective mass ($m_I$) is very similar for n-type and p-type ZrCoBi. As a result, the value of $N/m_I$ is ~5.3 $m_0^{-1}$ for p-type ZrCoBi and only ~2.2 $m_0^{-1}$ for its n-type counterpart, which corresponds to a n-type to p-type weighted mobility ratio of ~0.42. By using the experimentally determined thermoelectric performance of p-type ZrCoBi-based materials (i.e., peak ZT of ~1.4) and the weighted mobility ratio of ~0.42, the predicted ZT for n-type ZrCoBi is about ~0.71 (FIG. 2B). In other words, despite the asymmetrical thermoelectric performance of ZrCoBi (i.e., the p-type outperforming the n-type), reasonably high thermoelectric performance could possibly be achieved in the n-type ZrCoBi.

Figure 15B:
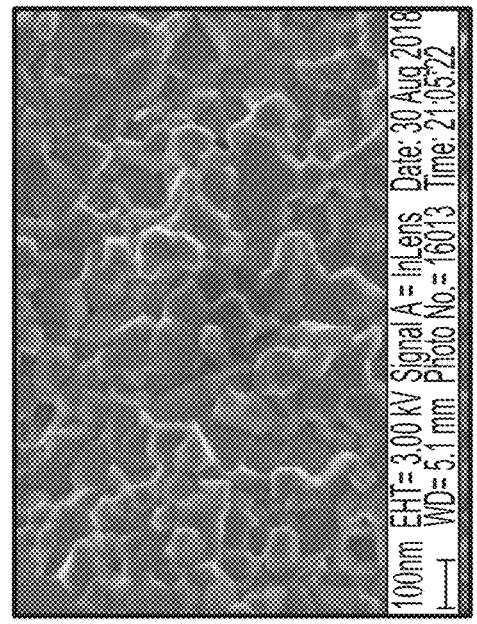
FIGS. 15A-15B illustrate the phase composition of n-type ZrCoBi-based half-Heuslers, where the X-ray diffraction patterns of the prepared $ZrCo_{1-x}Ni_xBi$ (x=0.05, 0.10, 0.15, 0.20, and 0.25) are shown in FIG. 15A, and the $ZrCo_{0.9}Ni_{0.1}Bi_{1-y}Sb_y$ (y=0.10, 0.15, 0.20, and 0.30) are shown in FIG. 15B.
Figure 16B:
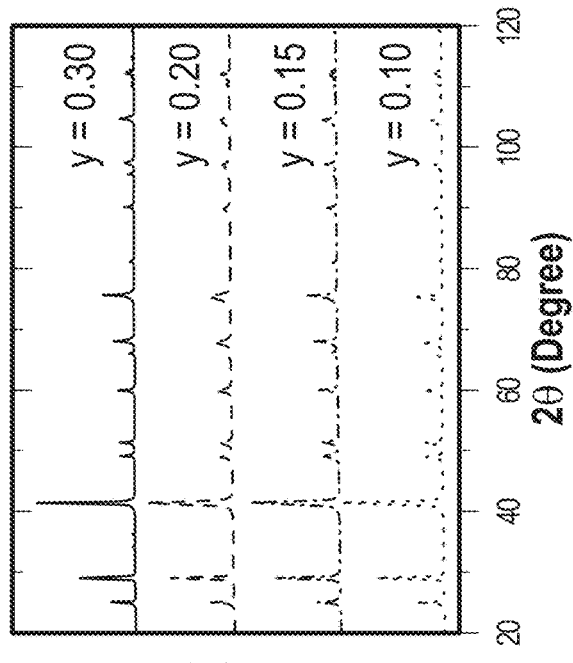
FIGS. 16A-16B illustrate the microstructures of n-type ZrCoBi-based half Heuslers.
Figure 15A:
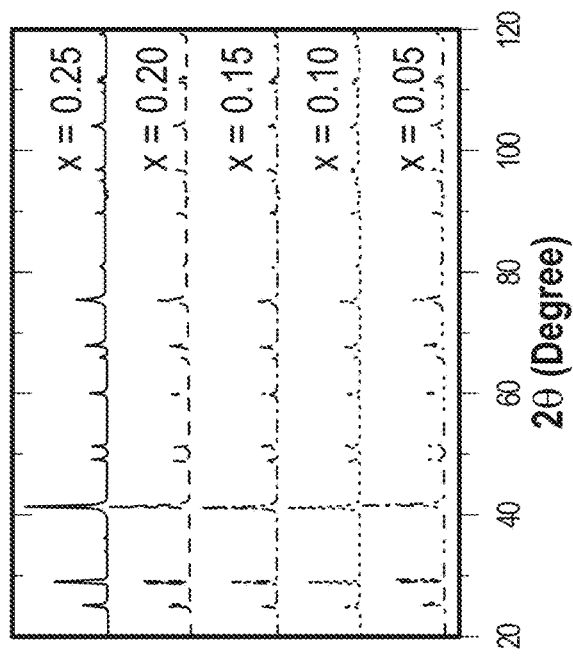
Figure 16A:
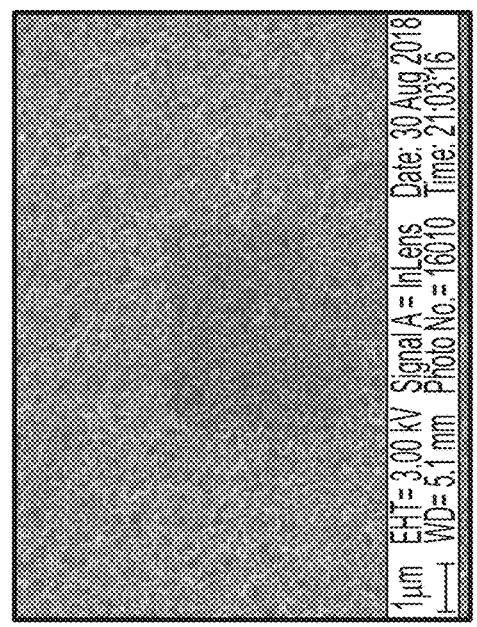
Figure 17A:
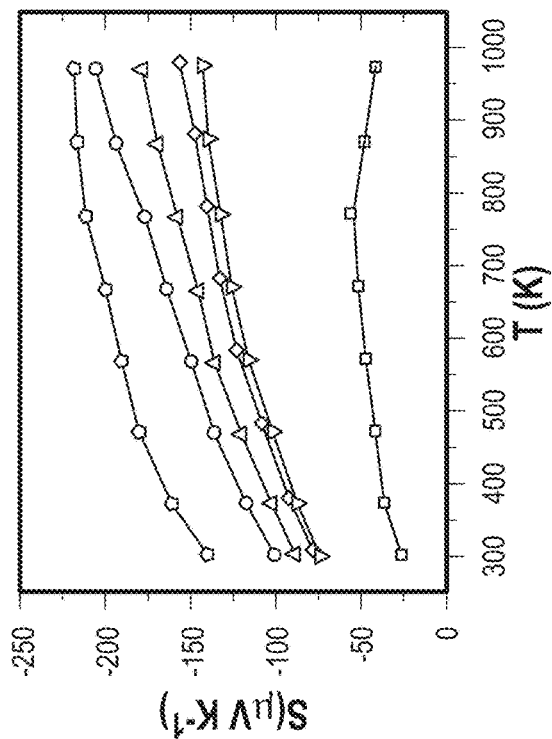
FIGS. 17A-17D illustrate the electronic properties for the n-type ZrCoBi-based half-Heuslers, where
Figure 17B:
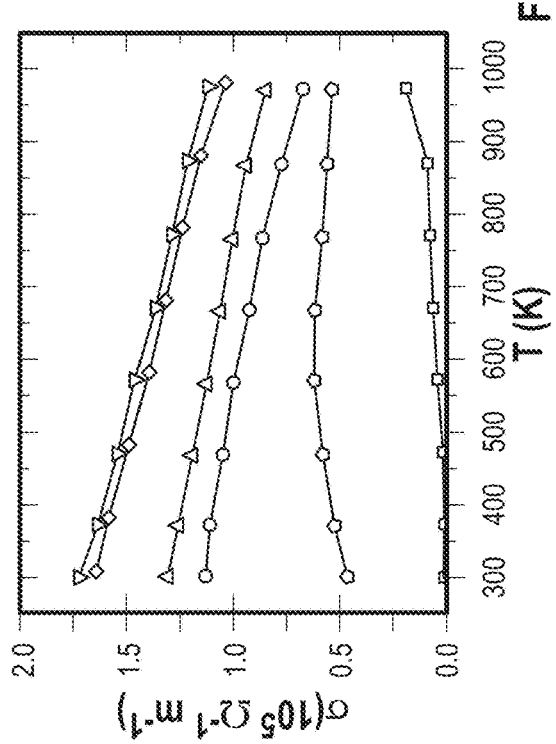
Figure 17C:
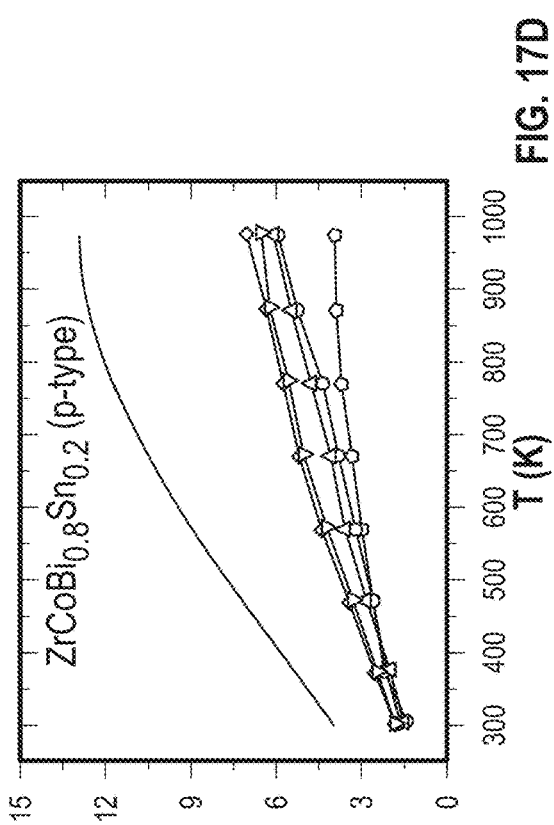
Figure 17D:
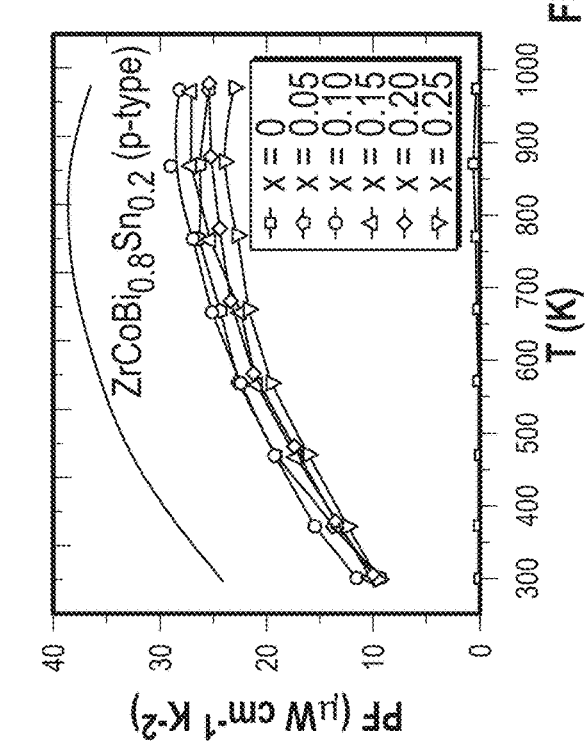

In order to test the electronic properties of the materials, the n-type Ni-doped ZrCoBi-based materials were prepared by the ball-milling and hot-pressing method, as described in more details in the examples. All the samples were single-phase (e.g., as shown in FIGS. 15A-15B) and highly dense (e.g., as shown in FIGS. 16A-16B). The measured electronic properties of the n-type ZrCoBi-based half-Heuslers are shown in FIGS. 17A-17D. The undoped ZrCoBi shows a low electrical conductivity and after Ni-doping at the Co site the electrical conductivity is substantially improved (e.g., asZrCoBi$_{0.80}$Sn$_{0.20}$ shown in FIG. 17A). Such an enhancement should be mainly attributed to the increased Hall carrier concentration. As shown in FIG. 18, the carrier concentration increases monotonically with the Ni concentration. This indicates that Ni is an efficient dopant for supplying electrons to ZrCoBi, similar to the case of ZrCoSb. Accordingly, the Seebeck coefficient of ZrCo$_{1-x}$Ni$_x$Bi decreases with the increase of Ni concentration (e.g., as shown in FIG. 17B), with the exception of the undoped ZrCoBi. By improving the carrier concentration, a reasonably high peak power factor ($S^2\sigma$) of ~27 µW cm$^{-1}$ K$^{-2}$ can be realized by ZrCo$_{0.9}$Ni$_{0.1}$Bi (e.g., as shown in FIG. 17C). The power factor of p-type ZrCoBi$_{0.8}$Sn$_{0.2}$ is also plotted for comparison and it is noticeably higher than that of the n-type specimens over the whole temperature range. The average power factor between 300 and 973 K can be calculated by the integration method and it is ~20.8 µW cm$^{-1}$ K$^{-2}$ for n-type ZrCo$_{0.9}$Ni$_{0.1}$Bi and as high as ~33.6 µW cm$^{-1}$ K$^{-2}$ for p-type ZrCoBi$_{0.8}$Sn$_{0.2}$. Such a marked difference in the power factor between the n-type and p-type ZrCoBi-based materials should be mainly ascribed to the difference in band degeneracy and pocket shape between the conduction and valence bands. Therefore, despite the similar inertial effective mass between the n- and p-type ZrCoBi, the density of state effective masses of p-type ZrCoBi-based materials are notably higher than those of their n-type counterparts (e.g., as shown in FIG. 19A). More importantly, since the inertial effective masses are comparable between the n-type and p-type ZrCoBi (e.g., as shown in FIG. 14B), the carrier mobility of the p-type ZrCoBi-based materials remains similar to that of their n-type counterparts (e.g., as shown in FIG. 19B). To further reveal the effect of electronic structure on the thermoelectric properties, the product of carrier concentration and the square of Seebeck coefficient ($S^2n$) is calculated for ZrCoBi-based materials as shown in FIG. 17D. It can be clearly observed that the $S^2n$ value of the p-type $ZrCoBi_{0.8}Sn_{0.2}$ is substantially higher than that of its n-type counterparts over the whole temperature range.

Figure 20A:
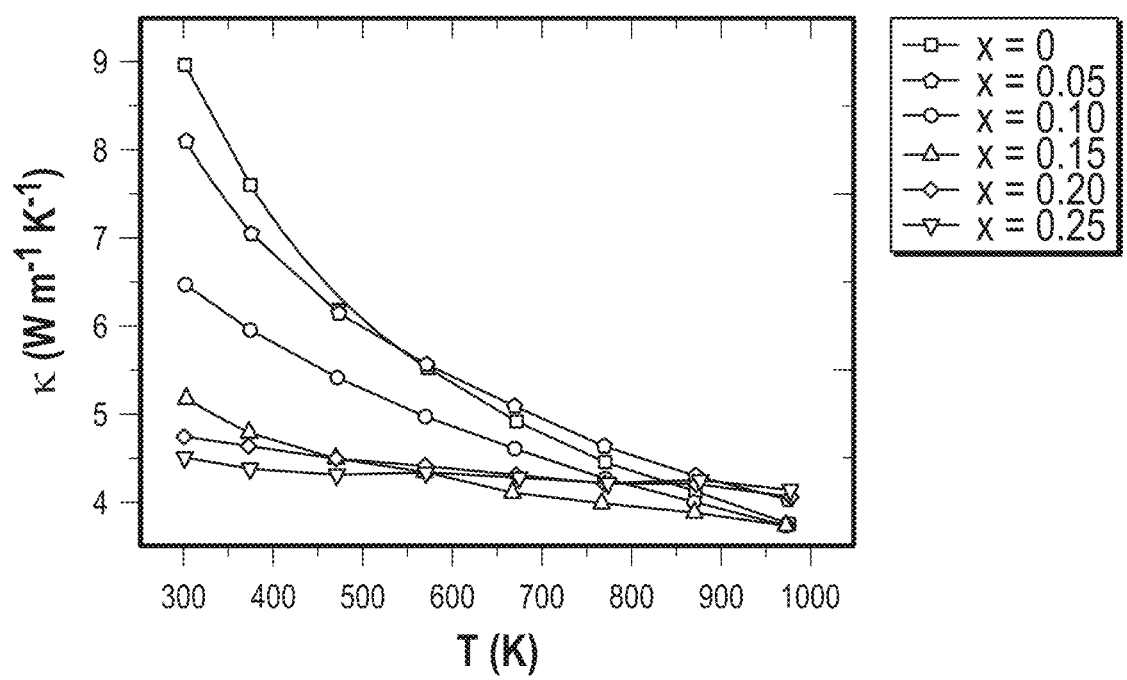
FIG. 20A-20B illustrates the thermal conductivity of n-type ZrCoBi-based half-Heuslers, where the total thermal conductivity is shown in FIG. 20A, and the lattice thermal conductivity of $ZrCo_{1-x}Ni_xBi$ is shown in FIG. 20B.
Figure 20B:
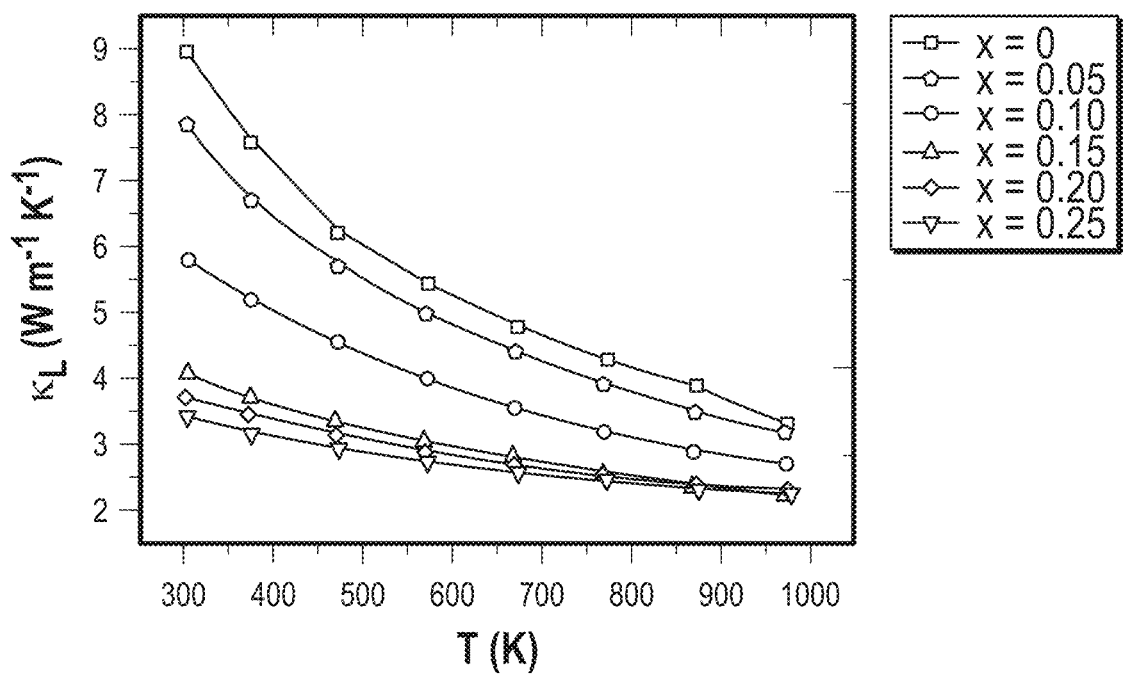
Figure 21A:
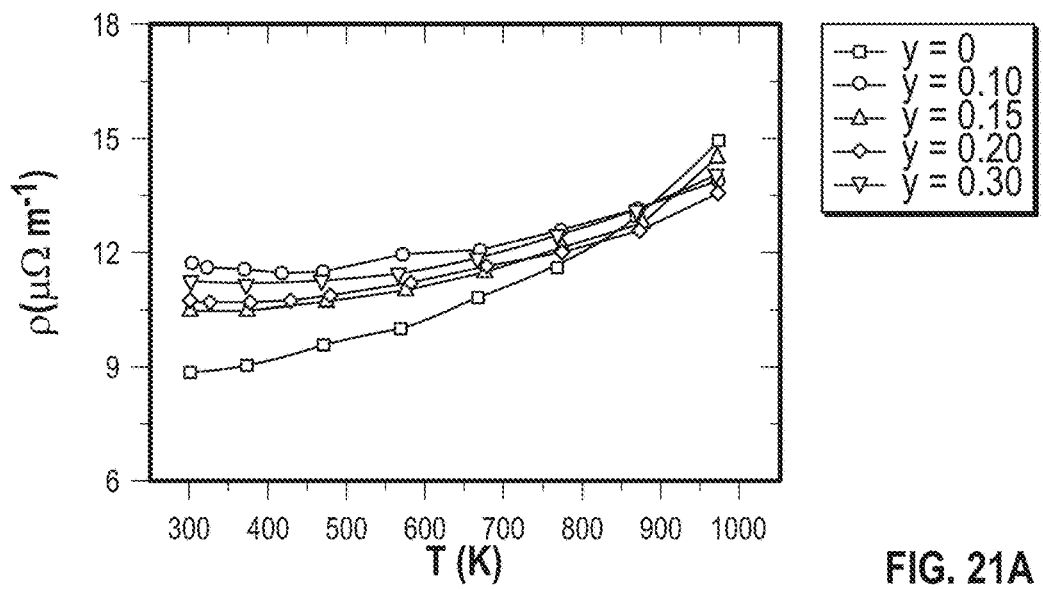
FIGS. 21A-21F illustrate the thermoelectric properties of $ZrCo_{0.9}Ni_{0.1}Bi_{1-y}Sb_y$ (y=0, 0.10, 0.15, 0.20, and 0.30), where the electrical resistivity is shown in FIG. 21A, the Seebeck coefficient is shown in FIG. 21B, the power factor is shown in FIG. 21C, the total thermal conductivity is shown in FIG. 21D, the lattice thermal conductivity is shown in FIG. 21E, and the ZT is shown in FIG. 21F.
Figure 21B:
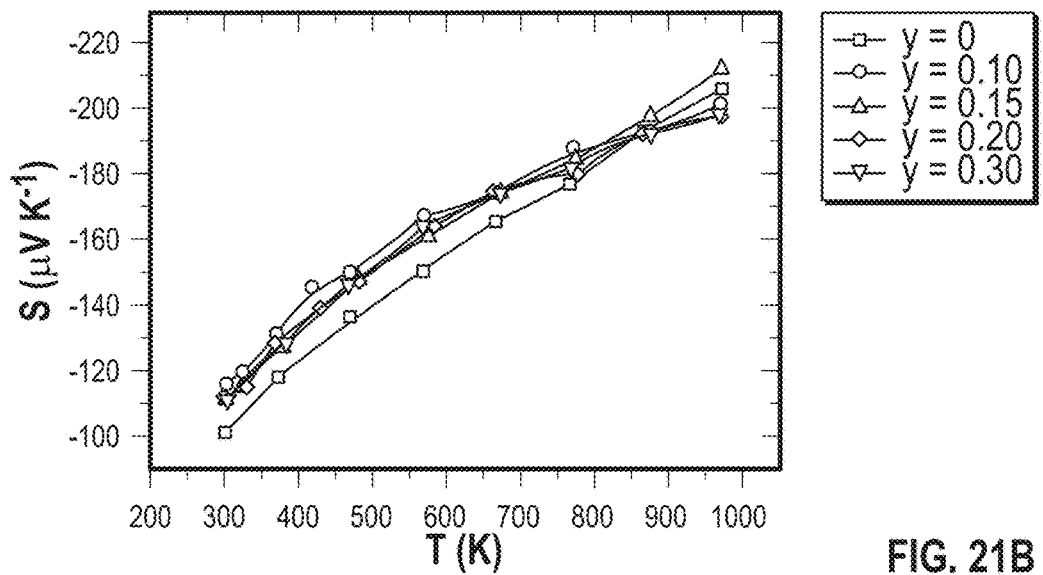
Figure 21C:
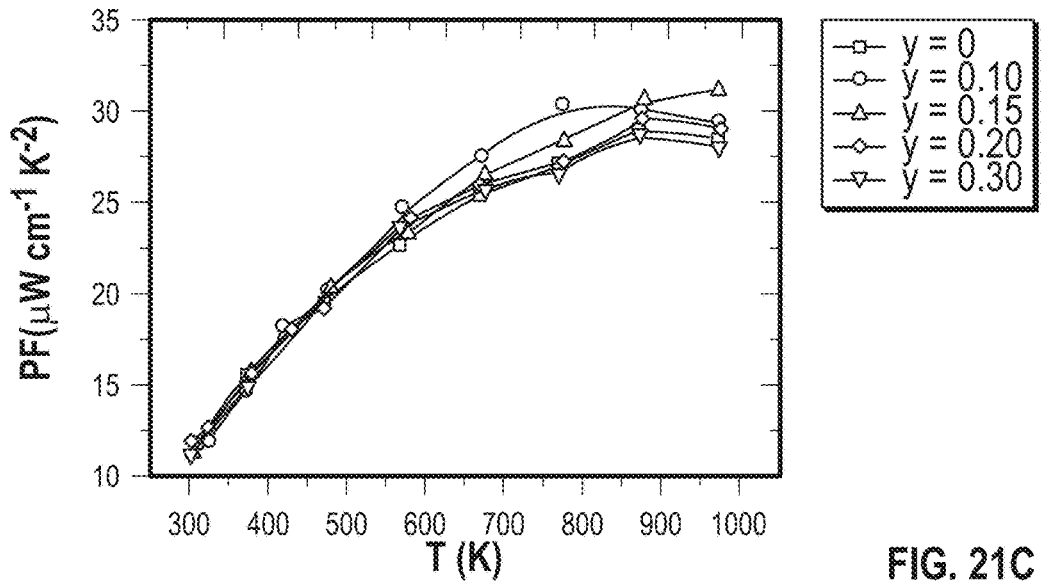
Figure 21D:
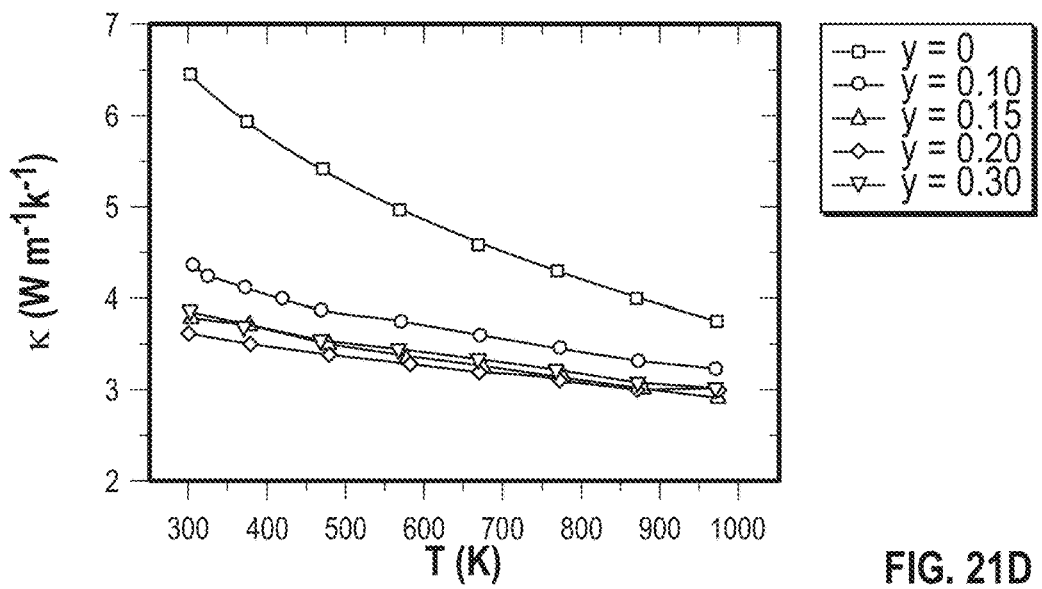
Figure 21E:
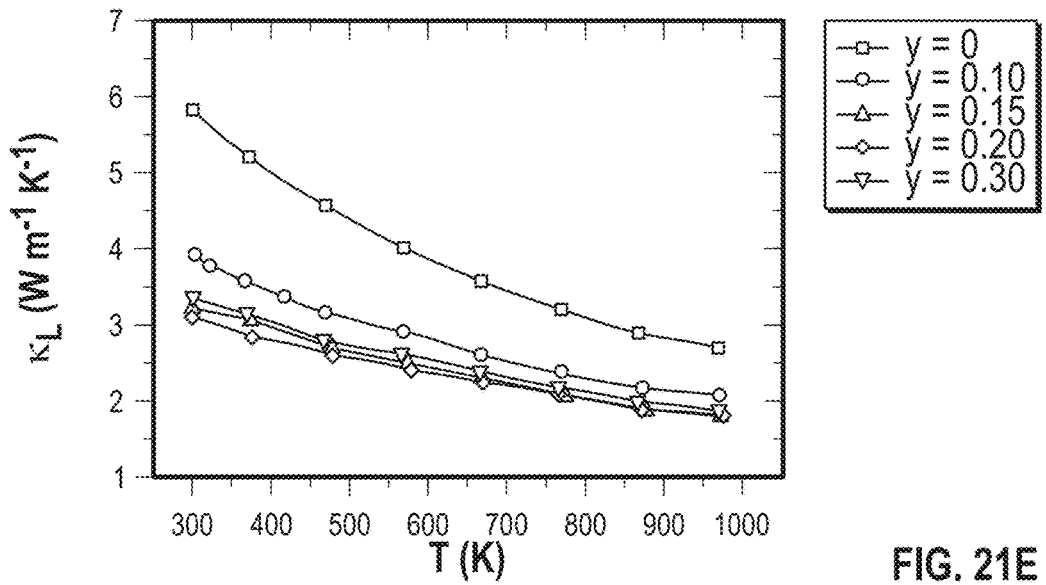

The thermal conductivity of the n-type ZrCoBi-based half-Heuslers is shown in FIGS. 20A-20B. The room-temperature thermal conductivity of $ZrCo_{1-x}Ni_xBi$ is reduced considerably with the increase of Ni concentration (e.g., as shown in FIG. 20A). The room-temperature thermal conductivity of the undoped ZrCoBi is ~8.9 W m$^{-1}$ K$^{-1}$ and it is only ~4.3 W m$^{-1}$ K$^{-1}$ for $ZrCo_{0.75}Ni_{0.25}Bi$, a reduction of ~52%. This can be attributed to the high concentration of substitutional point defects (i.e., Ni at the Co site) that disrupt the phonon propagation. To reveal the phonon scattering effect by Ni doping, the lattice thermal conductivity is further calculated as shown in FIG. 20B. The room-temperature lattice thermal conductivity is ~8.9 W m$^{-1}$ K$^{-1}$ for the pristine ZrCoBi and it is ~3.4 W m$^{-1}$ K$^{-1}$ for $ZrCo_{0.75}Ni_{0.25}Bi$, a reduction of ~62%. In addition to the Ni doping, thermal conductivity can also be largely reduced by alloying ZrCoBi with ZrCoSb (e.g., as shown in FIGS. 21A-21F). Compared to the heavy Ni-doping that leads to the inferior power factor (e.g., as shown in FIG. 17C), alloying ZrCoBi with ZrCoSb can effectively reduce the thermal conductivity while maintaining a relatively high power factor (e.g., as shown in FIG. 21C).

Figure 21F:
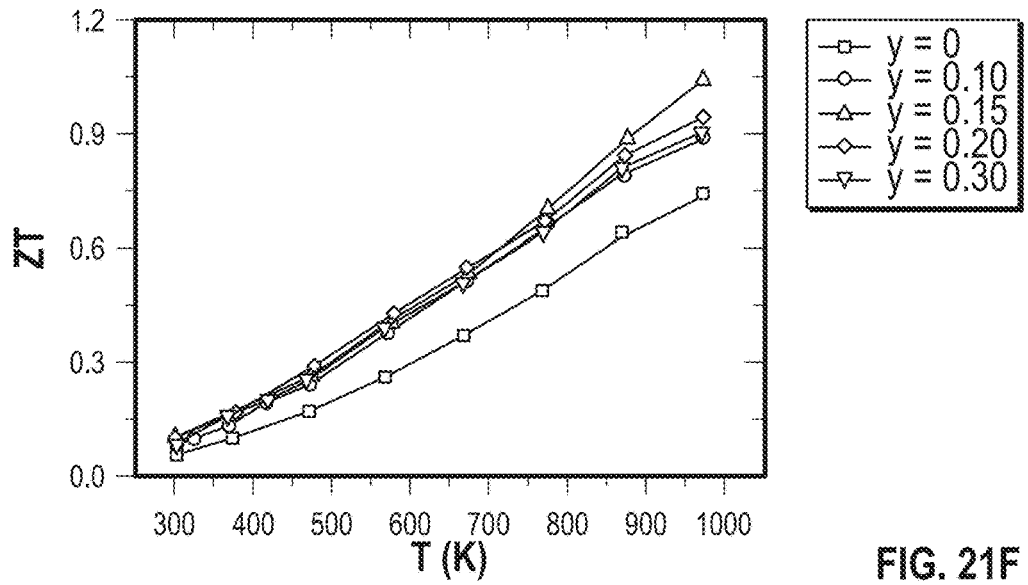
Figure 22A:
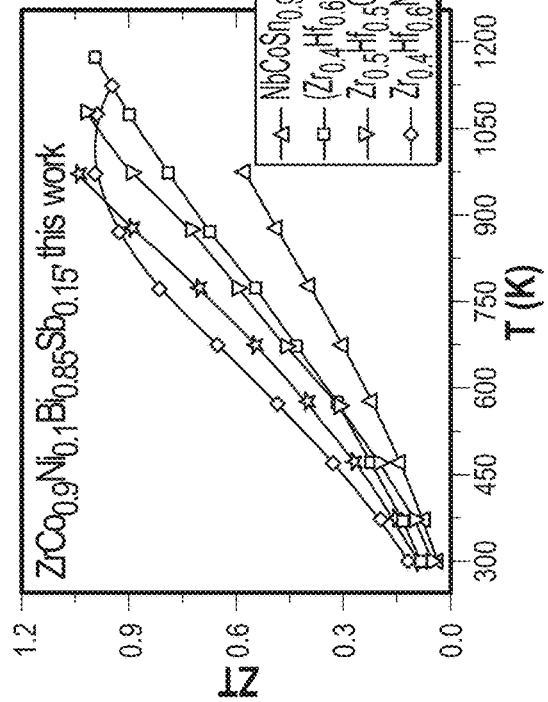
FIGS. 22A-22D illustrate the thermoelectric figure of merit of ZrCoBi-based half-Heuslers and measured heat-to-electricity conversion efficiency, where the thermoelectric figure of merit of $ZrCo_{1-x}Ni_xBi$ (n-type) and $ZrCo_{0.9}Ni_{0.1}Bi_{0.85}Sb_{0.15}$ (n-type) are shown in FIG. 22A, a comparison of the ZTs between $ZrCo_{0.9}Ni_{0.1}Bi_{0.85}Sb_{0.15}$ (n-type) and the other state-of-the-art n-type half-Heuslers are shown in FIG. 22B. the measured heat-to-electricity conversion efficiency for single legs is shown in FIG. 22C, and the unicouple of $ZrCo_{0.9}Ni_{0.1}Bi_{0.85}Sb_{0.15}$ (n-type) and $ZrCoBi_{0.65}Sb_{0.15}Sn_{0.2}$ (p-type) are shown in FIG. 22D. The inset in FIG. 22C illustrates the ratio of the measured efficiency of p-type to n-type legs.
Figure 22B:
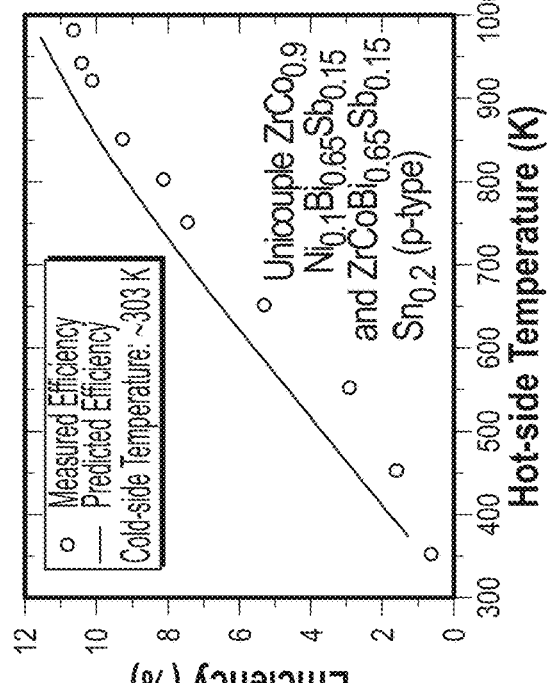
Figure 22C:
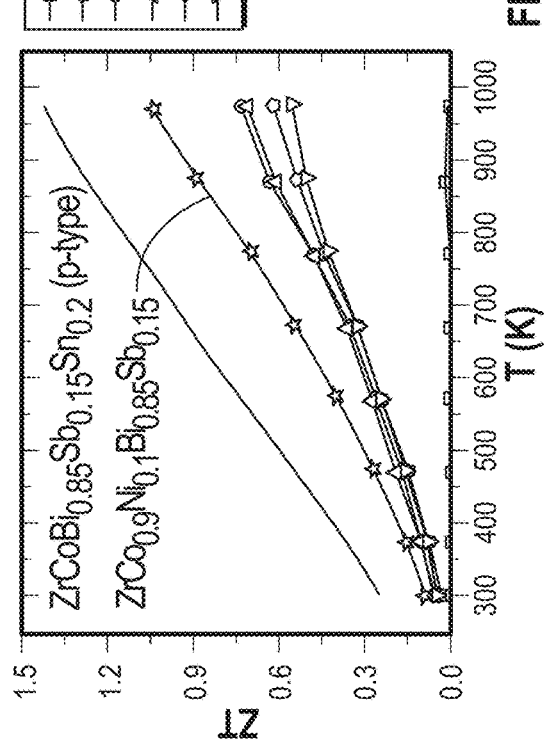
Figure 22D:
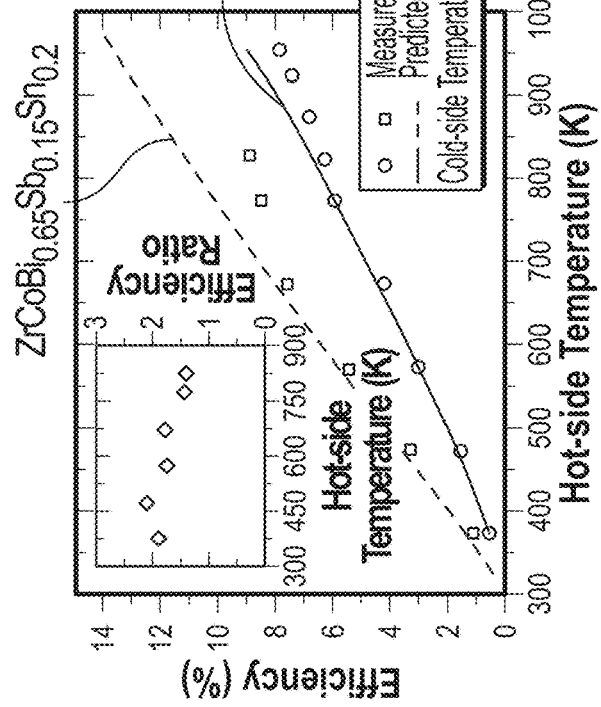

The dimensionless thermoelectric figure of merit ZT of the n-type $ZrCo_{1-x}Ni_xBi$ is shown in FIG. 22A. As shown, Ni-doping can effectively enhance the ZT and a peak ZT of ~0.74 can be achieved by $ZrCo_{0.9}Ni_{0.1}Bi$ at 973 K. By further alloying $ZrCo_{0.9}Ni_{0.1}Bi$ with ZrCoSb, the thermoelectric performance can be further improved (e.g., as shown in FIG. 21F), and a reasonably high peak ZT of ~1 at 973 K can be obtained by $ZrCo_{0.9}Ni_{0.1}Bi_{0.85}Sb_{0.15}$. To demonstrate the reproducibility of this result, four different batches of $ZrCo_{0.9}Ni_{0.1}Bi_{0.85}Sb_{0.15}$ have been prepared. The measured thermoelectric properties are similar between the different batches and the ZTs are quite comparable (e.g., as shown in FIGS. 23A-23D). To demonstrate the asymmetrical thermoelectric performance of the ZrCoBi-based materials, the ZT of p-type $ZrCoBi_{0.65}Sb_{0.15}Sn_{0.2}$ is also plotted in FIG. 22A for comparison. It should be noted that the thermoelectric performance of the p-type $ZrCoBi_{0.65}Sb_{0.15}Sn_{0.2}$ is noticeably better than that of the n-type $ZrCo_{0.9}Ni_{0.1}Bi_{0.85}Sb_{0.15}$ over the whole temperature range, which is in good agreement with our prediction (e.g., as shown in FIG. 13B). In addition, comparison of $ZrCo_{0.9}Ni_{0.1}Bi_{0.85}Sb_{0.15}$ with other n-type half-Heusler materials is also made as shown in FIG. 22B. Although the ZrNiSn-based materials show a higher ZT in the lower temperature range, their ZT is reduced at elevated temperature due to the bipolar effect. In contrast, the ZT of $ZrCo_{0.9}Ni_{0.1}Bi_{0.85}Sb_{0.15}$ increases monotonically within the studied temperature range, and therefore $ZrCo_{0.9}Ni_{0.1}Bi_{0.85}Sb_{0.15}$ is comparable with the ZrNiSn-based materials at elevated temperature. In addition, $ZrCo_{0.9}Ni_{0.1}Bi_{0.85}Sb_{0.15}$ shows noticeably better thermoelectric performance than all of the other n-type half-Heuslers, e.g., ZrCoSb-based and NbCoSn-based materials, over the whole temperature range. It should be noted that the ZrCoBi-based compound can achieve ZT above unity at 973 K for both carrier types. This indicates that the ZrCoBi compound is suitable for mid- and high-temperature thermoelectric power generation. To evaluate the potential of ZrCoBi-based materials for thermoelectric application, the heat-to-electricity conversion efficiency of the single-leg $ZrCo_{0.9}Ni_{0.1}Bi_{0.85}Sb_{0.15}$ was measured. A maximum efficiency of ~7.9% can be obtained at the cold-side temperature of ~303 K and hot-side temperature of ~953 K (e.g., as shown in FIG. 22C). The reported conversion efficiency of p-type single-leg $ZrCoBi_{0.65}Sb_{0.15}Sn_{0.2}$ is plotted in FIG. 22C for comparison. More importantly, a unicouple of n-type $ZrCo_{0.9}Ni_{0.1}Bi_{0.85}Sb_{0.15}$ and p-type $ZrCoBi_{0.65}Sb_{0.15}Sn_{0.2}$ was further prepared. The dimension of each leg was improved by considering the differences in electrical resistivity and thermal conductivity between the materials. Our results showed that a maximum heat-to-electricity conversion efficiency for the unicouple can be as high as ~10.6% at the cold-side temperature of ~303 K and hot-side temperature of ~983 K (e.g., as shown in FIG. 22D).

For the materials disclosed herein, the relationship between the asymmetrical thermoelectric performance and the weighted mobility ratio can be seen to be important. The weighted mobility ratio depends on the difference in electronic structures and the different scattering of carriers. The thermal stability difference may also lead to the asymmetrical performance in real applications. For example, the low stability of the Fe-based p-type skutterudites is a major limitation in achieving high efficiency in skutterudite modules. The relationship between the asymmetrical thermoelectric performance and the weighted mobility ratio can be used to predict the thermoelectric performance of the materials. However, both n-type and p-type semiconductors heavily depends on the dopability, which relates to the solubility limit as well as the defect level (i.e., shallow level or deep level) of the dopants. In addition, identifying and controlling the intrinsic defects that pin the Fermi level can also be important for realizing the ambipolar doping. Therefore, the prediction of thermoelectric performance of unreported materials via the weighted mobility ratio can be roughly considered as an upper limit.

As disclosed herein, the thermoelectric performance of ZrCoBi-based half Heuslers is illustrated. By improving and/or optimizing the carrier concentration and reducing the thermal conductivity, a ZT of ~1 at 973 K or higher can be achieved for $ZrCo_{0.9}Ni_{0.1}Bi_{0.85}Sb_{0.15}$. Compared to other n-type ZrNiSn-based half-Heuslers, the ZrCoBi-based materials demonstrate comparable thermoelectric performance at elevated temperature. In addition, the ZrCoBi-based materials significantly outperform all of the other n-type half-Heuslers over the whole temperature range. The heat-to-electricity conversion efficiency is further measured for a unicouple consisting of the n-type and p-type ZrCoBi-based materials. An efficiency of ~10.6% can be obtained at the cold-side temperature of ~303 K and hot-side temperature of ~983 K. This demonstrates that the ZrCoBi-based half-Heuslers can be used for mid- and high-temperature thermoelectric power generation.

In some embodiments, the n-type and p-type materials can be used to form a thermoelectric conversion module. The thermoelectric module can comprise at least one first leg and at least one second leg. For example, a plurality of legs can be formed from the materials within the thermoelectric module. The first leg can comprise a first p-type material having a formula:

$$ZrCoBi_{1-x-y}Sn_xSb_y,$$

where x can vary between 0.01 and 0.25, and y can vary between 0 and 0.2, and the at least one second leg can comprise an n-type material having a formula:

$$ZrCo_{1-x}Ni_xBi_{1-y}Sb_y,$$

where x can vary between 0.01 and 0.25, and y can vary between 0 and 0.3. The at least one first leg and the at least one second leg can be connected thermally in parallel and electrically in series. The resulting thermoelectric module can have a thermoelectric conversion efficiency of 10% or greater at a temperature difference of about 650 K. As described herein, a peak dimensionless figure-of-merit (ZT) of the p-type material can be greater than or equal to about 1.4 at 973 K, and a peak dimensionless figure-of-merit (ZT) of the n-type material can be greater than or equal to about 1.0 at 973 K. A thermoelectric conversion efficiency of the p-type material can be greater than or equal to about 9% at a temperature difference of about 500 K, and a thermoelectric conversion efficiency of the n-type material can be greater than or equal to about 7% at a temperature difference of about 650 K.

EXAMPLES

The embodiments having been generally described, the following examples are given as particular embodiments of the disclosure and to demonstrate the practice and advantages thereof. It is understood that the examples are given by way of illustration and are not intended to limit the specification or the claims in any manner.

Example 1

Figure 24B:
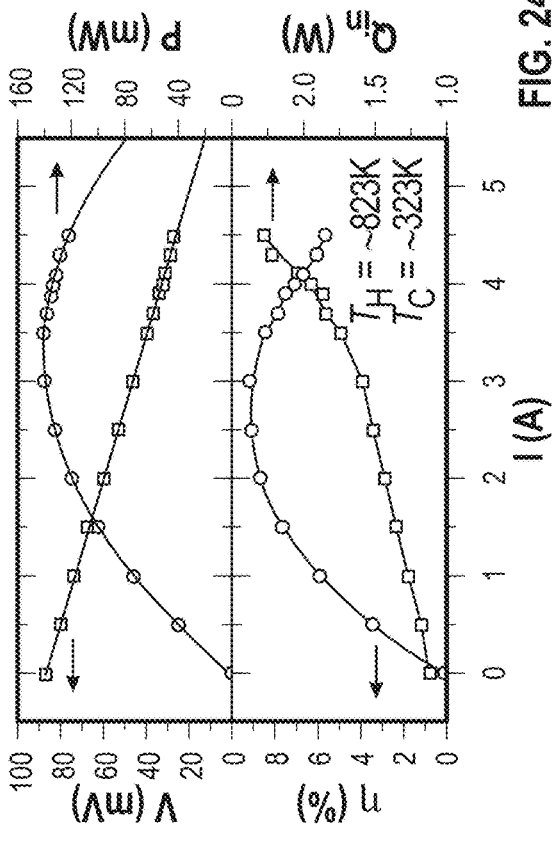
FIGS. 24A-24D illustrate a measurement of output power density and thermoelectric conversion efficiency. The experimental setup of a single-leg device is shown in FIG. 24A. The measured voltage, output power, input power and efficiency of the device with varying current are shown in FIG. 24B where the cold-side and hot-side temperature of the device are fixed at ~323 and ~823 K, respectively. The hot-side-temperature-dependent output power density (normalized to the length of 2 mm) is shown in FIG. 24C and heat-to-electricity conversion efficiency is shown in FIG. 24D. The cold-side temperature is fixed at 298 K for the calculation of output power density and conversion efficiency.
Figure 24A:
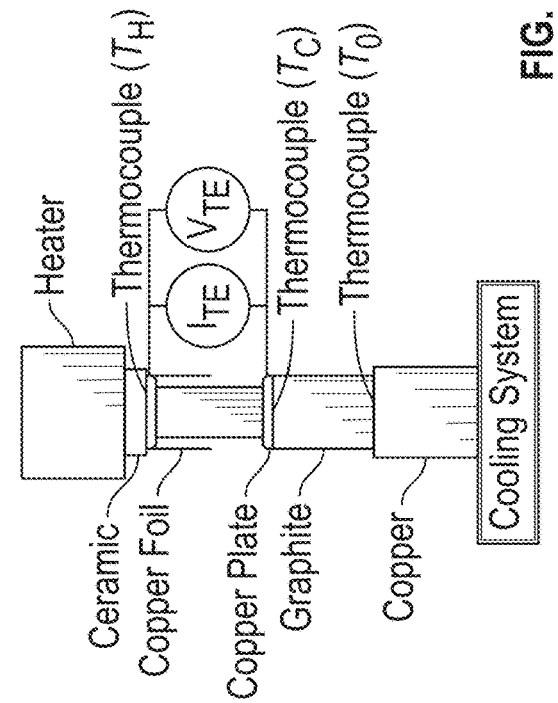

The p-type materials disclosed herein can demonstrate a high thermoelectric conversion efficiency. To further validate the high thermoelectric performance of $ZrCoBi_{0.65}Sb_{0.15}Sn_{0.20}$, heat-to-electricity conversion efficiency (η) and output power density (ω) were measured on a single-leg device with a homemade system (e.g., as shown in FIG. 24A). The thermoelectric material (which is referred as a "leg" in some contexts herein) was polished to a size of 1.5×2.4 mm² in cross-section and ~4.65 mm in thickness. The cold side of the leg was electroplated with copper, nickel, and gold layers sequentially, then soldered ($In_{52}Sn_{48}$, melting point 391 K) to a copper plate, and the hot side of the leg was directly brazed ($Ag_{56}Cu_{22}Zn_{17}Cd_5$, liquidus point 923 K) with a copper plate. The temperature of cold side was maintained by water circulation and temperature of hot side was controlled by PID. The experiments were conducted under high vacuum (below 10-6 mbar) to reduce the heat conduction. To measure conversion efficiency (η), the input power from hot side ($Q_{in}$) and the generated power (P) were measured at the same time. The direct measurement of $Q_{in}$ is of great challenge due to the heavy heat loss at high temperature. According to Fourier's Law, a bulk polycrystalline graphite with measured geometry and thermal conductivity was placed below cold side to measure the heat flow out of cold side ($Q_{out}$). The thermal conductivity of the bulk polycrystalline graphite was confirmed before in the same way as described in the methods section. In order to measure temperature differences of the leg and graphite bulk, K-type thermocouples were embedded at the interfaces. It should be noticed that the hot-side temperature of graphite can be regarded as the cold-side temperature of the leg if the setup is working under a large pressure as shown in FIG. 24A. The total $Q_{in}$ includes $Q_{out}$, P, and radiation loss from the leg ($Q_{rad}$). Therefore, the conversion efficiency (η) can be written as the following:

$$\eta = \frac{P}{Q_{in}} = \frac{P}{Q_{out} + P + Q_{rad}}$$

Figure 24D:
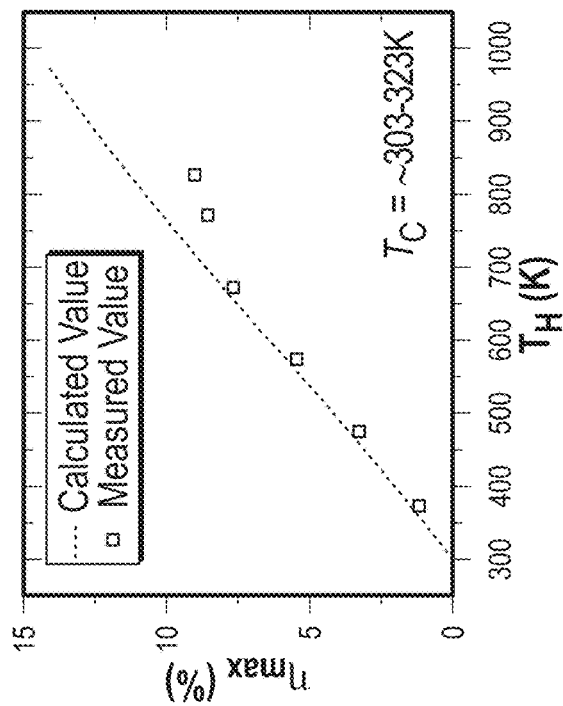
Figure 24C:
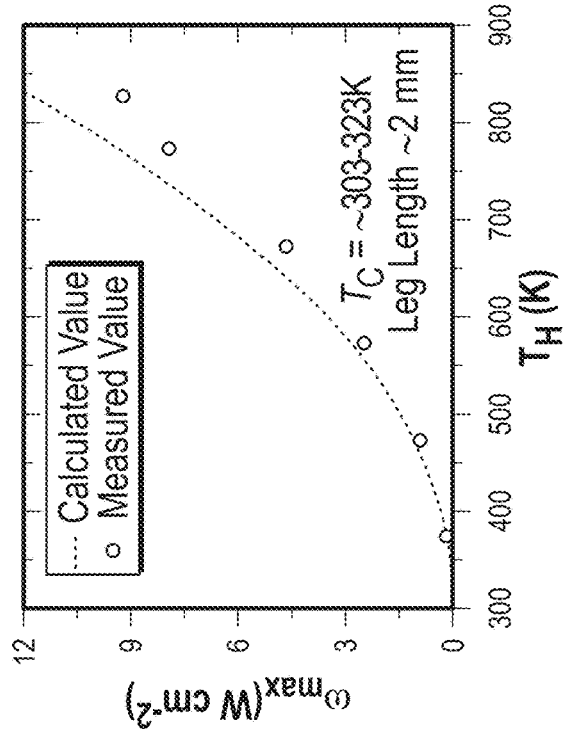
Figure 25A:
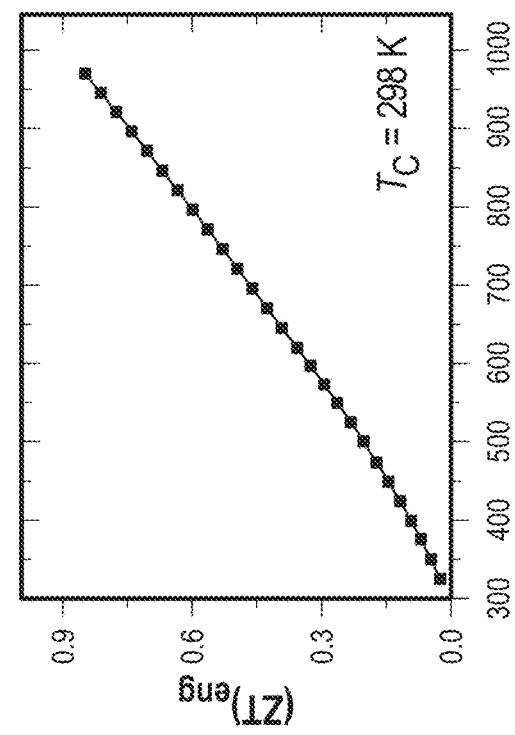
FIGS. 25A-25D illustrate an evaluation of the heat recovery ability of $ZrCoBi_{0.65}Sb_{0.15}Sn_{0.20}$ by practical indicators including the calculated hot-side-temperature-dependent engineering power factor as shown in FIG. 25A, the engineering ZT as shown in FIG. 25B, the output power density as shown in FIG. 25C, and the conversion efficiency as shown in FIG. 25D.
Figure 25B:
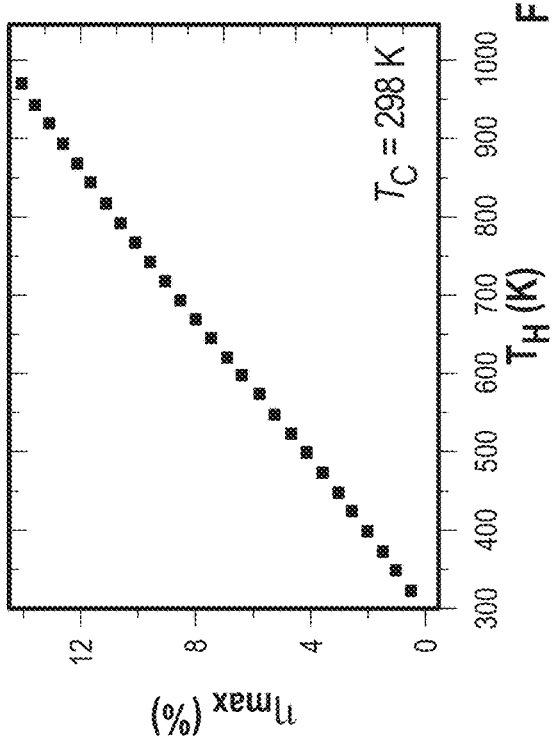
Figure 25C:
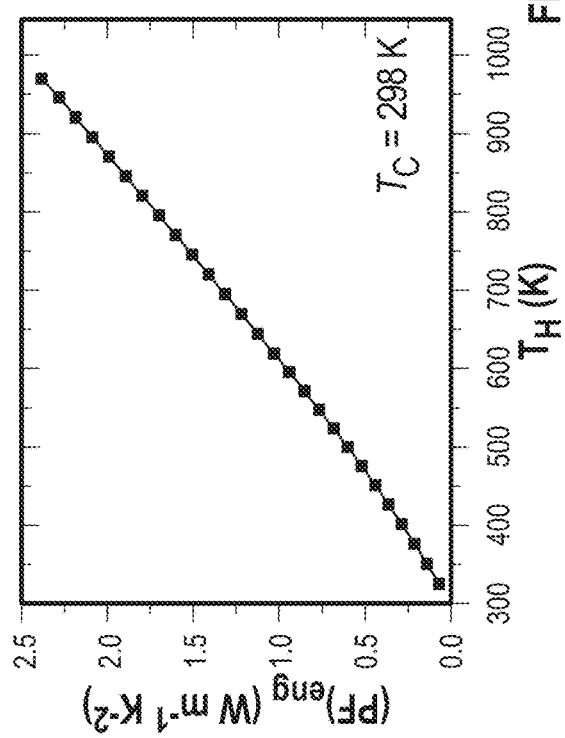
Figure 25D:
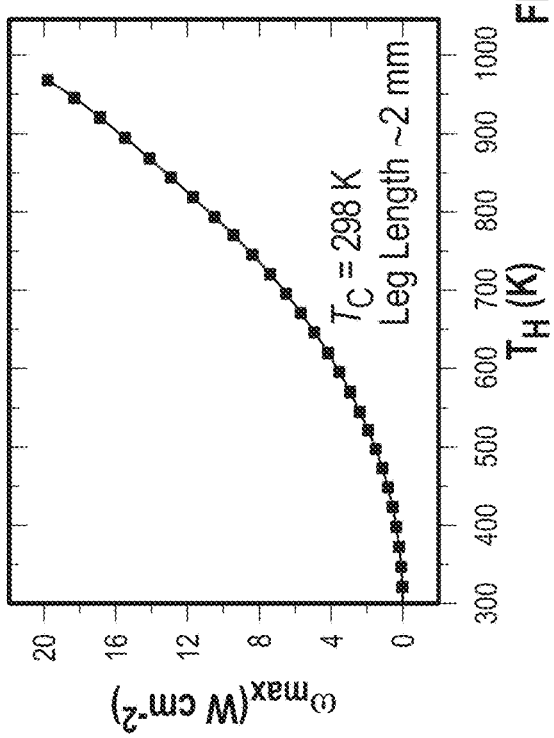

Since $Q_{rad}$ cannot be directly measured, in real measurement $Q_{in}$ is composed of $Q_{out}$ and P which leads to the measurement error of n. By tuning the current in the circuit, a series of $Q_{in}$, P can be measured at the same time. Therefore, both maximum η and P can be found. To minimize the radiation loss, copper foil working as a radiation shield is brazed with copper plate of hot side. Since this radiation shield is at higher temperature than the leg, it will add additional heat flow into the leg, therefore the measured $Q_{out}$ will actually be higher than without the shield. This should lead to a more conservative value of efficiency. In this example, all the parameters for the single leg device of $ZrCoBi_{0.65}Sb_{0.15}Sn_{0.20}$, including temperature difference, electric current (I), voltage (V), output power (P), and input power ($Q_{in}$) can be obtained simultaneously, as shown in FIG. 24B. Due to the limited heating power of the system, the hot-side temperature ($T_H$) could only be raised to ~823 K. The measured hot-side temperature-dependent maximum output power density ($\omega_{max}$) and maximum efficiency ($\eta_{max}$) are shown in FIGS. 24C and 24D, respectively. The peak output power density is ~9.3 W cm$^{-2}$ and the efficiency is ~9% at the hot-side temperature of ~823 K (e.g., as shown in FIG. 24D). It is noted that the obtained results are slightly lower than that of the theoretical calculations, especially at high temperature. This should be mainly ascribed to the radiation heat, the rise of cold-side temperature, and parasitic electrical and heat loss. By minimizing these adverse effects, it is expected that the measured maximum efficiency and output power density will be closer to the calculated values ~12% and ~11 W cm$^{-2}$ at hot-side temperature of ~823 K. Even higher values of maximum output power density and efficiency can be possibly achieved by increasing the hot-side temperature, as shown in FIG. 25.

Example 2

Thermal Stability

Figure 26A:
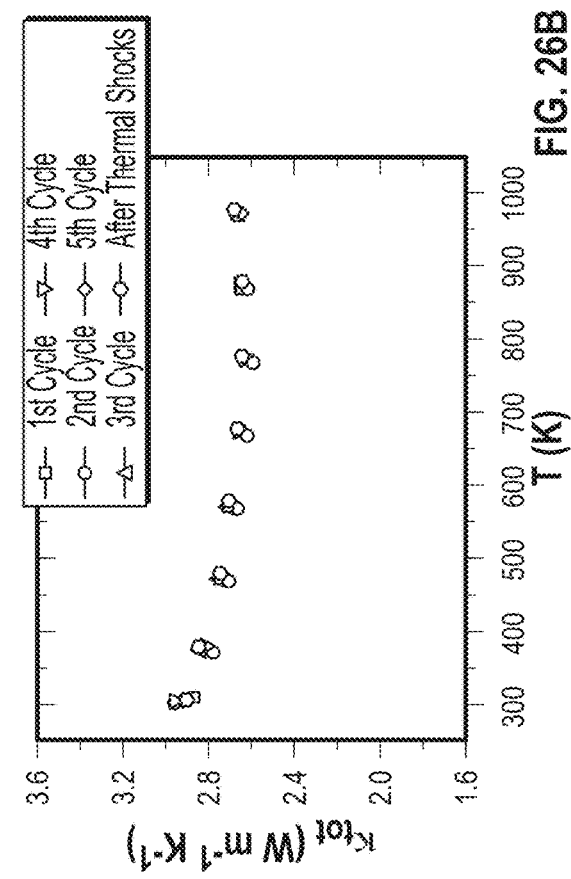
FIGS. 26A-26D illustrate a thermal stability test in which repeated measurement of electrical conductivity and Seebeck coefficient are shown in FIG. 26A, total thermal conductivity is shown in FIG. 26B, ZT is shown in FIG. 26C for the $ZrCoBi_{0.65}Sb_{0.15}Sn_{0.20}$ samples. Repeated measurement of the current-dependent voltage and output power are shown in FIG. 26D for the $ZrCoBi_{0.65}Sb_{0.15}Sn_{0.20}$ leg maintained at a cold-side temperature of ~368 K and a hot-side temperature ~803 K.
Figure 26B:
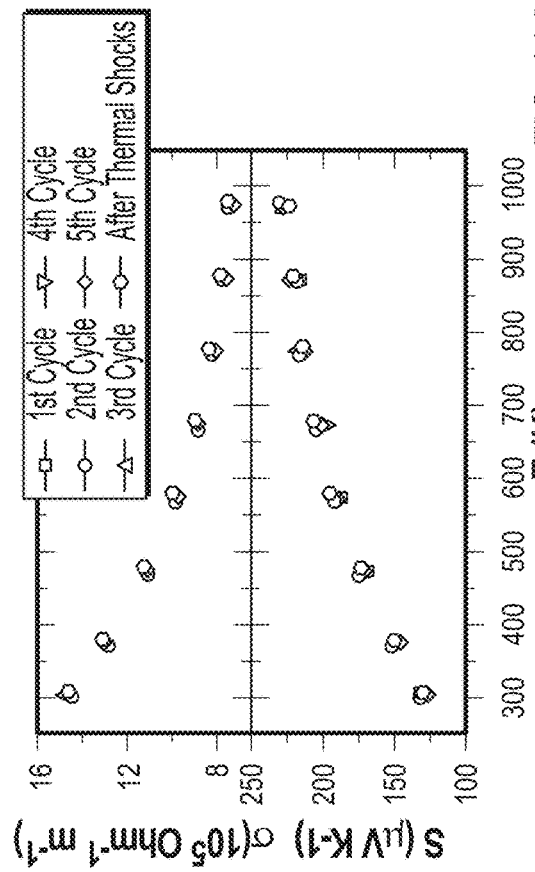
Figure 26D:
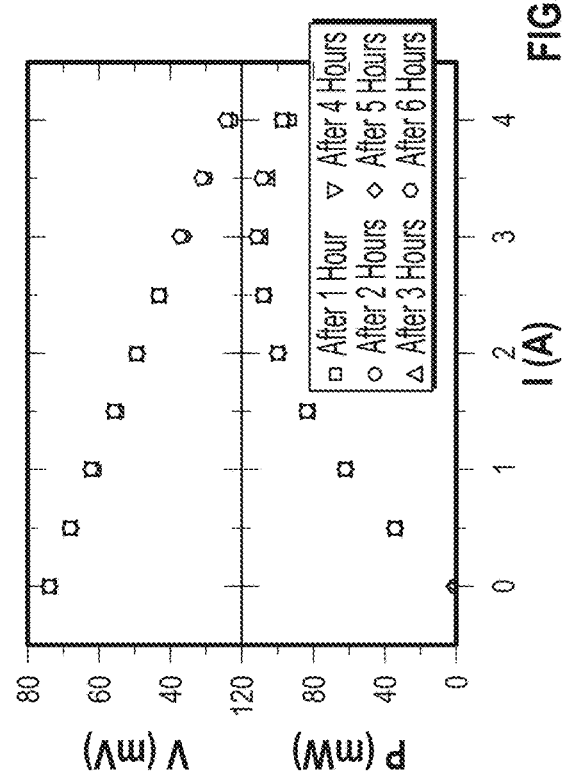
Figure 26C:
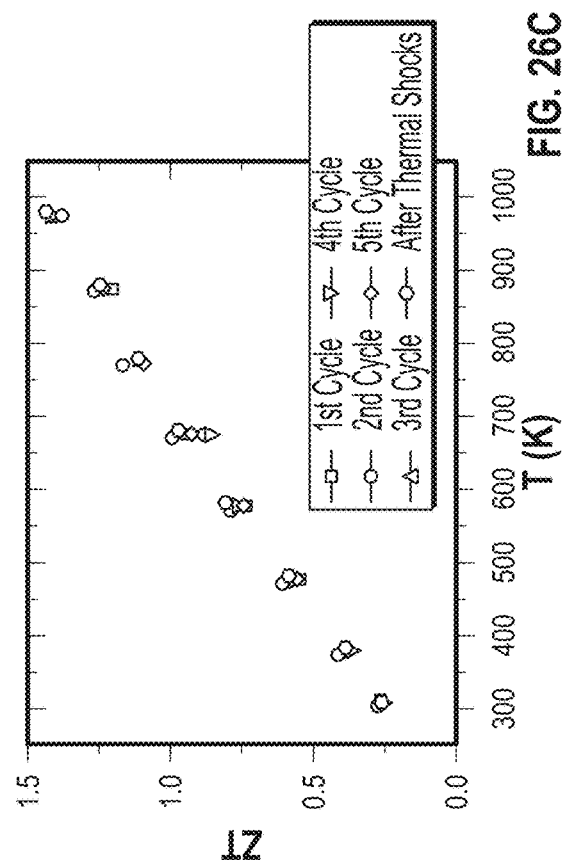
Figure 29A:
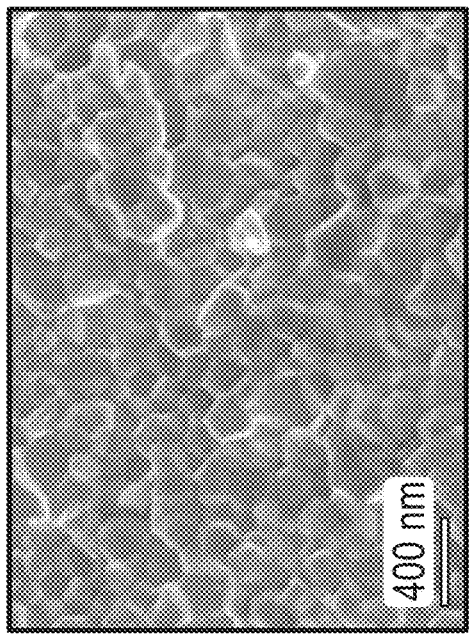
FIGS. 29A-29D illustrate the microstructure of the hot-pressed $ZrCoBi_{0.65}Sb_{0.15}Sn_{0.20}$, where the SEM images are shown in FIGS. 29A and 29B, and the TEM images are shown in FIGS. 29C and 29D, which indicate the specimen is highly dense with an average grain size of ~200 nm.
Figure 29B:
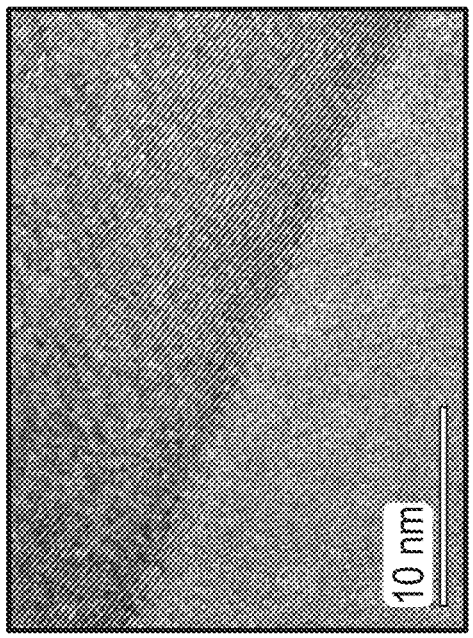
Figure 29C:
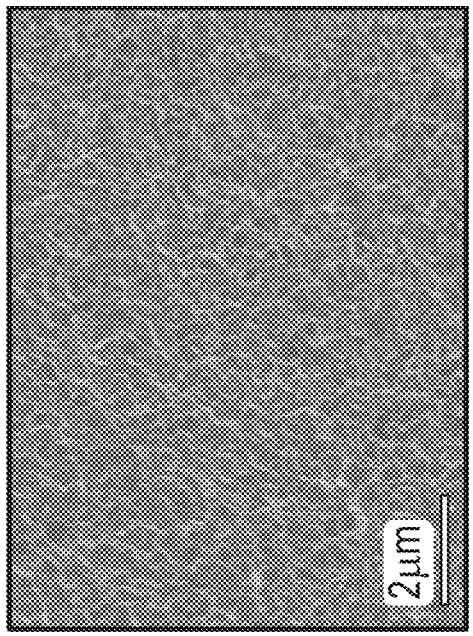
Figure 29D:
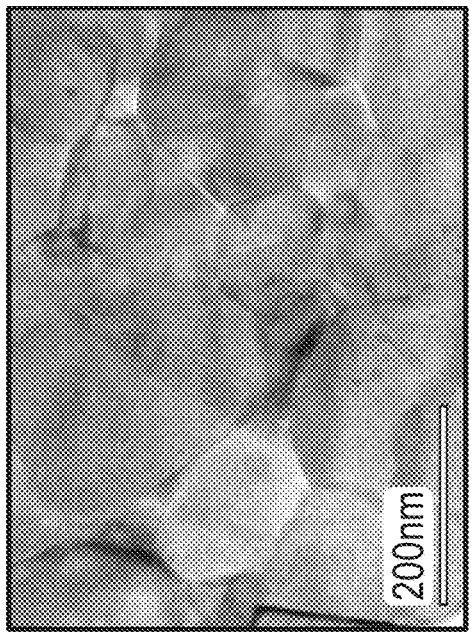
Figure 30A:
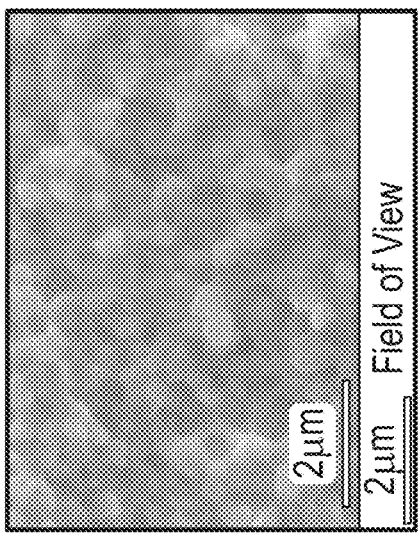
FIGS. 30A-30F illustrate the elemental mapping and chemical composition of the hot-pressed $ZrCoBi_{0.95}Sn_{0.05}$, where the SEM image is shown in FIG. 30A and the corresponding EDS elemental mapping of Zr is shown in FIG. 30B, Co is shown in FIG. 30C, Bi is shown in FIG. 30D, Sn is shown in FIG. 30E, and the EDS spectrum is shown in FIG. 30F.
Figure 30B:
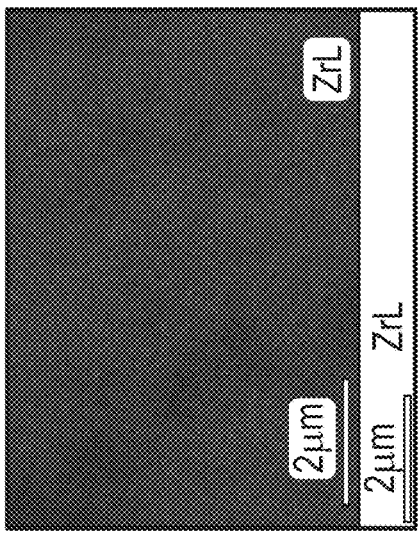
Figure 30C:
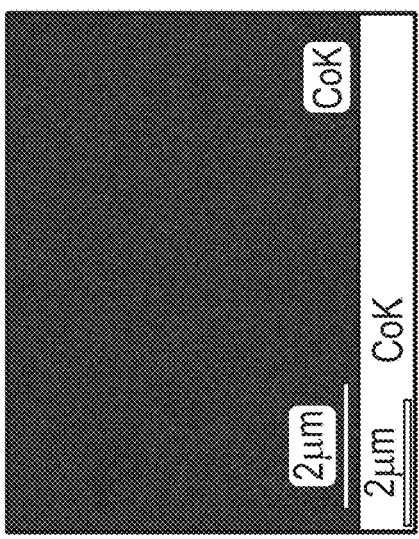
Figure 30D:
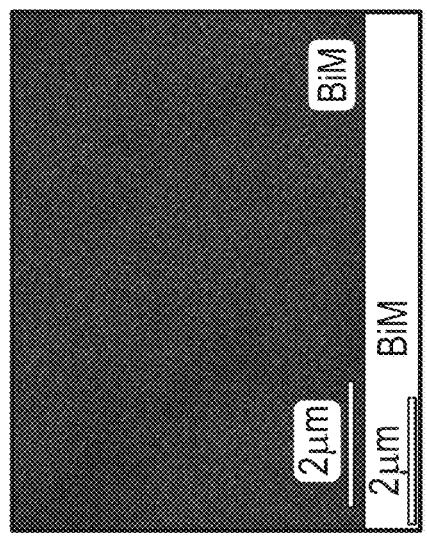
Figure 30E:
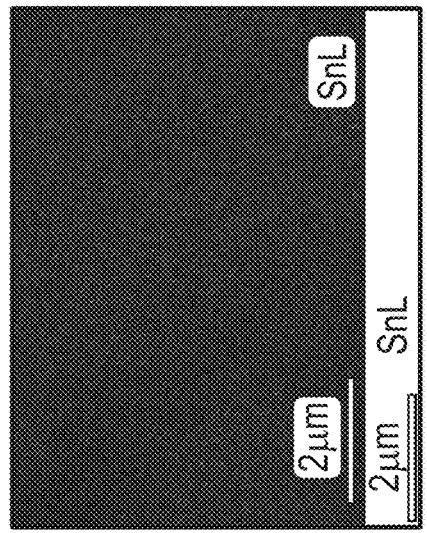
Figure 30F:
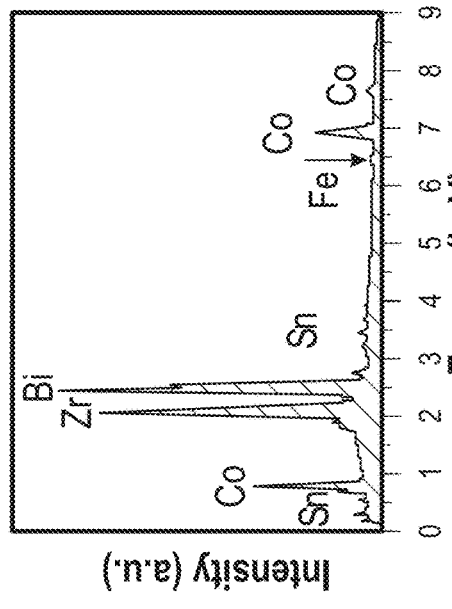
Figure 31A:
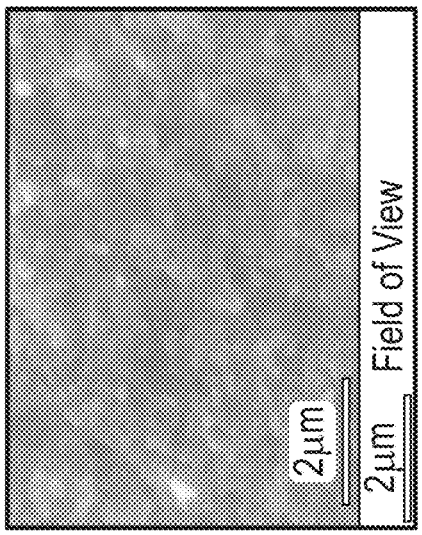
FIGS. 31A-31F illustrate the elemental mapping and chemical composition of the hot-pressed $ZrCoBi_{0.80}Sn_{0.20}$, where the SEM image is shown in FIG. 31A and the corresponding EDS elemental mapping of Zr is shown in FIG. 31B, Co is shown in FIG. 31C, Bi is shown in FIG. 31D, Sn is shown in FIG. 31E, and the EDS spectrum is shown in FIG. 31F.
Figure 31B:
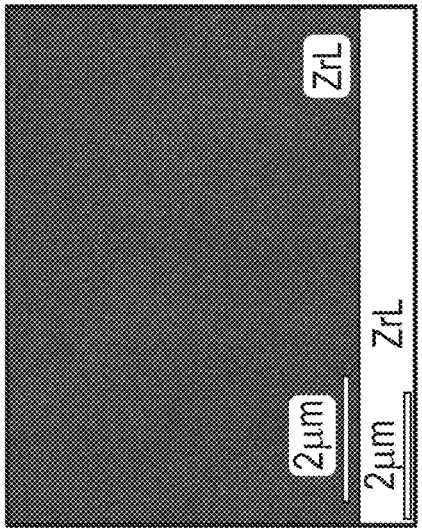
Figure 31C:
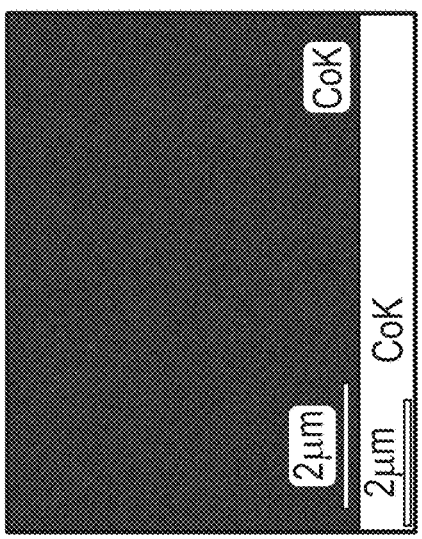
Figure 31D:
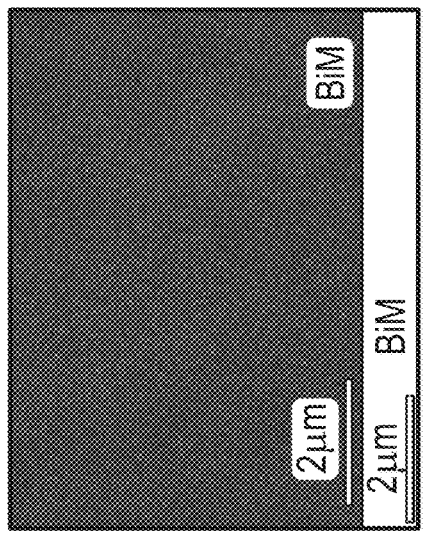
Figure 31E:
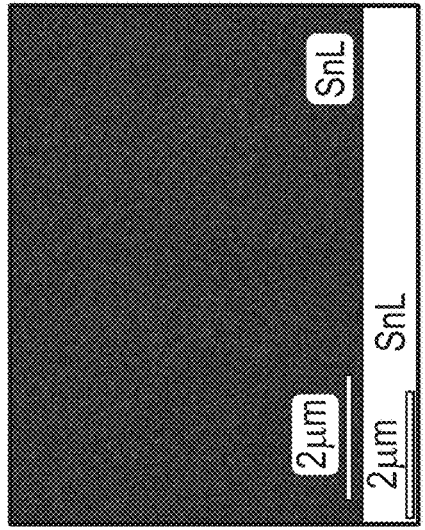
Figure 31F:
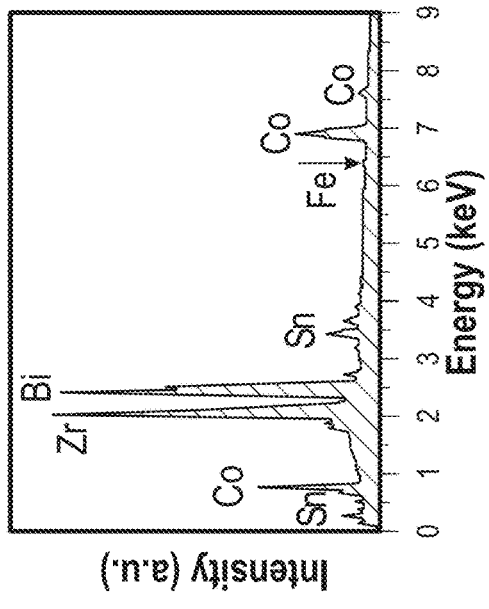
Figure 32A:
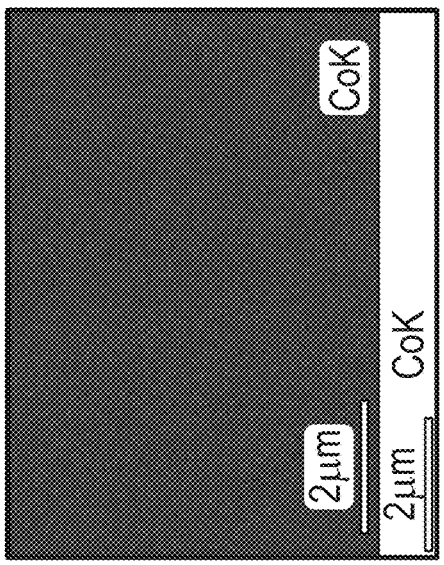
FIGS. 32A-32H illustrate the elemental mapping and chemical composition of the hot-pressed $ZrCoBi_{0.65}Sb_{0.15}Sn_{0.20}$, where the SEM image is shown in FIG. 32A and the corresponding EDS elemental mapping of Zr is shown in FIG. 32B, Co is shown in FIG. 32C, Bi is shown in FIG. 32D, Sn is shown in FIG. 32E, and Sb is shown in FIG. 32F. The EDS spectrum is shown in FIG. 32G and the enlarged EDS spectrum focused on Fe peak is shown in FIG. 32H. The analysis is taken from the sample after repeatedly measurement and ten times thermal shock cycles form room temperature to 973 K.
Figure 32B:
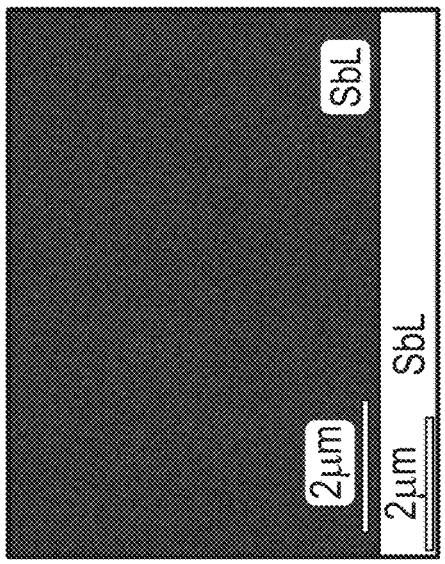
Figure 32C:
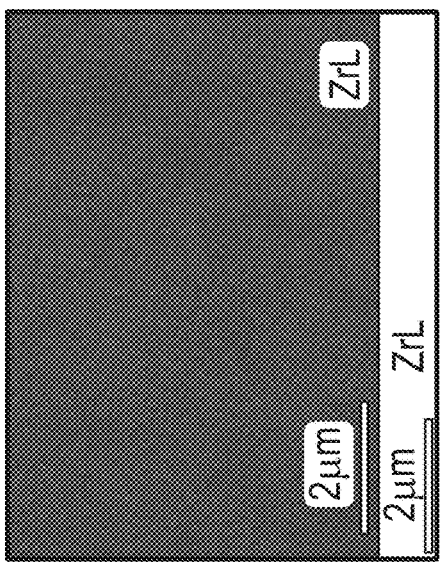
Figure 32D:
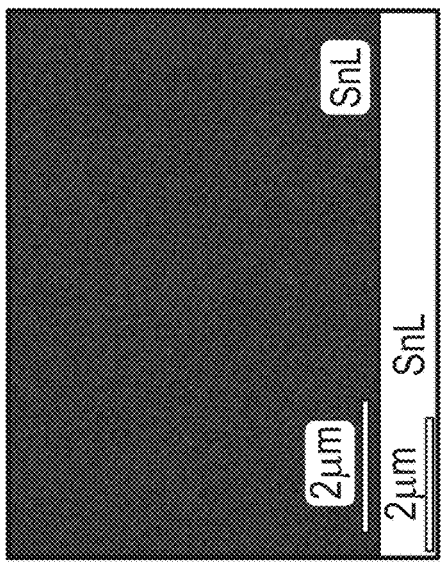
Figure 32E:
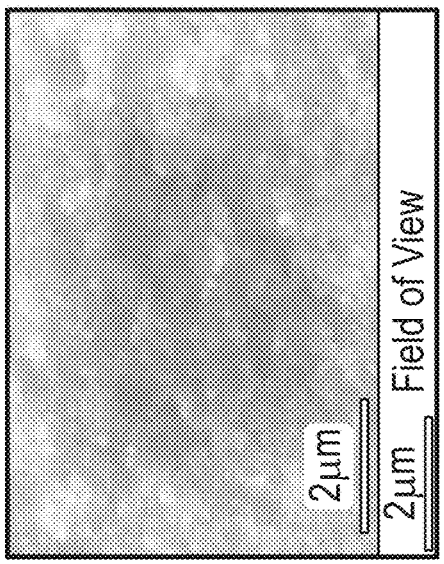
Figure 32F:
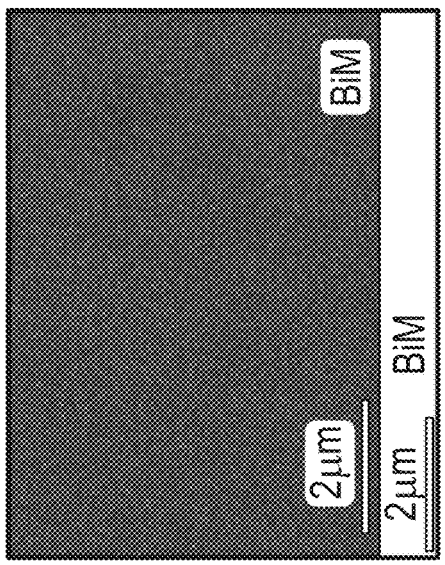
Figure 32G:
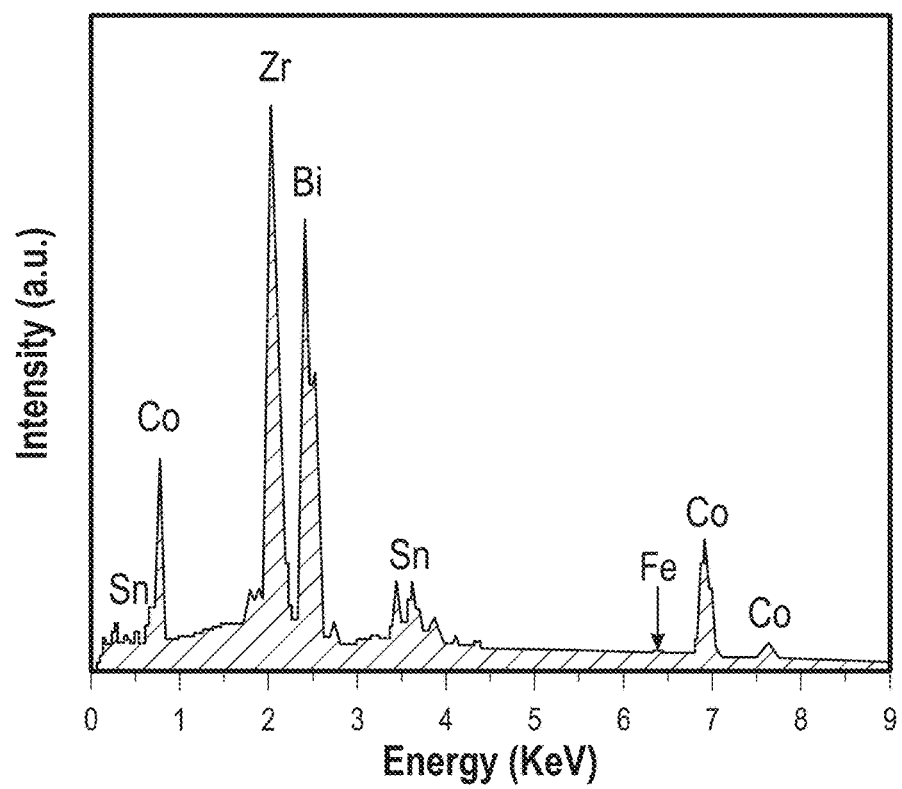
Figure 32H:
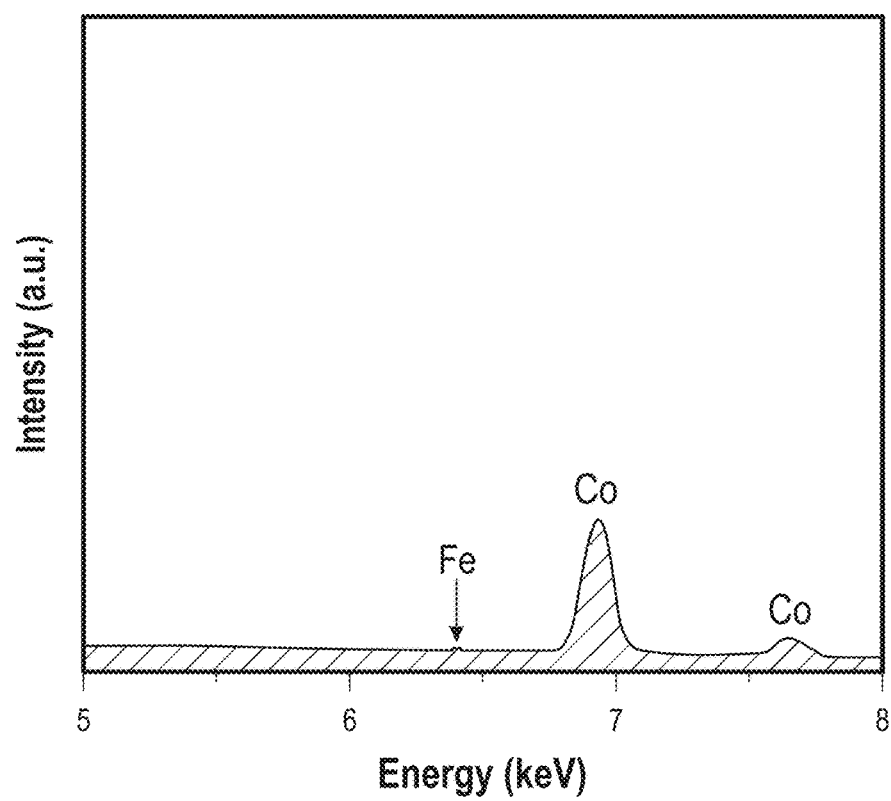
Figure 33C:
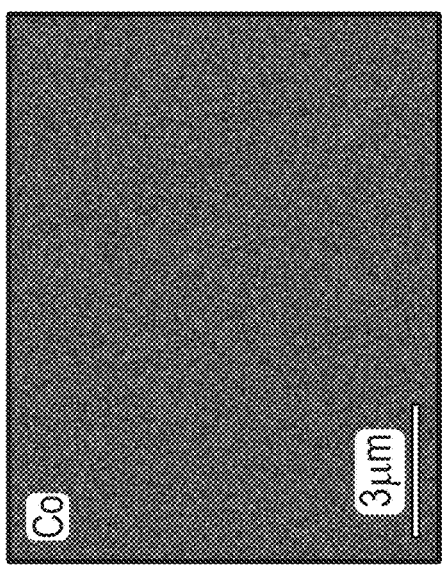
FIGS. 33A-33F illustrate the energy dispersive spectroscopy mapping of $ZrCo_{0.9}Ni_{0.1}$ $Bi_{0.85}Sb_{0.15}$.
Figure 33F:
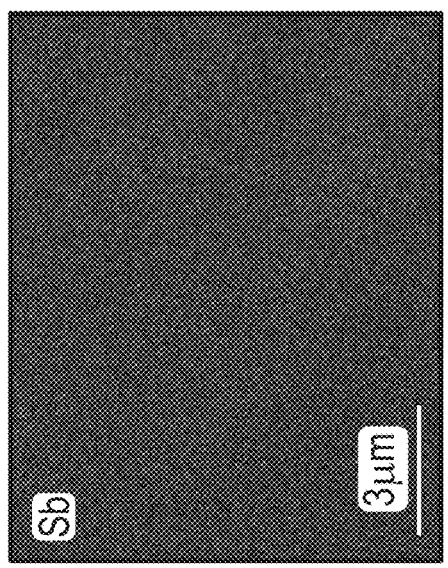
Figure 33B:
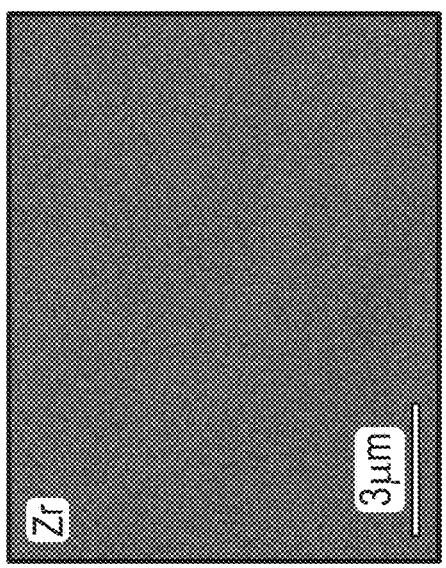
Figure 33E:
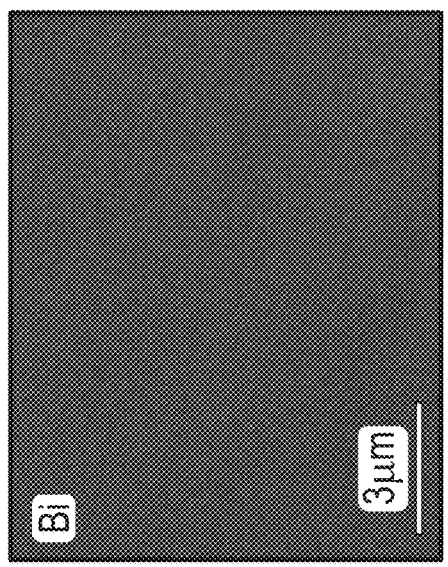
Figure 33A:
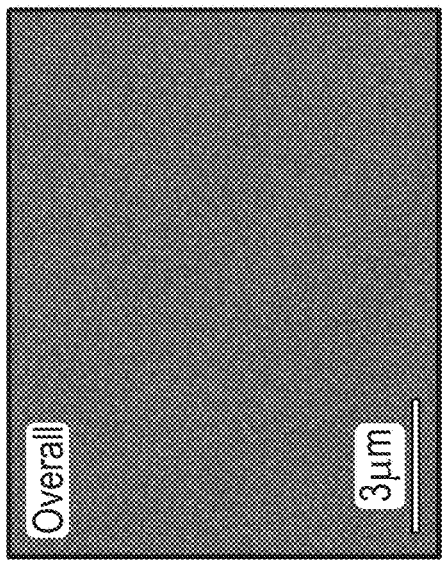
Figure 33D:
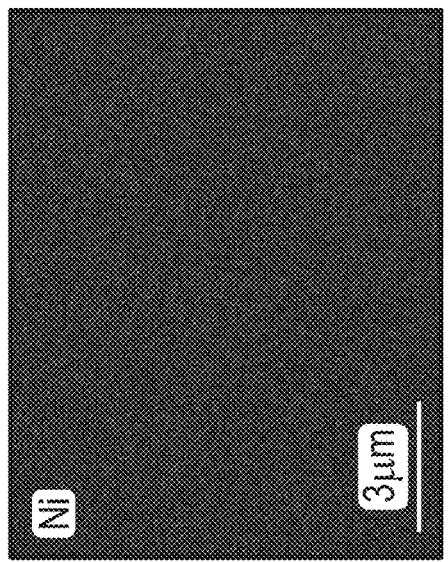

Since the potential applications of the half-Heusler materials are usually associated with a high temperature difference and repeat thermal shocks, the thermal stability of the materials was verified. As shown in FIGS. 26A-26D, the thermal stability for $ZrCoBi_{0.65}Sb_{0.15}Sn_{0.20}$ was tested. Repeat thermoelectric measurements between 300 and 973 K for this sample was conducted and the thermoelectric properties remained similar for each cycle (FIGS. 26A-26C). Afterwards, the sample was then sealed in an evacuated quartz ampoule and directly heated in the furnace with the temperature of 973 K for 10 min and then rapidly cooled to room temperature by air quenching. Such a thermal shock treatment was repeated for ten times. The thermoelectric properties were then measured again and the results still remained similar. In addition, to evaluate the effect of large temperature gradient on the stability of thermoelectric performance for ZrCoBi-based half-Heuslers, the ZrCoBi$_{0.65}$Sb$_{0.15}$Sn$_{0.20}$ leg was maintained at a cold-side temperature of ~368 K and a hot-side temperature of ~803 K (corresponding to a large temperature gradient of ~100 K mm$^{-1}$) for 6 h. The current-dependent voltage and output power were measured for each hour and the results were comparable (FIG. 26D Furthermore, a thermogravimetric analysis was conducted for ZrCoBi$_{0.65}$Sb$_{0.15}$Sn$_{0.20}$ and no decomposition of the sample was observed up to 1273 K in the Ar atmosphere as shown in FIG. 27. Therefore, all the results indicate the good thermal stability of the prepared ZrCoBi-based half-Heuslers.

Example 3

Synthesis

ZrCoBi samples as discussed herein were prepared by ball-milling and hot-pressing methods. In these methods, pure elements (Zr sponges, 99.2%; Co powder, 99.8%; Bi ingots, 99.999%; Sb ingots, 99.999%; and Sn powder, 99.8%; available from Alfa Aesar) according to the composition of ZrCoBi$_{1-x}$Sn$_x$ (where x=0, 0.05, 0.10, 0.15, 0.20, and 0.25), and ZrCoBi$_{0.80-y}$Sb$_y$Sn$_{0.20}$ (where y=0.05, 0.10, 0.15, 0.20) were loaded in a stainless-steel jar under an argon atmosphere in the glove box. The ball milling process was conducted on SPEX 8000 M Mixer/Mill for 20 h. The ball-milled powders were compacted to disk by a direct current induced hot press at about 1173 K for 5 min and under the pressure of ~50 MPa.

Example 4

Transport Properties Measurement

The Seebeck coefficient and electrical conductivity were obtained simultaneously by a commercial (ZEM-3, ULVAC) system under a helium atmosphere. The thermal conductivity $\kappa=DC_p\rho$ was calculated from the thermal diffusivity D as shown in FIGS. 28A and 28B, specific heat $C_p$ as shown in FIG. 28C, and mass density $\rho$, which were measured by laser flash (LFA457, Netzsch), a differential scanning calorimeter (DSC 404 C; Netzsch), and an Archimedes' kit, respectively. Hall carrier concentrations $n_H$ were measured on a commercial system (PPMS, Quantum Design), with a magnetic field of ±3 T and an electrical current of 8 mA.

Example 5

Microstructural Characterization

Phase identification was carried out by X-ray diffraction (XRD) on a PANalytical multipurpose diffractometer with an X'Celerator detector (PANalytical X'Pert Pro). The morphology and microstructures were characterized by a field emission scanning electron microscope (FESEM, LEO 1525) and a high-resolution transmission electron microscope (HRTEM, JEOL 2010F) as shown in FIGS. 29A-29D. SEM and EDS were performed by energy-dispersive X-ray spectroscopy (JEOL JSM-6330F) as shown in FIGS. 30-32. Thermogravimetric analysis was carried out by the simultaneous thermal analyzer (NETZSCH STA 449 F3 Jupiter).

Example 6

Sound Velocity Measurement

Sound velocity measurements were carried out by a RITEC Advanced Ultrasonic Measurement System RAM~5000. The system realizes pulse-echo method of time propagation measurements with an accuracy of about 10$^{-3}$ μs. To generate longitudinal (L) and shear (S) ultrasonic bulk waves, Olympus transducers V129-RM (10 MHz) and V157-RM (5 MHz) were used. Propylene glycol and SWC (both from Olympus) were used as couplant materials for L and S modes, respectively. Thickness measurements were carried out using Mitutoyo ID-HO530 device. All data were obtained at 300 K.

Example 7

Theoretical Calculation

The electronic structures were obtained using the linearized augmented planewave (LAPW) method as implemented in the WIEN2K code. The experimental lattice constants were fixed for TiCoSb, ZrCoSb, and ZrCoBi and the internal atomic positions were relaxed within the Perdew, Burke, and Ernzerhof (PBE) functional by total energy minimization. Then the modified Becke-Johnson (mBJ) potential was used for the band structure and isosurface calculations. We used LAPW sphere radii of 2.4 Bohr for Ti, Co and Sb, and 2.5 Bohr for Zr and Bi. A basis set cut-off parameter $R_{min}K_{max}$=9 was used. We used well converged k-point grids for the relaxation and self-consistent calculations, and denser k-meshes in the isosurface calculations. Spin-orbit coupling (SOC) is included in all the calculations except for the structural relaxations.

The lattice thermal conductivity of ZrCoBi$_{1-x}$Sn$_x$ was calculated within the virtual crystal approximation, where we averaged the harmonic and anharmonic inter-atomic force constants (IFCs) of ZrCoBi and ZrCoSn according to the doping level x. The three-phonon scattering of ZrCoBi$_{1-x}$Sn$_x$ was then calculated through the harmonic and anharmonic IFCs. The scattering of the phonons by the Bi/Sn doping effect was included with the mass-variation approximation. The Peierls-Boltzmann equation was then solved iteratively to compute the lattice thermal conductivity at different x and temperatures. All first-principles calculations were carried out in the QUANTUM ESPRESSO package with the Perdew-Burke-Ernzerhof exchange-correlation functional. We first optimized the lattice constants of ZrCoBi and ZrCoSn in the MgAgAs structure. The harmonic IFCs were then calculated within the density functional perturbation theory as implemented in QUANTUMESPRESSO on a 6×6×6 q mesh. The anharmonic IFCs were computed with the finite difference method on a 3×3×3 supercell. The MFP for a particular phonon mode $\lambda$=(q, v) is defined as $l_\lambda=|V_\lambda|T_{\lambda\alpha}$, where $T_{\lambda\alpha}$ is the phonon lifetime at reciprocal vector q and branch index v and α is the Cartesian direction.

Example 8

N-Type Material Synthesis

In this example, n-type ZrCoBi-based half-Heuslers were prepared by the ball-milling and hot-pressing method. Zr sponges (99.2%, Alfa Aesar), Co powder (99.8%, Alfa Aesar), Bi ingots (99.999%, Alfa Aesar), Sb ingots (99.999%, Alfa Aesar), and Ni powders (99.8%, Alfa Aesar) according to the composition of ZrCo$_{1-x}$Ni$_x$Bi (x=0, 0.05, 0.10, 0.15, 0.20, and 0.25) and ZrCo$_{0.9}$Ni$_{0.1}$Bi$_{1-y}$Sb$_y$ (y=0, 0.10, 0.15, 0.20, and 0.30) were loaded into a stainless-steel jar under an argon atmosphere in the glove box. The ball-milling process was conducted on a SPEX 8000M Mixer/Mill for 20 hours. It should be noted that due to the cold-welding effect large pieces can form and stick to the jar in the early stage of the ball-milling process. These pieces were carefully detached from the jar with a tool after the first 8 hours of ball milling. After 20 hours of ball milling, highly uniform and fine powders were obtained without any large pieces remaining in the jar. The 2.1 grams of obtained ball-milled powders were loaded into the carbon die and compacted into a disk by a direct-current-induced hot press at about 1173 K for 5 minutes and under pressure of ~80 MPa. The inner diameter of the carbon die is 12.7 mm, and the diameter of the carbon rods is 0.2 mm smaller.

Example 9

Thermoelectric Properties Measurement

The Seebeck coefficient and electrical conductivity were simultaneously obtained by a commercial system (ZEM-3, ULVAC) in helium atmosphere. The thermal conductivity $\kappa=DC_p\rho$ was calculated from the thermal diffusivity D (LFA 457, Netzsch), specific heat $C_p$ (DSC 404 C; Netzsch), and mass density $\rho$ (Archimedes' kit). Hall carrier concentrations ($n_H$) were measured on a commercial system (PPMS Dynacool, Quantum Design), with a magnetic field of ±3 T and an electrical current of 8 mA.

Example 10

Heat-to-Electricity Conversion Efficiency Measurement

For the single-leg n-type $ZrCo_{0.9}Ni_{0.1}Bi_{0.85}Sb_{0.15}$, the thermoelectric materials were polished for a cross section of 1.51×2.35 mm² and length of ~8.54 mm. For the unicouple of ZrCoBi-based materials, the dimensions are 1.51×2.35× 8.54 mm³ for the n-type $ZrCo_{0.9}Ni_{0.1}Bi_{0.85}Sb_{0.15}$ and 1.61× 2.42×8.54 mm³ for the p-type $ZrCoBi_{0.65}Sb_{0.15}Sn_{0.2}$. The cold-side temperature was maintained at around ~303 K by water circulation. Due to the increasing of heat flow, the cold-side temperature rose with the hot-side temperature. The difference between the measured efficiency and the predicted value increases with increasing hot-side temperature since the predicted value is calculated based on the fixed cold-side temperature (room temperature). The experiments were conducted under high vacuum (below $10^{-6}$ mbar) to reduce parasitic conduction and convection losses. To measure conversion efficiency ($\eta$), the input power from the hot side ($Q_{in}$) and the generated power (P) from the thermoelectric leg were measured at the same time. The direct measurement of $Q_{in}$ is greatly challenging due to the heavy heat loss at high temperature. According to Fourier's law, a bulk polycrystalline graphite with measured geometry and thermal conductivity was placed below the cold-side end to measure the heat flow out of the cold-side end ($Q_{out}$). The thermal conductivity of the bulk polycrystalline graphite was confirmed by the method described above in the discussion on thermoelectric properties measurements. In order to measure temperature differences of the leg and graphite bulk, K-type thermocouples were embedded at the interfaces. It should be noted that the hot-side temperature of graphite can be regarded as the cold-side temperature of the leg if the setup is working under a large pressure. The total $Q_{in}$ equals the sum of $Q_{out}$, P, and radiation loss from the leg ($Q_{rad}$). Therefore, the conversion efficiency ($\eta$) can be written as the following $$\eta = \frac{P}{Q_{in}} = \frac{P}{Q_{out}+P+Q_{rad}}.$$

Since $Q_{rad}$ cannot be directly measured, in real measurement $Q_{in}$ is composed of $Q_{out}$ and P, which leads to the measurement error of $\eta$. By tuning the current in the circuit, a series of $Q_{in}$, P can be measured at the same time. Therefore, both maximum $\eta$ and P can be found. The main sources of error in this system were the radiation heat, the rise of the cold-side temperature, the Seebeck coefficient of copper wire, and the parasitic electrical and heat loss. In the measurement of p-type leg efficiency, to offset the radiation loss, copper foil working as a radiation shield is brazed with copper plate at the hot side. Since this radiation shield is at higher temperature than the leg, it was add additional heat flow into the leg, so that measured $Q_{out}$ was actually higher than without the shield. This should lead to a more conservative value of efficiency for the p-type leg, especially at high temperature.

Example 11

Microstructural Characterization

Figure 34A:
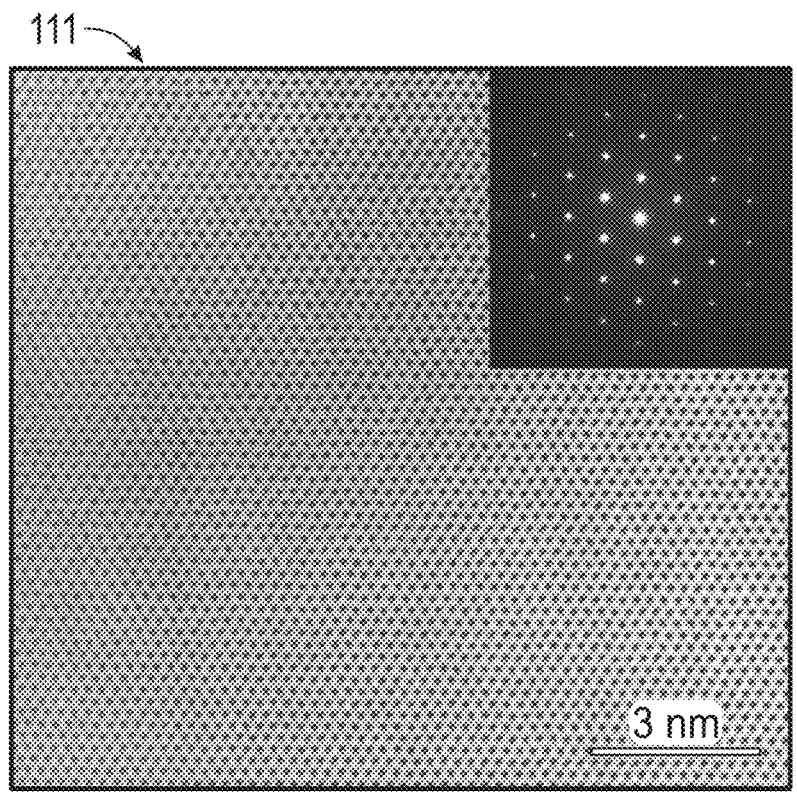
FIGS. 34A and 34B illustrate transmission electron microscopy images of $ZrCo_{0.9}Ni_{0.1}$ $Bi_{0.85}Sb_{0.15}$.
Figure 34B:
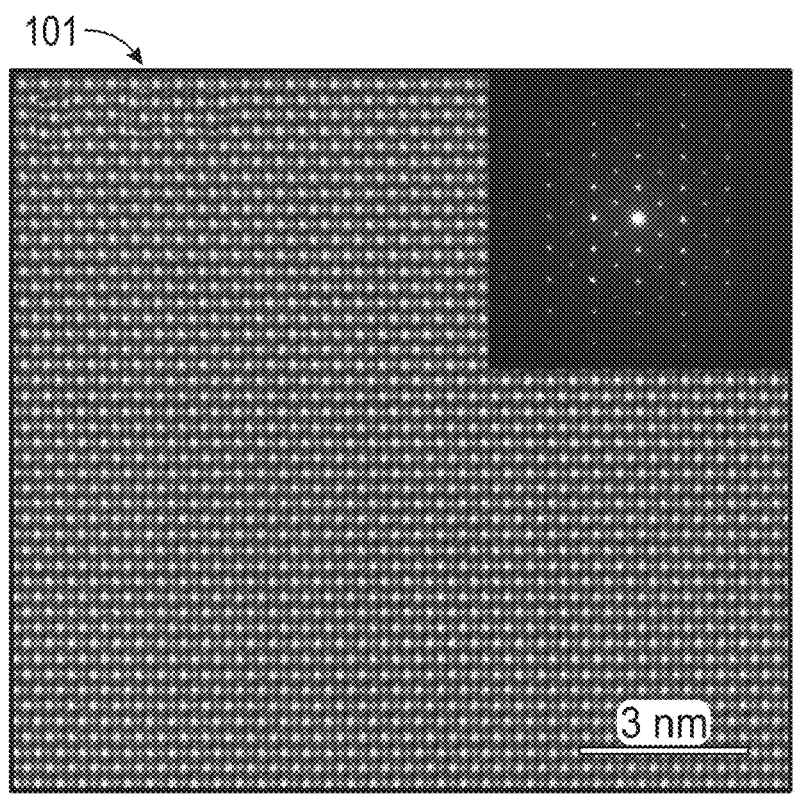

Phase compositions were characterized by X-ray diffraction on a PANalytical multipurpose diffractometer with an X'Celerator detector (PANalytical X'Pert Pro). The morphology and microstructures were characterized by a field emission scanning electron microscope (FESEM, LEO 1525). Elemental mapping was conducted by energy-dispersive X-ray spectroscopy (JEOL JSM-6330F) as shown in Supplementary Information, FIGS. 33A-33F. Selected area electron diffraction patterns and high-angle annular dark-field scanning transmission electron microscopy (HAADF-STEM) images were obtained by a JEM-ARM 200 F TEM operated at 200 kV (Supplementary e.g., as shown in FIGS. 34A and 34B). The microscope was equipped with a Cold FEG source and double-sextupole Cs correctors for STEM and for TEM (for probe and for imaging), respectively.

Example 12

Theoretical Calculations

Electronic structure and transport calculations were performed for the half-Heusler structure ZrCoBi based on density functional theory (DFT). For this purpose, the general potential linearized augmented planewave (LAPW) method was used as implemented in the WIEN2k code. Spin-orbit was included self-consistently for all states. The main results were obtained using the modified Becke Johnson (mBJ) potential, and a lattice parameter of 6.186 Å. These calculations were done similarly to previously reported electronic structure calculations for half-Heusler compounds. LAPW sphere radii of R=2.3 bohr was used for all atoms. Well converged basis sets were used consisting of an LAPW sector determined by a cutoff, $RK_{max}$=9.0, plus additional local orbitals, where $K_{max}$ is the planewave sector cutoff. Transport integrals were performed with the BoltzTraP code, and analyzed using the transM code to obtain inertial effective masses and an electronic fitness function for thermoelectric performance. The Brillouin zone sampling for the transport calculation was performed using more than 40,000 points in the zone. Convergence of the Brillouin zone sampling was tested, as were the basis sets and other parameters. Tests were also performed including the standard Perdew-Burke-Ernzerhof (PBE) generalized gradient approximation functional, as well as with the Vienna ab initio simulation package (VASP) using the Heyd-Scuseria-Ernzerhof (HSE) screened hybrid functional. The main difference between the HSE and mBJ potential is in the band gap, which is enhanced from 1.0 eV with the mBJ potential to 1.2 eV in the HSE calculation.

Example 13

Theoretical Prediction of ZT Value

The ZT value can be regarded as a function of reduced Fermi energy $\eta=\zeta/kBT$ ($\zeta$ is Fermi energy) and the material quality factor B. When acoustic phonons dominate the scattering, ZT can be predicted with the single parabolic band (SPB) model as:

$$ZT = \frac{(\delta - \eta)^2}{L_0 + \frac{1}{BF_0(\eta)}} \tag{6}$$

Where $$\delta = \frac{2F_1(\eta)}{F_0(\eta)} \tag{7}$$

and $$L_0 = \frac{3F_2(\eta)}{F_0(\eta)} - \delta^2 \tag{8}$$

and $$F_l(\eta) = \int_0^\infty \frac{x^l}{1 + \exp(x - \eta)} dx \tag{9}$$

Figure 35A:
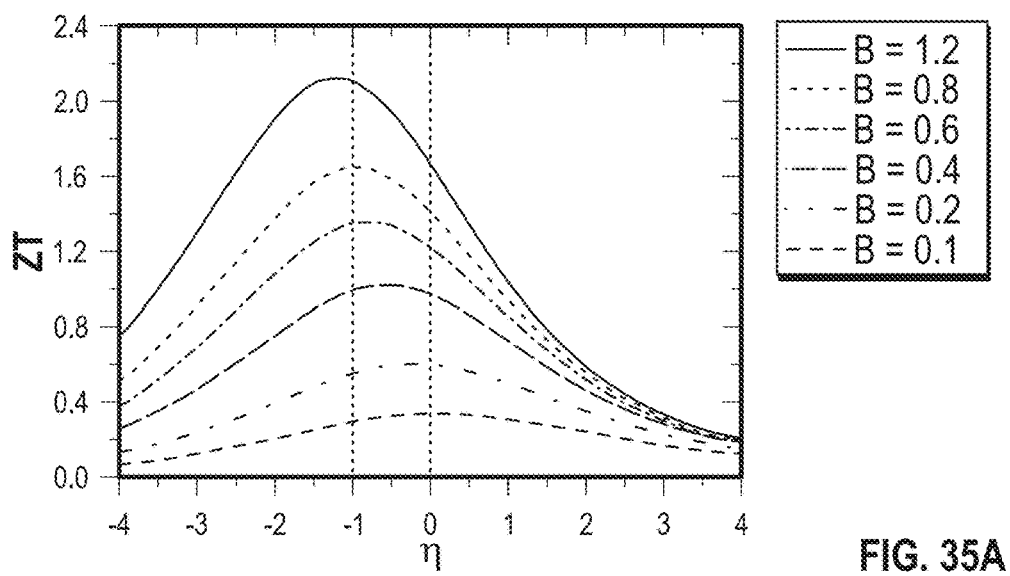
FIGS. 35A-35C illustrate the theoretical prediction of ZT value, where. (A) ZT plotted against reduced Fermi energy $\eta$ for different material quality factor B as shown in FIG. 35A, ZT plotted against B in log-log graph form as shown in FIG. 35B, and fitting the linear model to the ZT value for $\eta=0.6$ as shown in FIG. 35C.
Figure 35B:
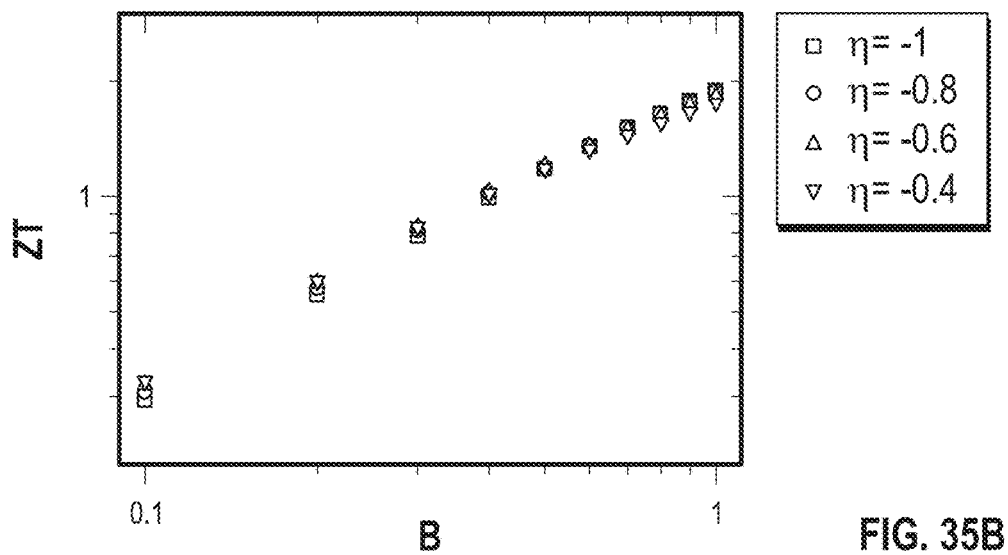

For the material with a given B value, ZT is a function of $\eta$, as shown in FIG. 35A. Carrier concentration optimization is used to adjust $\eta$ in order to realize the peak ZT. For most of the thermoelectric materials, the B value is lower than 0.8. According to the position of peak ZT for B=0.1~0.8, the $\eta$ value should be optimized at −1~0. It should be noted that the window of 1 $k_BT$ in Fermi energy (+/−0.5 kBT) corresponds to the variation of carrier concentration by a factor of ~2.5 in experiment. We fix the $\eta$ value at around 0.6 to investigate the B value dependence of peak ZT. ZT is plotted against B for different $\eta$ values (0.4, 0.6, 0.8, and 1) in FIG. 35B. Clearly, the ZT value is not very sensitive to $\eta$ because the carrier concentration is around the optimized value. Interestingly, ZT as a function of B, when shown in log-log graph form, is very nearly a linear relationship. The slope (first derivative) of the curve is:

$$A_0 = 1/(L_0 F_0(\eta)B + 1) \tag{10}$$

Figure 35C:
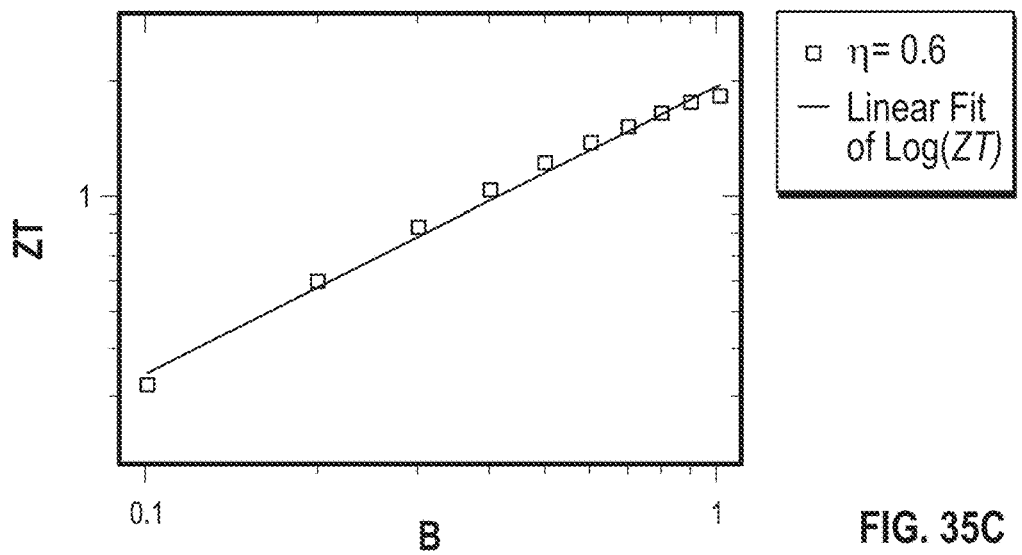

Thus, peak ZT may be roughly estimated in this way. As shown in FIG. 35C, it works well for fitting a linear model to the data, and a slope of ~0.75 is obtained for $\eta$=−0.6. Therefore, if ZT of n- and p-type doped materials can be estimated by:

$$\log(ZT_n) \approx A_1 \log(B_n) + A_2 \tag{11}$$

$$\log(ZT_p) \approx A_1 \log(B_p) + A_2 \tag{12}$$

we can have:

$$\log(ZT_n/ZT_p) \approx A_1 \log(B_n/B_p) \tag{13}$$

Considering $$\frac{B_n}{B_p} = \frac{5.745 \times 10^{-6} \frac{\mu_n (m^*_{d,n})^{3/2}}{\kappa_{L,n}} T_n^{5/2}}{5.745 \times 10^{-6} \frac{\mu_p (m^*_{d,p})^{3/2}}{\kappa_{L,p}} T_p^{5/2}} \approx \frac{\mu_n (m^*_{d,n})^{3/2}}{\mu_p (m^*_{d,p})^{3/2}} = A \tag{14}$$

Equation (13) now becomes:

$$\log(ZT_n/ZT_p) \approx A_1 \log(A) \tag{15}$$

A slope of ~0.75 is obtained by fitting the curve for $\eta$=−0.6 in FIG. 35C. Therefore, when $\eta$=−0.6, Equation (10) becomes:

$$\log(ZT_n/ZT_p) \approx 0.75 \log(A) \tag{16}$$

Equation (16) is similar to the results of this work by fitting the experimental data:

$$\log(ZT_n/ZT_p) = 0.69 \log(A) - 0.039 \tag{17}$$

The SPB is a very basic model. The careful comparison of the model's assumptions against the specific material system is highly needed before making the prediction.

Having described various methods, systems, and product, certain embodiments can include, but are not limited to:

In a first embodiment, a method of thermoelectric power generation comprises: converting heat to electricity via the use of a ZrCoBi-based thermoelectric material, wherein a thermoelectric conversion efficiency of the ZrCoBi-based thermoelectric material is greater than or equal to 7% at a temperature difference of up to 800 K.

A second embodiment can include the method of the first embodiment, wherein the ZrCoBi-based thermoelectric material comprises a p-type half-Heusler material having a formula: $ZrCoBi_{1-x-y}Sn_xSb_y$, where x ranges from 0.01 to 0.25, and y ranges from 0 and 0.2.

A third embodiment can include the method of the first or second embodiment, wherein the thermoelectric conversion efficiency is greater than or equal to 9% at a temperature difference of 500 K.

A fourth embodiment can include the method of any one of the first to third embodiments, wherein x is 0.2 and y is 0.15, wherein an average dimensionless figure-of-merit (ZT) of the ZrCoBi-based thermoelectric material is greater than or equal to 0.8 as calculated by an integration method for temperatures between 300 and 973 K.

A fifth embodiment can include the method of any one of the first to fourth embodiments, wherein an average dimensionless figure-of-merit (ZT) of the ZrCoBi-based thermoelectric material is greater than or equal to 0.8 as calculated by an integration method for temperatures between 300 and 973 K.

A sixth embodiment can include the method of any one of the first to fifth embodiments, wherein a peak dimensionless figure-of-merit (ZT) of the ZrCoBi-based thermoelectric material is greater than or equal to 1.4 at 973 K.

A seventh embodiment can include the method of any one of the first to sixth embodiments, wherein the ZrCoBi-based thermoelectric material has a band structure with a high band degeneracy ($N_v$) of at least 10.

An eighth embodiment can include the method of any one of the first to seventh embodiments, wherein the ZrCoBi-based thermoelectric material has a room temperature power factor of at least 20 μW cm$^{-1}$ K$^{-2}$, and wherein the ZrCoBi-based thermoelectric material has a peak power factor of at least 40 μW cm$^{-1}$ K$^{-2}$.

An eighth embodiment can include the method of any one of the first to eighth embodiments, wherein x ranges from 0.15 to 0.2 and y is 0.

A tenth embodiment can include the method of any one of the first to ninth embodiments, wherein the ZrCoBi-based thermoelectric material has a room temperature lattice thermal conductivity of less than 3 W m$^{-1}$ K$^{-1}$.

An eleventh embodiment can include the method of any one of the first to tenth embodiments, wherein the ZrCoBi-based thermoelectric material has a mean sound velocity ($V_m$) of less than 2800 m s$^{-1}$.

A twelfth embodiment can include the method of any one of the first to eleventh embodiments, wherein the ZrCoBi-based thermoelectric material comprises an n-type half-Heusler material having a formula: $ZrCo_{1-x}Ni_xBi_{1-y}Sb_y$, where x ranges from 0.01 to 0.25, and y ranges from 0 to less than or equal to 0.3.

A thirteenth embodiment can include the method of the twelfth embodiment, wherein x is 0.1 and y is 0.15.

A fourteenth embodiment can include the method of any one of the twelfth of thirteenth embodiments, wherein the ZrCoBi-based thermoelectric material has an average dimensionless figure-of-merit (ZT) of greater than or equal to 0.65 as calculated by an integration method for temperatures between 300 and 973 K.

A fifteenth embodiment can include the method of any one of the twelfth to fourteenth embodiments, where a peak dimensionless figure-of-merit (ZT) of the ZrCoBi-based thermoelectric material is greater than or equal to 1.0 at 973 K.

A sixteenth embodiment can include the method of any one of the twelfth to fifteenth embodiments, wherein the thermoelectric conversion efficiency of the ZrCoBi-based thermoelectric material is greater than or equal to about 9% at a temperature difference of 650 K.

In a seventeenth embodiment, a method of thermoelectric power generation comprises: converting heat to electricity via the use of a first ZrCoBi-based thermoelectric material comprising a p-type half-Heusler thermoelectric material and a second ZrCoBi-based thermoelectric material comprising an n-type half-Heusler thermoelectric material, wherein the heat is converted to electricity at a thermoelectric conversion efficiency of 10% or greater at a temperature difference of 650 K.

An eighteenth embodiment can include the method of the seventeenth embodiment, wherein the first ZrCoBi-based thermoelectric material and the second ZrCoBi-based thermoelectric material are configured in a thermoelectric module comprising: at least one first leg, wherein the at least one first leg comprises the first ZrCoBi-based thermoelectric material; and at least one second leg, wherein the at least one second leg comprises the second ZrCoBi-based thermoelectric material, wherein the at least one first leg and the at least one second leg are connected thermally in parallel and electrically in series.

A nineteenth embodiment can include the method of the eighteenth embodiment, wherein the first ZrCoBi-based thermoelectric material has a formula: $ZrCoBi_{1-x-y}Sn_xSb_y$, where x ranges from 0.01 to 0.25, and y ranges from 0 to 0.2; and wherein the second ZrCoBi-based thermoelectric material has a formula: $ZrCo_{1-a}Ni_aBi_{1-b}Sb_b$, where a ranges from 0.01 to 0.25, and b ranges from 0 to 0.3.

A twentieth embodiment can include the method of any one of the eighteenth or the nineteenth embodiments, wherein the module has the thermoelectric conversion efficiency of 10% or greater at a temperature difference of 650 K between the first leg and the second leg.

A twenty first embodiment can include the method of any one of the seventeenth to twentieth embodiments, wherein a peak dimensionless figure-of-merit (ZT) of the first ZrCoBi-based thermoelectric material is greater than or equal to 1.4 at 973 K.

A twenty second embodiment can include the method of any one of the seventeenth to twenty first embodiments, where a peak dimensionless figure-of-merit (ZT) of the second ZrCoBi-based thermoelectric material is greater than or equal to 1.0 at 973 K.

A twenty third embodiment can include the method of any one of the seventeenth to twenty second embodiments, wherein a thermoelectric conversion efficiency of the first ZrCoBi-based thermoelectric material is greater than or equal to 9% at a temperature difference of 500 K, and wherein a thermoelectric conversion efficiency of the second ZrCoBi-based thermoelectric material is greater than or equal to about 7% at a temperature difference of 650 K.

In a twenty fourth embodiment, a method of thermoelectric power generation comprises: converting heat to electricity via the use of: a first ZrCoBi-based thermoelectric material comprising a p-type half-Heusler thermoelectric material; a second ZrCoBi-based thermoelectric material comprising an n-type half-Heusler thermoelectric material; or both the first ZrCoBi-based thermoelectric material and the second ZrCoBi-based thermoelectric material, wherein the heat is converted to electricity at a thermoelectric conversion efficiency of at least 7%.

A twenty fifth embodiment can include the method of the twenty fourth embodiment, wherein the first ZrCoBi-based thermoelectric material and the second ZrCoBi-based thermoelectric material are configured in a thermoelectric module comprising: at least one first leg, wherein the at least one first leg comprises the first ZrCoBi-based thermoelectric material; and at least one second leg, wherein the at least one second leg comprises the second ZrCoBi-based thermoelectric material wherein the at least one first leg and the at least one second leg are connected thermally in parallel and electrically in series.

A twenty sixth embodiment can include the method of the twenty fifth embodiment, wherein the first ZrCoBi-based thermoelectric material has a formula: $ZrCoBi_{1-x-y}Sn_xSb_y$, where x ranges from 0.01 to 0.25, and y ranges from 0 to 0.2; and wherein the second ZrCoBi-based thermoelectric material has a formula: $ZrCo_{1-a}Ni_aBi_{1-b}Sb_b$, where a ranges from 0.01 to 0.25, and b ranges from 0 to 0.3.

A twenty seventh embodiment can include the method of any one of the twenty fifth or twenty sixth embodiments, wherein the thermoelectric conversion efficiency provided via the thermoelectric module is 10% or greater at a temperature difference of 650 K between the first leg and the second leg.

In a twenty eighth embodiment, a ZrCoBi-based p-type half-Heusler material comprises: $ZrCoBi_{0.65}Sb_{0.15}Sn_{0.20}$ having an average dimensionless figure-of-merit (ZT) of greater than or equal to about 0.80 as calculated by the integration method described herein for temperatures between 300 and 973 K.

In a twenty ninth embodiment, a ZrCoBi-based p-type half-Heusler material having the composition: of $ZrCoBi_{1-x}Sn_x$ (x=0, 0.05, 0.10, 0.15, 0.20 and 0.25) or $ZrCoBi_{0.80-y}Sb_ySn_{0.20}$ (y=0.05, 0.10, 0.15, 0.20).

A thirtieth embodiment can include the ZrCoBi-based p-type half-Heusler material of the twenty ninth embodiment, having an average dimensionless figure-of-merit (ZT)

of greater than or equal to about 0.80 as calculated by the integration method described herein for temperatures between 300 and 973 K.

A thirty first embodiment can include the ZrCoBi-based p-type half-Heusler material of the twenty eighth or twenty ninth embodiment, having a peak dimensionless figure-of-merit (ZT) of greater than or equal to about 1.4 at 973 K.

A thirty second embodiment can include the ZrCoBi-based p-type half-Heusler material of the twenty eighth or twenty ninth embodiment, having a high thermoelectric conversion efficiency of greater than or equal to about 9% at a temperature difference of about 500 K, as described herein.

A thirty third embodiment can include the ZrCoBi-based p-type half-Heusler material of the twenty eighth or twenty ninth embodiment, having a high thermal stability (e.g., showing substantially no decomposition of a sample thereof when subjected to a thermogravimetric analysis as described herein).

A thirty fourth embodiment can include the ZrCoBi-based p-type half-Heusler material of the twenty eighth or twenty ninth embodiment, having a band structure that offers a high band degeneracy ($N_v$) of at least about 10.

A thirty fifth embodiment can include the ZrCoBi-based p-type half-Heusler material of the twenty eighth or twenty ninth embodiment, having a room temperature power factor of at least about 20 or 25 µW cm$^{-1}$ K$^{-2}$, a peak power factor of at least about 40 µW cm$^{-1}$ K$^{-2}$, or both.

A thirty sixth embodiment can include the ZrCoBi-based p-type half-Heusler material of the thirty fifth embodiment, having the composition ZrCoBi$_{1-x}$Sn$_x$ (x=0, 0.05, 0.10, 0.15, 0.20 and 0.25) or ZrCoBi$_{0.80-y}$Sb$_y$Sn$_{0.20}$ (y=0.05, 0.10, 0.15, 0.20).

A thirty seventh embodiment can include the ZrCoBi-based p-type half-Heusler material of the twenty eighth or twenty ninth embodiment, having a low lattice thermal conductivity as described herein.

A thirty eighth embodiment can include the ZrCoBi-based p-type half-Heusler material of the twenty eighth or twenty ninth embodiment, having a low mean sound velocity ($V_m$) of about 2800 m s$^{-1}$ or 2850 m s$^{-1}$, as described herein.

In a thirty ninth embodiment, a method comprises: ball-milling at least Zr granules or sponges, 99.2%; Co powder, 99.8%; Bi ingots, 99.999%; Sb ingots, 99.999%; and Sn powder, 99.8% according to the composition of ZrCoBi$_{1-x}$Sn$_x$ (x=0, 0.05, 0.10, 0.15, 0.20 and 0.25), and ZrCoBi$_{0.80-y}$Sb$_y$Sn$_{0.20}$ (y=0.05, 0.10, 0.15, 0.20) to form a ball-milled nano-powder; and hot pressing the ball-milled nano-powder to produce a bulk ZrCoBi-based p-type half-Heusler material.

A fortieth embodiment can include the method of the thirty ninth embodiment, wherein the hot pressing is performed at about 1173 K.

A forty first embodiment can include the method of the fortieth embodiment, wherein the hot pressing of the ball-milled nano-powder is performed for about 5 minutes and/or under a pressure of about 50 MPa.

A forty second embodiment can include the method of the thirty ninth embodiment, wherein the ball milling is conducted for approximately 20 hours.

A forty third embodiment can include the method of the thirty ninth embodiment, wherein the hot pressed ZrCoBi-based p-type half-Heusler material has an average dimensionless figure-of-merit (ZT) of greater than or equal to about 0.80 as calculated by the integration method described herein for temperatures between 300 and 973 K and a peak ZT of at least about 1.4.

A forty fourth embodiment can include the method of the thirty ninth embodiment, wherein the hot pressed bulk ZrCoBi-based p-type half-Heusler material is highly dense, with an average grain size of about 200 nm.

A forty fifth embodiment can include the method of the thirty ninth embodiment, wherein the bulk ZrCoBi-based p-type half-Heusler material has a fine grain size, a uniform elemental distribution, or both.

A forty sixth embodiment can include the method of the thirty ninth embodiment, wherein the bulk ZrCoBi-based p-type half-Heusler material has a composition of ZrCoBi$_{1-x}$Sn$_x$ (x=0, 0.05, 0.10, 0.15, 0.20 and 0.25) or ZrCoBi$_{0.80-y}$Sb$_y$Sn$_{0.20}$ (y=0.05, 0.10, 0.15, 0.20).

A forty seventh embodiment can include the method of the forty sixth embodiment, wherein the bulk ZrCoBi-based p-type half-Heusler material has a composition of ZrCoBi$_{0.65}$Sb$_{0.15}$Sn$_{0.20}$.

While various exemplary embodiments have been shown and described, modifications thereof can be made by one skilled in the art without departing from the spirit and teachings of the disclosure. The embodiments described herein are exemplary only, and are not intended to be limiting. Many variations and modifications of the subject matter disclosed herein are possible and are within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, RL and an upper limit, RU is disclosed, any number falling within the range is specifically disclosed. In particular, the following numbers within the range are specifically disclosed: R=RL+k*(RU−RL), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference is not an admission that it is prior art to the present disclosure, especially any reference that may have a publication date after the priority date of this application. The disclosures of all patents, patent applications, and publications cited herein are hereby incorporated by reference, to the extent that they provide exemplary, procedural, or other details supplementary to those set forth herein.

The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Alternative embodiments that result from combining, integrating, and/or omitting features of the embodiment(s) are also within the scope of the disclosure. While compositions and methods are described in broader terms of "having", "comprising," "containing," or "including" various components or steps, the compositions and methods can also "consist essentially of" or "consist of" the various components and steps. Use of the term "optionally" with respect to any element of a claim means that the element is required, or alternatively, the element is not required, both alternatives being within the scope of the claim.

Numbers and ranges disclosed above may vary by some amount. Whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent or other documents, the definitions that are consistent with this specification should be adopted.

While preferred embodiments of the invention have been shown and described, modifications thereof can be made by one skilled in the art without departing from the teachings of this disclosure. The embodiments described herein are exemplary only, and are not intended to be limiting. Many variations and modifications of the invention disclosed herein are possible and are within the scope of the invention.

Numerous other modifications, equivalents, and alternatives, will become apparent to those skilled in the art once the above disclosure is fully appreciated. It is intended that the following claims be interpreted to embrace all such modifications, equivalents, and alternatives where applicable. Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the detailed description of the present invention. The disclosures of all patents, patent applications, and publications cited herein are hereby incorporated by reference. Unless expressly stated otherwise, the steps in a method claim may be performed in any order and with any suitable combination of materials and processing conditions.

What is claimed is:

1. A method of thermoelectric power generation, the method comprising:
    converting heat to electricity via the use of a ZrCoBi-based thermoelectric material, wherein a thermoelectric conversion efficiency of the ZrCoBi-based thermoelectric material is greater than or equal to 7% at a temperature difference of up to 800 K, wherein the ZrCoBi-based thermoelectric material comprises a p-type half-Heusler material having a formula:

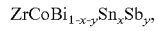

$ZrCoBi_{1-x-y}Sn_xSb_y$, where x ranges from 0.01 to 0.25, and y ranges from 0 to 0.2.

2. The method of claim 1, wherein the thermoelectric conversion efficiency of the ZrCoBi-based thermoelectric material is greater than or equal to 9% at a temperature difference of 500K.

3. The method of claim 1, wherein x is 0.2 and y is 0.15, wherein an average dimensionless figure-of-merit (ZT) of the ZrCoBi-based thermoelectric material is greater than or equal to 0.8 as calculated by an integration method for temperatures between 300 and 973 K.

4. The method of claim 1, wherein an average dimensionless figure-of-merit (ZT) of the ZrCoBi-based thermoelectric material is greater than or equal to 0.8 as calculated by an integration method for temperatures between 300 and 973 K.

5. The method of claim 1, wherein a peak dimensionless figure-of-merit (ZT) of the ZrCoBi-based thermoelectric material is greater than or equal to 1.4 at 973 K.

6. The method of claim 1, wherein x ranges from 0.15 to 0.2 and y is 0.

7. A method of thermoelectric power generation, the method comprising:
    converting heat to electricity via the use of a ZrCoBi-based thermoelectric material, wherein a thermoelectric conversion efficiency of the ZrCoBi-based thermoelectric material is greater than or equal to 7% at a temperature difference of up to 800 K, and
    wherein the ZrCoBi-based thermoelectric material comprises an n-type half-Heusler material having a formula:

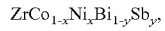

$ZrCo_{1-x}Ni_xBi_{1-y}Sb_y$, where x is 0.1 and y is 0.15.

8. The method of claim 7, wherein the ZrCoBi-based thermoelectric material has an average dimensionless figure-of-merit (ZT) of greater than or equal to 0.65 as calculated by an integration method for temperatures between 300 and 973 K.

9. The method of claim 7, where a peak dimensionless figure-of-merit (ZT) of the ZrCoBi-based thermoelectric material is greater than or equal to 1.0 at 973 K.

10. The method of claim 7, wherein the thermoelectric conversion efficiency of the ZrCoBi-based thermoelectric material is greater than or equal to about 9% at a temperature difference of 650 K.

11. A method of thermoelectric power generation, the method comprising:
    converting heat to electricity via the use of a first ZrCoBi-based thermoelectric material comprising a p-type half-Heusler thermoelectric material and a second ZrCoBi-based thermoelectric material comprising an n-type half-Heusler thermoelectric material,
    wherein the heat is converted to electricity at a thermoelectric conversion efficiency of 10% or greater at a temperature difference of 650 K,
wherein the first ZrCoBi-based thermoelectric material and the second ZrCoBi-based thermoelectric material are configured in a thermoelectric module comprising:
    at least one first leg, wherein the at least one first leg comprises the first ZrCoBi-based thermoelectric material; and at least one second leg, wherein the at least one second leg comprises the second ZrCoBi-based thermoelectric material, wherein the at least one first leg and the at least one second leg are connected thermally in parallel and electrically in series, wherein the first ZrCoBi-based thermoelectric material has a formula:

$$ZrCoBi_{1-x-y}Sn_xSb_y,$$

where x ranges from 0.01 to 0.25, and y ranges from 0 to 0.2; and wherein the second ZrCoBi-based thermoelectric material has a formula:

$$ZrCo_{1-a}Ni_aBi_{1-b}Sb_b,$$

where a ranges from 0.01 to 0.25, and b ranges from 0 to 0.3.

12. The method of claim 11, wherein the module has the thermoelectric conversion efficiency of 10% or greater at a temperature difference of 650 K between the at least one first leg and the at least one second leg.

13. The method of claim 11, wherein a peak dimensionless figure-of-merit (ZT) of the first ZrCoBi-based thermoelectric material is greater than or equal to 1.4 at 973 K.

14. The method of claim 11, where a peak dimensionless figure-of-merit (ZT) of the second ZrCoBi-based thermoelectric material is greater than or equal to 1.0 at 973 K.

15. The method of claim 11, wherein a thermoelectric conversion efficiency of the first ZrCoBi-based thermoelectric material is greater than or equal to 9% at a temperature difference of 500 K, and wherein a thermoelectric conversion efficiency of the second ZrCoBi-based thermoelectric material is greater than or equal to about 7% at a temperature difference of 650 K.

16. A method of thermoelectric power generation, the method comprising:

converting heat to electricity via the use of:
a first ZrCoBi-based thermoelectric material comprising a p-type half-Heusler thermoelectric material;
a second ZrCoBi-based thermoelectric material comprising an n-type half-Heusler thermoelectric material;
or both the first ZrCoBi-based thermoelectric material and the second ZrCoBi-based thermoelectric material, wherein the heat is converted to electricity at a thermoelectric conversion efficiency of at least 7%, wherein the first ZrCoBi-based thermoelectric material and the second ZrCoBi-based thermoelectric material are configured in a thermoelectric module comprising:
at least one first lea, wherein the at least one first leg comprises the first ZrCoBi-based thermoelectric material; and
at least one second leg, wherein the at least one second leg comprises the second ZrCoBi-based thermoelectric material wherein the at least one first leg and the at least one second leg are connected thermally in parallel and electrically in series, wherein the first ZrCoBi-based thermoelectric material has a formula:

$$ZrCoBi_{1-x-y}Sn_xSb_y,$$

where x ranges from 0.01 to 0.25, and y ranges from 0 to 0.2; and wherein the second ZrCoBi-based thermoelectric material has a formula:

$$ZrCo_{1-a}Ni_aBi_{1-b}Sb_b,$$

where a ranges from 0.01 to 0.25, and b ranges from 0 to 0.3.

17. The method of claim 16, wherein the thermoelectric conversion efficiency provided via the thermoelectric module is 10% or greater at a temperature difference of 650 K between the at least one first leg and the at least one second leg.

* * * * *